(12) United States Patent
Di Cioccio

(10) Patent No.: US 7,960,248 B2
(45) Date of Patent: Jun. 14, 2011

(54) METHOD FOR TRANSFER OF A THIN LAYER

(75) Inventor: Léa Di Cioccio, Saint Ismier (FR)

(73) Assignee: Commissariat a l'Energie Atomique, Paris (FR)

( * ) Notice: Subject to any disclaimer, the term of this patent is extended or adjusted under 35 U.S.C. 154(b) by 225 days.

(21) Appl. No.: 12/336,229

(22) Filed: Dec. 16, 2008

(65) Prior Publication Data

US 2009/0156016 A1   Jun. 18, 2009

(30) Foreign Application Priority Data

Dec. 17, 2007 (FR) ...................................... 07 59893

(51) Int. Cl.
*H01L 21/30* (2006.01)

(52) U.S. Cl. ................................ 438/459; 257/E21.122

(58) Field of Classification Search .......... 438/455–459; 257/E21.122
See application file for complete search history.

(56) References Cited

U.S. PATENT DOCUMENTS

| | | | |
|---|---|---|---|
| 3,901,423 A | 8/1975 | Hillberry et al. |
| 3,915,757 A | 10/1975 | Engel |
| 3,957,107 A | 5/1976 | Altoz et al. |
| 3,993,909 A | 11/1976 | Drews et al. |
| 4,006,340 A | 2/1977 | Gorinas |
| 4,028,149 A | 6/1977 | Deines et al. |
| 4,039,416 A | 8/1977 | White |
| 4,074,139 A | 2/1978 | Pankove |
| 4,107,350 A | 8/1978 | Berg et al. |
| 4,108,751 A | 8/1978 | King |
| 4,121,334 A | 10/1978 | Wallis |
| 4,170,662 A | 10/1979 | Weiss et al. |
| 4,179,324 A | 12/1979 | Kirkpatrick |
| 4,244,348 A | 1/1981 | Wilkes |
| 4,252,837 A | 2/1981 | Auton |
| 4,254,590 A | 3/1981 | Eisele et al. |
| 4,274,004 A | 6/1981 | Kanai |
| 4,324,631 A | 4/1982 | White et al. |
| 4,346,123 A | 8/1982 | Kaufmann |
| 4,361,600 A | 11/1982 | Brown |
| 4,368,083 A | 1/1983 | Bruel et al. |
| 4,412,868 A | 11/1983 | Brown et al. |
| 4,452,644 A | 6/1984 | Bruel et al. |
| 4,468,309 A | 8/1984 | White |

(Continued)

FOREIGN PATENT DOCUMENTS

EP    0 355 913    2/1990

(Continued)

OTHER PUBLICATIONS

"Why Can Smart Cut® Change The Future Of Microelectronics?" by A. J. Auberton-Hervé; published in International Journal of High Speed Electronics and Systems, vol. 10, No. 1 (2000) pp. 131-146.

(Continued)

*Primary Examiner* — Richard A. Booth

(74) *Attorney, Agent, or Firm* — Brinks Hofer Gilson & Lione

(57) ABSTRACT

A method for transferring a thin layer from an initial substrate includes forming an assembly of the initial substrate with one face of a silicone type polymer layer, this face having been treated under an ultraviolet radiation, and processing the initial substrate to form the thin layer on the silicone type polymer layer.

19 Claims, 3 Drawing Sheets

U.S. PATENT DOCUMENTS

| | | |
|---|---|---|
| 4,471,003 A | 9/1984 | Cann |
| 4,486,247 A | 12/1984 | Ecer et al. |
| 4,490,190 A | 12/1984 | Speri |
| 4,500,563 A | 2/1985 | Ellenberger et al. |
| 4,508,056 A | 4/1985 | Bruel et al. |
| 4,536,657 A | 8/1985 | Bruel |
| 4,539,050 A | 9/1985 | Kramler et al. |
| 4,542,863 A | 9/1985 | Larson |
| 4,566,403 A | 1/1986 | Fournier |
| 4,567,505 A | 1/1986 | Pease |
| 4,568,563 A | 2/1986 | Jackson et al. |
| 4,585,945 A | 4/1986 | Bruel et al. |
| 4,630,093 A | 12/1986 | Yamaguchi et al. |
| 4,684,535 A | 8/1987 | Heinecke et al. |
| 4,704,302 A | 11/1987 | Bruel et al. |
| 4,717,683 A | 1/1988 | Parrillo et al. |
| 4,764,394 A | 8/1988 | Conrad |
| 4,837,172 A | 6/1989 | Mizuno et al. |
| 4,846,928 A | 7/1989 | Dolins et al. |
| 4,847,792 A | 7/1989 | Barna et al. |
| 4,853,250 A | 8/1989 | Boulos et al. |
| 4,887,005 A | 12/1989 | Rough et al. |
| 4,894,709 A | 1/1990 | Phillips et al. |
| 4,904,610 A | 2/1990 | Shyr |
| 4,920,396 A | 4/1990 | Shinohara et al. |
| 4,929,566 A | 5/1990 | Beitman |
| 4,931,405 A | 6/1990 | Kamijo et al. |
| 4,948,458 A | 8/1990 | Ogle |
| 4,952,273 A | 8/1990 | Popov |
| 4,956,698 A | 9/1990 | Wang |
| 4,960,073 A | 10/1990 | Suzuki et al. |
| 4,975,126 A | 12/1990 | Margail et al. |
| 4,982,090 A | 1/1991 | Wittmaack |
| 4,996,077 A | 2/1991 | Moslehi et al. |
| 5,013,681 A | 5/1991 | Godbey et al. |
| 5,015,353 A | 5/1991 | Hubler et al. |
| 5,034,343 A | 7/1991 | Rouse et al. |
| 5,036,023 A | 7/1991 | Dautremont-Smith et al. |
| 5,110,748 A | 5/1992 | Sarma |
| 5,120,666 A | 6/1992 | Gotou |
| 5,138,422 A | 8/1992 | Fujii et al. |
| 5,198,371 A | 3/1993 | Li |
| 5,200,805 A | 4/1993 | Parsons et al. |
| 5,232,870 A * | 8/1993 | Ito et al. ............... 438/455 |
| 5,234,535 A | 8/1993 | Beyer et al. |
| 5,242,863 A | 9/1993 | Xiang-Zheng et al. |
| 5,250,446 A | 10/1993 | Osawa et al. |
| 5,256,581 A | 10/1993 | Foerstner et al. |
| 5,259,247 A | 11/1993 | Bantien |
| 5,300,788 A | 4/1994 | Fan et al. |
| 5,310,446 A | 5/1994 | Konishi et al. |
| 5,400,458 A | 3/1995 | Rambosek |
| 5,405,802 A | 4/1995 | Yamagata et al. |
| 5,413,951 A | 5/1995 | Ohori et al. |
| 5,494,835 A | 2/1996 | Bruel |
| 5,524,339 A | 6/1996 | Gorowitz et al. |
| 5,559,043 A | 9/1996 | Bruel |
| 5,567,654 A | 10/1996 | Beilstein, Jr. et al. |
| 5,611,316 A | 3/1997 | Oshima et al. |
| 5,618,739 A | 4/1997 | Takahashi et al. |
| 5,622,896 A | 4/1997 | Knotter et al. |
| 5,633,174 A | 5/1997 | Li |
| 5,661,333 A | 8/1997 | Bruel et al. |
| 5,714,395 A | 2/1998 | Bruel |
| 5,804,086 A | 9/1998 | Bruel |
| 5,811,348 A | 9/1998 | Matsushita et al. |
| 5,817,368 A | 10/1998 | Hashimoto |
| 5,854,123 A | 12/1998 | Sato et al. |
| 5,863,830 A | 1/1999 | Bruel et al. |
| 5,863,832 A | 1/1999 | Doyle et al. |
| 5,877,070 A | 3/1999 | Goesele et al. |
| 5,882,987 A | 3/1999 | Srikrishnan |
| 5,897,331 A | 4/1999 | Sopori |
| 5,909,627 A | 6/1999 | Egloff |
| 5,920,764 A | 7/1999 | Hanson et al. |
| 5,953,622 A | 9/1999 | Lee et al. |
| 5,966,620 A | 10/1999 | Sakaguchi et al. |
| 5,981,400 A | 11/1999 | Lo |
| 5,985,412 A | 11/1999 | Gösele |
| 5,993,677 A | 11/1999 | Biasse et al. |
| 5,994,207 A | 11/1999 | Henley et al. |
| 6,010,591 A | 1/2000 | Gösele |
| 6,013,563 A | 1/2000 | Henley et al. |
| 6,013,954 A | 1/2000 | Hamajima |
| 6,020,252 A | 2/2000 | Aspar et al. |
| 6,033,974 A | 3/2000 | Henley et al. |
| 6,048,411 A | 4/2000 | Henley et al. |
| 6,054,363 A | 4/2000 | Sakaguchi et al. |
| 6,054,370 A | 4/2000 | Doyle |
| 6,057,212 A | 5/2000 | Chan et al. |
| 6,071,795 A | 6/2000 | Cheung et al. |
| 6,096,433 A | 8/2000 | Kikuchi et al. |
| 6,103,597 A | 8/2000 | Aspar et al. |
| 6,103,599 A | 8/2000 | Henley et al. |
| 6,118,181 A | 9/2000 | Merchant et al. |
| 6,127,199 A | 10/2000 | Inoue |
| 6,146,979 A | 11/2000 | Henley et al. |
| 6,150,239 A | 11/2000 | Goesele et al. |
| 6,159,323 A | 12/2000 | Joly et al. |
| 6,190,998 B1 | 2/2001 | Bruel et al. |
| 6,198,159 B1 | 3/2001 | Hosoma et al. |
| 6,200,878 B1 | 3/2001 | Yamagata et al. |
| 6,204,079 B1 | 3/2001 | Aspar et al. |
| 6,225,190 B1 | 5/2001 | Bruel et al. |
| 6,225,192 B1 | 5/2001 | Aspar et al. |
| 6,271,101 B1 | 8/2001 | Fukunaga |
| 6,294,478 B1 | 9/2001 | Shkaguchi et al. |
| 6,303,468 B1 | 10/2001 | Aspar et al. |
| 6,316,333 B1 | 11/2001 | Bruel et al. |
| 6,323,108 B1 | 11/2001 | Kub et al. |
| 6,323,109 B1 | 11/2001 | Okonogi |
| 6,346,458 B1 | 2/2002 | Bower |
| 6,362,077 B1 | 3/2002 | Aspar et al. |
| 6,362,082 B1 | 3/2002 | Doyle et al. |
| 6,417,075 B1 | 7/2002 | Haberger et al. |
| 6,429,094 B1 | 8/2002 | Maleville et al. |
| 6,513,564 B2 | 2/2003 | Bryan et al. |
| 6,534,380 B1 | 3/2003 | Yamauchi et al. |
| 6,593,212 B1 | 7/2003 | Kub et al. |
| 6,596,569 B1 * | 7/2003 | Bao et al. ............... 438/151 |
| 6,607,969 B1 | 8/2003 | Kub et al. |
| 6,632,082 B1 | 10/2003 | Smith |
| 6,645,831 B1 | 11/2003 | Shaheen et al. |
| 6,645,833 B2 | 11/2003 | Brendel |
| 6,653,207 B2 | 11/2003 | Ohya et al. |
| 6,727,549 B1 | 4/2004 | Doyle |
| 6,756,285 B1 | 6/2004 | Moriceau et al. |
| 6,756,286 B1 | 6/2004 | Moriceau et al. |
| 6,764,936 B2 | 7/2004 | Daneman et al. |
| 6,770,507 B2 | 8/2004 | Abe et al. |
| 6,774,010 B2 | 8/2004 | Chu et al. |
| 6,902,987 B1 | 6/2005 | Tong et al. |
| 6,946,365 B2 | 9/2005 | Aspar et al. |
| 6,947,365 B2 | 9/2005 | Lai et al. |
| 6,974,759 B2 | 12/2005 | Moriceau et al. |
| 7,029,548 B2 | 4/2006 | Aspar et al. |
| 7,052,978 B2 | 5/2006 | Shaheen et al. |
| 7,476,596 B2 * | 1/2009 | Lieber et al. ............ 438/458 |
| 7,521,292 B2 * | 4/2009 | Rogers et al. ............ 438/118 |
| 2001/0007367 A1 | 7/2001 | Ohkubo |
| 2001/0007789 A1 | 7/2001 | Aspar et al. |
| 2002/0025604 A1 | 2/2002 | Tiwari |
| 2002/0083387 A1 | 6/2002 | Miner et al. |
| 2002/0145489 A1 | 10/2002 | Cornett et al. |
| 2002/0153563 A1 | 10/2002 | Ogura |
| 2002/0185684 A1 | 12/2002 | Campbell et al. |
| 2003/0077885 A1 | 4/2003 | Aspar et al. |
| 2003/0108715 A1 | 6/2003 | Roberds et al. |
| 2003/0119279 A1 | 6/2003 | Enquist |
| 2003/0134489 A1 | 7/2003 | Schwarzenbach et al. |
| 2003/0162367 A1 | 8/2003 | Roche |
| 2003/0199105 A1 | 10/2003 | Kub et al. |
| 2004/0009649 A1 | 1/2004 | Kub et al. |
| 2004/0029358 A1 | 2/2004 | Park et al. |
| 2004/0126708 A1 * | 7/2004 | Jing et al. ............... 430/320 |
| 2004/0144487 A1 | 7/2004 | Martinez et al. |
| 2004/0171232 A1 | 9/2004 | Cayrefoureq et al. |

| | | | |
|---|---|---|---|
| 2004/0209441 A1 | 10/2004 | Maleville et al. | |
| 2004/0222500 A1 | 11/2004 | Aspar et al. | |
| 2005/0029224 A1 | 2/2005 | Aspar et al. | |
| 2005/0042842 A1 | 2/2005 | Lei et al. | |
| 2005/0122845 A1 | 6/2005 | Lizzi | |
| 2006/0240275 A1 | 10/2006 | Gadkaree | |
| 2007/0020895 A1 | 1/2007 | Moriceau et al. | |
| 2007/0202660 A1 | 8/2007 | Moriceau et al. | |
| 2007/0259528 A1 | 11/2007 | Moriceau et al. | |
| 2008/0020547 A1* | 1/2008 | Kostrzewa et al. | 438/458 |
| 2008/0271835 A1* | 11/2008 | Di Cioccio et al. | 156/91 |

FOREIGN PATENT DOCUMENTS

| | | |
|---|---|---|
| EP | 0 410 679 A1 | 1/1991 |
| EP | 0 504 714 | 9/1992 |
| EP | 0 533 551 A1 | 3/1993 |
| EP | 0 293 049 B1 | 9/1993 |
| EP | 0 660 140 | 6/1995 |
| EP | 0 665 588 A1 | 8/1995 |
| EP | 0 703 609 | 3/1996 |
| EP | 0 754 953 B1 | 1/1997 |
| EP | 0 793 263 A2 | 9/1997 |
| EP | 0 801 419 A1 | 10/1997 |
| EP | 0 807 970 A1 | 11/1997 |
| EP | 0 849 788 A2 | 6/1998 |
| EP | 0 889 509 A2 | 1/1999 |
| EP | 0 898 307 | 2/1999 |
| EP | 0 917 193 A1 | 5/1999 |
| EP | 0 938 129 A1 | 8/1999 |
| EP | 0 902 843 B1 | 3/2000 |
| EP | 0 989 593 A2 | 3/2000 |
| EP | 0 994 503 A1 | 4/2000 |
| EP | 1 050 901 A2 | 11/2000 |
| EP | 1 059 663 A2 | 12/2000 |
| EP | 0 717 437 B1 | 4/2002 |
| EP | 0 786 801 A1 | 6/2003 |
| EP | 0 767 486 B1 | 1/2004 |
| EP | 0 925 888 B1 | 11/2004 |
| EP | 1 014 452 B1 | 5/2006 |
| FR | 2 671 472 A1 | 7/1992 |
| FR | 2 681 472 | 3/1993 |
| FR | 2 558 263 | 7/1995 |
| FR | 2 725 074 | 3/1996 |
| FR | 95 08882 | 6/1996 |
| FR | 2 736 934 | 1/1997 |
| FR | 2 748 850 A1 | 11/1997 |
| FR | 2 748 851 | 11/1997 |
| FR | 2 758 907 A1 | 7/1998 |
| FR | 2 767 416 A1 | 2/1999 |
| FR | 2 767 604 | 2/1999 |
| FR | 2 771 852 A1 | 6/1999 |
| FR | 2 773 261 | 7/1999 |
| FR | 2 774 510 A1 | 8/1999 |
| FR | 2 781 925 A1 | 2/2000 |
| FR | 2 796 491 | 1/2001 |
| FR | 2 797 347 | 2/2001 |
| FR | 2 809 867 | 12/2001 |
| FR | 2 819 099 A1 | 7/2002 |
| FR | 2 855 910 | 6/2003 |
| FR | 2 847 075 A1 | 5/2004 |
| FR | 2 861 497 | 4/2005 |
| FR | 2 895 562 | 12/2005 |
| GB | 2 211 991 A | 7/1989 |
| JP | 53-104156 | 9/1978 |
| JP | 58 31519 | 2/1983 |
| JP | 59-54217 | 3/1984 |
| JP | 62265717 | 11/1987 |
| JP | 101004013 | 1/1989 |
| JP | 08017777 | 1/1990 |
| JP | 4199504 | 7/1992 |
| JP | 07-254690 | 10/1995 |
| JP | 7-302889 | 11/1995 |
| JP | 8133878 | 5/1996 |
| JP | 09-213594 | 8/1997 |
| JP | 09-307719 | 11/1997 |
| JP | 10163166 | 6/1998 |
| JP | 10233352 | 9/1998 |
| JP | 11045862 | 2/1999 |
| JP | 11074208 | 3/1999 |
| JP | 11087668 | 3/1999 |
| JP | 11-145436 | 5/1999 |
| JP | 11317577 | 11/1999 |
| RU | 128757 | 6/2000 |
| WO | WO 95/20824 A1 | 8/1995 |
| WO | WO 99/08316 A1 | 2/1999 |
| WO | WO 99/35674 A1 | 7/1999 |
| WO | WO 99/39378 A1 | 8/1999 |
| WO | WO 00/48238 A1 | 8/2000 |
| WO | WO 00/63965 A1 | 10/2000 |
| WO | WO 01/11930 A2 | 2/2001 |
| WO | WO 01/43168 A2 | 6/2001 |
| WO | WO 02/05344 A1 | 1/2002 |
| WO | WO 02/47156 A1 | 6/2002 |
| WO | WO 02/083387 A1 | 10/2002 |
| WO | WO 03/013815 A1 | 2/2003 |
| WO | WO 2004/044976 A1 | 5/2004 |

OTHER PUBLICATIONS

Agarwal et al, "Efficient Production of Silicon-On-Insulator Films by Co-Implantation of HE+ with H+", *Applied Physics Letters*, vol. 72, No. 9, 1988, pp. 1086-1088.

Ahn, K. Y., et al., "Growth, Shrinkage, and Stability of Interfacial Oxide Layers Between Directly Bonded Silicon Wafers", *Applied Physics A.*, vol. 50, 1990, pp. 85-94.

Alley et al., "Surface Roughness Modification of Interfacial Contacts in Polysilicon Microstructures", Proceedings of the 7th International Conference on Solid-State Sensors and Actuators, *Transducers '93*, PACIFICO, Yokohama Japan. Jun. 7-10, 1993, pp. 288-291.

Almedia et al. "Bond formation in ion beam synthesized amorphous gallium nitride", Elsevier, *This Solid Films*, 343-344 1999, pp. 632-636.

Ascheron, C., "A Comparative Study of Swelling, Radiation, Strain and Radiation Damage of High-Energy Proton-bombarded GaAs, GaP, InP, SI and Ge Single Crystals, Nuclear Instruments and Methods In Physics Research", *Nuclear Instruments and Methods in Physics Research* B36, (1989), 1637172.

Ascheron, C., "A Study of Proton Bombardment Induced Swelling of GaP Single Crystals", *Phys. stat. sol.* (a) 92, (1985), pp 169.

Ascheron, C., "Gettering a Copper in Proton-and Helium-Bombarded Buried Regions of Gallium Phosphide", *Phys. stat. sol.* (a), vol. 106, 1988, pp. 73-79.

Ascheron, C., "Investigations of Hydrogen Implanted GaP Single Crystals by Means of Particle Induced 7-Spectroscopy, Infrared Spectroscopy, and Turyherford Backscattering Channeling Technique" *Phys. stat. sol.* (a) 89, (1985), pp 549.

Ascheron, C., "Proton Beam Modification of Selected AIIIBV Compounds", *Phys. stat. sol.* (a) 124, (1991), pp 11.

Ascheron, C. et al, "Proton Bombardment Induced Swelling of GaP", 1985, pp. 169-176.

Ascheron, C., "Swelling, Strain, and Radiation Damage of He+ Implanted GaP", *Phys. stat. sol.* (a) 96, 1986, pp. 555-562. (1986).

Asheron, C., "The Effect of Hydrogen Implantation Induced Stress on GaP Single Crystals", *Nuclear Instruments and Methods in Physics Research*, B28 (1987), pp. 350-359.

Aspar et al., "The Generic Nature of the Smart-Cut© Process for Thin-Film Transfer", *Journal of Electronic Materials*, vol. 30, No. 7, 2001, pp. 834-840.

Aspar et al., Smart-Cut® : The basic fabrication process for UNIBOND® SOI wafers, *SEMI* 1996, pp. 37-46.

Aspar et al., U.S. Appl. No. 09/777,516, also Pub. No. US 2001/0007789 A1 with copy of allowed claims, Published Jul. 12, 2001.

Aspar et al., U.S. Appl. No. 10/784,601, including pending claims, filed Feb. 23, 2004.

Aspar, B. "Basic Mechanisms Involved in the Smart-Cut Process", 1997, pp. 223-240.

Aspar, B. et al, "Characterization of SOI substrates: Application to Recent SIMOX and UNIBOND Wafers," *Electrochemical Society Proceedings*, vol. 96-3, pp. 99-111.

Aspar, B. et al, "Transfer of Structured and Patterned Thin Silicon Films Using the Smart-Cut Process", 1996, pp. 1985-1986.

Aspar, B. et al., "Ultra Thin Buried Oxide Layers Formed By Low Dose SIMOX Processes", Proc. 6th International Conference on SOI Technology and Devices, *Electro. Soc.*, vol. 94, No. 11, 1994, pp 62.

Ashurst et al., "Water Level Anti-Silicon Coatings for MEMS", Sensors and Actuators A104, 2003, pp. 213-221.

Auberton-Herve, A. J. et al, "A New Sal Material: Smart-Cut", 1996, pp. 214-219.

Auberton-Herve, A.J. et al, "SOI Materials for ULSI Applications", *Semiconductor International*, Oct. 1995, 5 pgs.

Berdichevsky, Y., Julia Khandurina, Andras Guttman and Y-Ho, Lo. "UV/Ozone Modification of Poly(dimethylsiloxane) Microfluidie Channels", Department of Electrical and Computer Engineering, University of California, 9500 Gilman Dr. MC 0407, San Diego, CA 92093, USA, Torrey Mesa Research Institute, San Diego, CA 92121, USA, 2003.

Blöchl P.E. et al., First-Principles Calculations of Diffusion Coefficients: Hydrogen in Silicon, *Physical Review Letters*, vol. 64, No. 12, 1990, pp. 1401-1404.

Borgati, Stephen P., "The Root-Mean-Square", Boston College, Nov. 16, 1998, Obtained from the Internet at: <http://www.analytictech.com/mb313/rootmean.htm>.

Bruel, M. et al., (vol. 99-1) Meeting Abstract No. 333, "Single Crystal Semiconductor Layer Delamination and Transfer Through Hydrogen Implantation", The 195th Meeting of the Electrochemical Society, May 2-6, 1999, Seattle, Washington.

Bruel, Michel, "Application of Hydrogen Ion Beams to Silicon on Insulator Material Technology", *Nuclear Instruments and Methods in Physics Research*, B108, 1996, pp. 313-319.

Bruel, M. et al., "Smart-Cut: A New Silicon on Insulator Material Technology Based on Hydrogen Implantation and Wafer Bonding", 1997, pp. 1636-164, Col. 36, Part 1, No. 3B.

Bruel, M. "Smart-Cut Process: The Way to Unibond S.O.I. Wafers", 1996, pp. unknown.

Bruel, M. et al, "Smart-Cut": A Promising New SOI material technology, *Proceedings 1994 IEEE, International Sal Conference*, Oct. 1995, pp. 178-179.

Bruel, M. et al, "Smart-Cut-a new SOI Material Technology based on hydrogen Implantation and wafer bonding," CEA, 1996, 24 pages.

Bruel, M., "Silicon on insulator Material Technology", *Electronic Letters*; 31 (1995) Jul. 6; No. 14; pp. 1201-1202.

Bruel, M., "Silicon-an-Insulator", *European Semiconductor*, Mar. 1997.

Camperi-Ginestet et al., "Alignable Epitaxial Liftoff of GaAs Materials With Selective Deposition Using Polyimide Diaphragms", *IEEE Transactions Photonics Technology Letters*, vol. 3, No. 12, 1991, pp. 1123-1126.

Canham et al. "Radiative Recombination Channels due to Hydrogen In Crystalline Silicon", *Materials Science and Engineering*, B4 (1989) pp. 41-45.

Carter et al., "Applications of Ion Beams to Materials", *Inst. Phys. Conf. Ser.*, No. 28, Chapter 1, 1976, pp. 30-36.

Carter, G. et al., The Collection of Ions Implanted in Semiconductors: II Range Distributions Derived From Collection and Sputter-Etch Curves, *Radiation Effects*, 1972, vol. 16, pp. 107-114.

Cassidy, Victor M., "Ion Implantation Process Toughens Metalworking Tools," *Modern Metals*, 1984, pp. 65-67.

Cerofolini et al., "Hydrogen-Related Complexes as the Stressing Species in High-Fluence, Hydrogen-Implanted, Single-Crystal Silicon" *Physical Review B*, vol. 46, No. 4, 1992, pp. 2061-2070.

Cerofini et al., "Ultradense Gas Bubbles in Hydrogen-or-Helium-Implanted (or Co-Implanted) Silicon", *Materials Science and Engineering*, B71, 2000, pp. 196-202.

Chu et al, "Radiation Damage of 50-250 keV Hydrogen Ions in Silicon", *Ion Implantation in Semiconductors*, eds. F. Chernob et al., Plenum New York 1976, pp. 483-492.

Chu, et al. "Ion Implantation in Semiconductors", Chernow, Borders and Brice, Pirnum Press, New York and London. Radiation Damage of 50-250 keV Hydrogen Ions in Silicon, 1976, pp. 483-491.

Chu, P.K. et al., "Plasma Immersion Ion Implantation-A Fledgling Technique for Semiconductor Processing", Materials Science and Engineering Reports, *A Review Journal*, vol. R17, Nos. 6-7, Nov. 30, 1996, pp. 207-280.

Cowern, N. et al., "Transport Diffusion of Ion-Implanted B In Si: Dose, Time, and Matrix Dependence of Atomic and Electrical Profiles", *J. Appl. Phys.*, vol. 68, No. 12, 1990, pp. 6191-6198.

Cristoloveanu, S. et al, "Electrical Properties of Unibond Material", *Electrochemical Society Proceedings*, vol. 96-3, pp. 142-147.

Csepregl, L. et al. "Regrowth Behavior of Ion-Implanted Amorphous Layers on <111> Silicon", *Applied Physics Letters*, vol. 2, 1976, pp. 92-93.

Cullis, A.G. et al. "Comparative study of annealed neon-, argon-, and krypton-ion implantation damage in silicon,"*J. Appl. Phys.*, 49(10), Oct. 1978, pp. 5188-5198.

Dhara et al, "Mechanism of nanoblister formation in Ga+ self-ion implanted GaN nanowires", *Applied Physics Letters*, vol. 86, No. 20, 2005, p. 203199.

Demeester, et al., "Epitaxial Lift-Off And Its Applications", *Semicond. Sci. Technol.*, vol. 8, 1993, pp. 1124-1135.

Denteneer, P. et al., Hydrogen Diffusion and Passivation of Shallow Impurities in Crystalline Silicon, *Materials Science Forum*, Trans Tech Publications, Switzerland, vols. 38-41, 1989, pp. 979-984.

Denteneer, P. et al., "Structure and Properties of Hydrogen-Impurity Pairs in Elemental Semiconductors", *Physical Review Letters*, vol. 62, No. 16, 1989, pp. 1884-1888.

DiCioccio et al., "III-V Layer Transfer Onto Silicon and Applications", *Phys. Stat. Sol.* (a), vol. 202, No. 4, 2005 pp. 509-515.

DiCioccio, et al.,"Silicon carbide on Insulator formation using the Smart Cut process", *Electronics Letters*, vol. 32, No. 12, Jun. 6, 1996, pp. 144-145.

Diem et al., "SOI 'SIMOX': From Bulk To Surface Micromachining, A New Age For Silicon Sensors and Actuators", *Sensors and Actuators*, vol. A 46-47, 1995, pp. 8-16.

Dirks, A. G. et al., "Columnar Microstructure In Vapor DEuropesited Thin Films ", *Thin Solid Films*, vol. 47, 1977, pp. 219-233.

Duo, et al., "Comparison Between The different Implantation orders in H+ and He+ Co-implantation", *J. Phys. D. Appl. Phys.* vol. 34, 2001, pp. 477-482.

Eaglesham, White, Feldman, Moriya and Jacobson, "Equilibrium Shape of Si," *Physical Review Letters*, vol. 70, No. 11, Mar. 15, 1993, pp. 1643-1646.

EerNisse, E., "Compaction of ion-implanted fused silica", *Journal of Applied Physics*, vol. 45, No. 1, Jan. 1974.

EerNisse, E.P., "Role of Integrated Lateral Stress In Surface Deformation of He-Implanted Surfaces" *Journal of Applied Physics*, vol. 48, No. 1, Jan. 1977, pp. 9-17.

Evans, J.H., "An Interbubble Fracture Mechanism Of Blister Formation on Helium-Irradiated Metals" *Journal Of Nuclear Materials*, 68, 1977, pp. 129-140.

Feijoo et al., "Prestressing of Bonded Wafers", vol. 92-7, 1992, pp. 230-238.

Feng et al., "Generalized Formula for Curvature Radius and Layer Stresses Caused By Thermal Strain in Semiconductor Multilayer Structures", *J. Appl. Phys.*, vol. 54, No. 1, 1983, pp. 83-85.

French Preliminary Search Report dated Jul. 25, 2008, 3 pages.

Fujitsuka et al., "A New processing Technique To Prevent Stiction Using Silicon Selective Etching For SOT-MEMS", *Sensors and Actruators*, A97-98, 2002, pp. 716-719.

Garnier, D. M., "The Fabrication Of A Partial Soi Substrate", Proceedings of the 9th International Symposium On Silicon On Isolator Technology and Devices, vol. 99, Chap. 54, 1990, 73-78.

Gerasimenko, N., "Infrared Absorption of Silicon Irradiated by Protons", *Phys. stat.sol.* (b) 90, (1978), pp. 689-695.

Ghandi, Sorab, "VLSI Fabrication Princiles-Silicon And Gallium Arsenide", *Rensselaer Polytechnic Institute*, 1983, John Wiley & Sons publishers, pp 135.

Goesele et al., "Semiconductor Wafer Bonding", Science and Technology, ECS Series, *Annual Review of Material Science*, vol. 28, New Jersey, 1999, pp. 215-241.

Greenwald, A.C., "Pulsed-electron-beam annealing of ion-implantation damage", *J. Appl. Phys.* 50(2), Feb. 1978, pp. 783-786.

Grovenor, C.R.M., *Microelectronic Materials*, pp. 73-75 (1989).

Guilhalmenc, C. et al, "Characterization By Atomic Force Microscopy of the SOI Layer Topography in Low Dose SIMOX Materials", *Materials Science and Engineering*, B46, 1997, pp. 29-32.

Haisma et al., Silicon-on-Insulator Wafer Bonding-Wafer Thinning Technological Evaluations, *JAPANese Journal of Applied Physics*, Aug. 28, 1989, No. 8, Part 1, Tokyo, Japan, pp. 1426-1443.

Hamaguchi et al., "Device Layer Transfer Technique using Chemi-Mechanical Polishing", *JAPANese Journal of Applied Physics*, Oct. 23, 1984, No. 10, Part 2, Tokyo, Japan, pp. L815-L817.

Hamaguchi et al., "Novel LSI/SOI Wafer Fabrication Using Device Layer Transfer Technique", *Proc. IEDM*, 1985, pp. 688-691.

Henttinen et al., "Mechanically Induced Si Layer Transfer if Hydrogen-Implanted Si-Wafers", *American Institute of Physics*, vol. 76, No. 17, 2000, pp. 2370-2372.

Holl, S. L., et al., "Fabrication Techniques for Thin-Film Silicon Layer Transfer", ECS Transactions 3 (6) 2006, pp. 67-73.

Hulett, D.M. et al., "Ion Nitriding and Ion Implantation: A Comparison," *Metal Progress*, 1985, pp. 18-21.

IBM Technical Disclosure Bulletin, *Isolation by Inert Ion Implantation*, 1986, vol. 29 No. 3, pp. 1416.

International Search Report, PCT/FR2004/002779, Mar. 23, 2005.

International Search Report, PCT/FR2004/002781, Mar. 23, 2005.

Japanese Office Action dated Oct. 25, 2007 for JAPANese Patent Application No. 2002-581572.

Jaussaud, C. et al., "Microstructure of Silicon Implanted With High Dose Oxygen Ions", *Appl. Phys. Lett.*, vol. 48, No. 11, 1985, pp. 1064-1066.

Johnson, "High Fluence Deuteron Bombardment of Silicon", *Radiation Effects*, vol. 32, pp. 159-167.

Jones, K. S. et al., "A Systematic Analysis of Defects In Ion Implanted Silicon", *Applied Physics A.*, vol. 45, 1988 pp. 1-34.

Jones et al., "Enhanced elimination of implantation damage upon exceeding the solid solubility", *J. App. Phys.*, vol. 62, No. 10, 1987, pp. 4114-4117.

Kamada et al, Observation of Blistering and Amorphization on Germanium Surface After 450 keV Ar+ION Bombardment, *Radiation Effects*, vol. 28, 1976, pp. 43-48.

Klem, J.F., "Characteristics of Lift-Off Fabricated AIGaAs/InGaAs Single-Strained-Quantum Well Structures On Glass and Silicon Substrates", *Inst. Phys. Conf. Ser.* No. 96: Chapter 6, (1989), pp. 387-392.

Komarov et al., Crystallographic Nature and Formation Mechanisms of Highly Irregular Structure in Implanted and Annealed S1, *LayersRadiation Effects*, vol. 42, 1979, pp. 169-178.

Kucheyev et al., "Ion Implantation Into GaN", *Materials Science and Engineering*, vol. 33, 2001, pp. 51-107.

Laporte A. et al., "Charged Defects At The Interface Between Directly Bonded Silicon Wafers"—Applied Physics—vol. 36 (Sep. 1997) pp. 5502-5506, Part 1, No. 9A.

Leti Outline—A New SOI Material Technology, 1996 (Author Unknown), pages unknown.

Li, J., "Novel Semiconductor Substrate Formed by Hydrogen Ion Implantation into Silicon," Appl. Phys. Lett., vol. 55, No. 21, Nov. 20, 1989, pp. 2223-2224.

Ligeon, E., "Hydrogen Implantation in Silicon Between 1.5 and 60 KeV", *Radiation Effects* 1976, vol. 27, pp. 129-137.

Liu et al., "Investigation of Interface In Silicon-On-Insulator by Fractal Analysis", *Applied Surface Science*, vol. 187, 2002, pp. 187-191.

Liu et al. "Ion Implantation in GaN At Liquid-Nitoigen Temperature: Structural Characteristics and Amorphization", *Physical Review B of The American Physical Society*, vol. 57, No. 4, 1988, pp. 2530-2535.

Maleville, C. et al, "Physical Phenomena involved in the Smart-Cut Process", *Electrochemical Society Proceeding*, vol. 96-3, pp. 34-46.

Maleville, C. et al, "Wafer Bonding and Hi-Implantation Mechanisms Involved In The Smart-Cut Technology", 1997, pp. 14-19.

Manuaba, A., "Comparative Study on Fe32Ni36Cr14P12B 6 Metallic Glass and its Polycrystalline Modification bombarded by 2000 keV Helium Ions with High Fluence" *Nuclear Instruments and Methods*, (1982) pp. 409-419.

Mastrangelo, C. et al., "Suppression of Stiction in MEMS", *Proceedings of the Materials Research Society Seminar*, vol. 605, 2000, pp. 1-12.

Matsuda et al., "Large Diameter Ion Beam Implantation System," *Nuclear Instruments and Methods*, vol. B21, 1987, pp. 314-316.

Matsuo et al., "Abnormal solid solution and activation behavior in GA-implanted Si(100)", *Appl. Phys. Lett.*, vol. 51, No. 24, 1987, pp. 2037-2039.

Materne, A. et al., "Changes in Stress and Coercivity After Annealing Of Amorphous Co (Zr, Nb) Thin Films DEuropesited by R. F. Sputtering", donloaded on Apr. 24, 2009, pp. 1752-1754.

Mishima, Y. and T. Yagishita, T. "Investigation of the bubble formation mechanism in a-Si:H films by Fourier-transform infrared microspectroscopy" *J. Appl. Phys.*, vol. 64, No. 8, Oct. 15, 1988, pp. 3972-3974.

Miyagawa, S. et al, "Helium Reemission During Implantation of Silicon Carbide", 1982, pp. 2302-2306.

Miyagawa, S., "Surface structure of silicon carbide Irradiated with helium ions with mono energy and continuous energy distributions" *J. Appl. Phys.* 53(12), Dec. 1982, pp. 8697-8705.

Monemar, B. "Shallow Impurities in Semiconductors 1998", Proceedings of the Third International Conference in Sweden, Aug. 10-12, 1988, No. 95, pp. 493-499.

Moreau, Wayne M., "Semiconductor Lithography, Principles, Practices, and Materials," Plenum Press, 1988. Table of Contents only.

Moriceau, H. et al, A New Characterization Process Used to Qualify SOI Films 1991 pp. 173-178.

Moriceau, H. et al, "A New Characterization Process Used to Qualify SOI Films", 1991 pp. 173-178.

Moriceau, H. et al. "Cleaning and Polishing As Key Steps For Smart-Cut SOI Process", Proceedings 1996 IEEE SOI Conference, Oct. 1996.

Moriceau, H. et al, "The Smart-Cut Process as a Way to Achieve Specific Film Thickness in Sal Structures", 1997, pages unknown.

Moriceau et al., (vol. 99-1) Meeting Abstract No. 405, "A New Characterization Process Used to Qualify SOI Films", The 195$^{th}$ Meeting of The Electrochemical Society, May 2-6, 1999, Seattle, Washington.

Munteanu, D. et al, "Detailed Characterization of Unibond Material", 1997, pp. 395-398.

Myers, D. R., "The effects of Ion-Implantation damage on the first order Raman spectra GaPa)" *J. Appl. Phys.* 54(9), Sep. 1977.

Nethling. J. et al, "Identification of Hydrogen Platelets in ProtonBombarded GaAs", 1985, pp. 941-945.

Nichols C. S et al., "Properties of Hydrogen in Crystalline Silicon Under Compression and Tension", *Physical Review Letters*, vol. 63, No. 10, 1989, pp. 1090-1093.

Nicoletti, S. et al., "Bi-Epitaxial YBCO Grain Boundry Josephson Junctions on SrTiO3 and Sapphire Substrates", *Physics C269*, 1996, pp. 255-267.

Office Action (NF) for U.S. Appl. No. 10/474,984—Dated Sep. 24, 2004.(16).

Office Action (NF) for U.S. Appl. No. 10/474,984—Dated Jun. 6, 2005. (16).

Office Action (NF) for U.S. Appl. No. 10/474,984—Dated Nov. 16, 2005. (16).

Office Action (NF) for U.S. Appl. No. 10/474,984—Dated May 17, 2006. (16).

Office Action (NF) for U.S. Appl. No. 10/474,984—Dated May 7, 2007. (16).

Office Action (NF) for U.S. Appl. No. 10/474,984—Dated Feb. 6, 2008. (16).

Office Action (F) for U.S. Appl. No. 10/474,984—Dated Oct. 17, 2008. (16).

Office Action (NF) for U.S. Appl. No. 10/474,984—Dated Jul. 7, 2009. (16).

Office Action (F) for U.S. Appl. No. 10/474,984—Dated Mar. 11, 2010 (16).

Office Action (NF) for U.S. Appl. No. 10/561,299—Dated Mar. 26, 2008 (34).

Office Action (F) U.S. Appl. No. 10/561,299—Dated Dec. 9, 2008 (34).

Office Action (F) U.S. Appl. No. 10/561,299—Dated May 11, 2009 (34).

Office Action (F) U.S. Appl. No. 10/561,299—Dated Nov. 16, 2009 (34).

Office Action (NF) U.S. Appl. No. 10/561,299—Dated Nov. 27, 2009 (34).

Office Action (F) U.S. Appl. No. 10/561,299—Dated May 11, 2010 (34).
Office Action (NF) U.S. Appl. No. 10/565,621—Dated May 15, 2007 (37).
Office Action (F) U.S. Appl. No. 10/565,621—Dated Feb. 11, 2008 (37).
Office Action (NF) U.S. Appl. No. 10/565,621—Dated Sep. 12, 2008 (37).
Office Action (F) U.S. Appl. No. 10/565,621—Dated Mar. 12, 2009 (37).
Office Action (NF) U.S. Appl. No. 10/565,621—Dated Jan. 7, 2010 (37).
Office Action (F) U.S. Appl. No. 10/565,621—Dated Nov. 23, 2010 (37).
Office Action (NF) U.S. Appl. No. 12/628,772—Dated Oct. 7, 2010 (93).
Ono et al., "Orientation Dependence of Flaking of Ion Irradiated Aluminum Single Crystals", *Japanese Journal of Applied Physics*, vol. 25, No. 10, 1986, pp. 1475-1480.
Paszti, E, "Flaking and Wave-Like Structure on Metallic Glasses Induced by MeV-Energy Helium Ions", *Nuclear Instruments and Methods*, vol. 209/210, (1983), pp. 273-280.
Picraux, S. Thomas et al., "Ion Implantation of Surfaces," *Scientific American*, vol. 252, No. 3, pp. 102-113 1985.
Pollentier, et al., "Fabrication of High-Radiance LEDs by Epitaxial Lift-Off", *SPIE*, vol. 1361, 1990, pp. 1056-1062.
Primak, W., "Impurity Effect in the Ionization Dilation of Vitreous Silica" *J. Appl. Phys.* 39(13) 1968.
Reissue U.S. Appl. No. 10/449,786.
Renier, M. et al., "A New Low-Energy Ion Implanter for Bombardment of Cylindrical Surfaces," *Vacuum*, vol. 35, No. 12, pp. 577-578, 1985.
Roth, J., "Blistering and Bubble Formation" *Inst. Phys. Conf. Ser.* No. 28, 1976: Chapter 7, pp. 280-293.
Sah, Chih-Tang et al., "Deactivation of the Boron Acceptor in Silicon by Hydrogen," *Appl. Phys. Lett.* 43, (2), Jul. 1983, pp. 204-206.
Saint-Jacques R. G., "La Formation des Cloques", *Nuclear Instruments and Methods*, No. 209/210, North Holland Publishing Co., 1983, pp. 333-343.
Schnell et al., "Plasma Surface Texturization for Multicrystaline Silicon Solar Cells", *IEEE*, XXIII, Photovoltaic Conference, 2000, pp. 367-370.
Shintani, A. et al., "Temperature dependence of stresses in chemical deposited vitreous films", *J. Appl. Phys.*, vol. 51, No. 8, 1980, p. 4197.
Silicon-On-Insulator, *European Semiconductor*, Mar. 1997, pp. 17 and 18.
Sioshansi, Piran, "Ion Beam Modification of Materials for Industry," *Thin Solid Film*, vol. 118, 1984, pp. 61-71.
Snyman, H. C., "Transmission Electron Microscopy of Extended Crystal Defects in Proton Bombarded and Annealed GaAs", *Radiation Effects*, 1983, vol. 69, pp. 199-230.
Snyman, H. C. et al, "Void Formation in Annealed Proton-Bombarded GaAs", 1981, pp. 243-245.
Stein, Myers and Follstaedt, "Infrared Spectroscopy of chemically bonded hydrogen at voids and defects in silicon", *J. Appl. Phys.* 73(b6), Mar. 15, 1993, pp. 2755-2764.
Stephen, D., "Investigation of Lattice Strain in Proton-Irradiated GaP by a Modified Auleytner Technique" *Phys. stat. sol.* (a) 87, 1985, pp. 589-596.
Sunkara et al., "Bulk synthesis of silicon nanowires using a low-temperature vapor-liquid-solid solution", *Applied Physics Letters*, vol. 79, No. 10, 2001, pp. 1546-1548.
Suzuki et al., "High-Speed and Low Power n+—p+ Double-Gate SOI CMOS", *IEICE Trans. Electron.*, vol. E78-C, No. 4, 1995, pp. 360-367.
Sze, S.M., VLSI Technology, 2.sup.nd Ed., 1988, pp. 9-10.
Tan, T. Y. et al., "On Oxygen Precipitation Retardation/Recovery Phenomena, Nucleation Incubation Phenomena and The Exigent-Accomodation-Volume Factor of Precipitation", Proceedings of the 5th International Symposium on Silicon Materials Science and Technology, *Semiconductor Silicon 198 Electrochem. Soc.*, New Jersey, 1986, pp. 864-873.

Terada, K. et al., "A New Dram Cell With A Transistor On A Lateral Epitaxial Silicon Layer (Tole Cell)", *IEEE Transactions On Electron Device*, vol. 37, No. 9, 1990, pp. 2052-2057.
Terreault, Bernard, "Hydrogen Blistering of Silicon: Progress In Fundamental Understanding", *Phys. Stat. Sol.* (a) 204, No. 7, 2007, pp. 2129-2184.
Theodore, N. David et al., TFSOI With Improved Oxidation Resistance (To Reduce Isolation Induced Stresses and Leakage), Motorola Bulletin XP 000691920, *Technical Developments*, Nov. 1996, pp. 158-59.
Timoshenko, S. et al., "Analysis of Bi-Metal Thermostats", *J. Opt. Soc. Am.*, vol. 11, 1925, pp. 233-256.
Tong, Q. Y., in "Silicon Wafer Bonding Technology for VLSI and MEMS applications", edited by S.S. Iyer and A.J. Auberton—Hervé, 2002, INSPEC, London, Chapter 1 entitled: "Principle of Wafer Bonding", pp. 1-20.
Tong et al., "Low Temperature SI Layer Splitting", Proceedings 1997 IEEE International SOI Conference, Oct. 1997, pp. 126-127.
Tonini, Monelli, Cornl, Ottaviani, Frabboni, Canteri, Queirolo, "Hydrogen Interaction with phosphorus ion implantated silicon", *Ion Implantation Technology* -94, pp. 801-804.
Tzeng, J.C., "A Novel Self-Aligned Oxgyen (Salox) Implanted SOI Mosfet Device Structure" *Nuclear Instruments and Methods in Physics Research* B2, 1987, pp. 112-115.
U.S. Dept. of Energy, "The Fusion Connection: Contributions to Industry, Defense, and Basic Science Resulting From Scientific Advances Made in the Magnetic Fusion Energy Program", *Plasma Coating*, pp. 6-7, 1985.
Van de Walle, C. "Structural Identification of Hydrogen and Muonium Centers in Silicon First Principles Calculations of Hyperfine Parameters", *Physical Review Letters*, vol. 60, No. 26, 1988, pp. 2761-2764.
Van de Walle, C. "Theoretical Aspects of Hydrogen in Crystalline Semiconductors", *Physica B*, Holland, vol. 170, No. 15, 1991, pp. 21-32.
Van de Walle, C. "Theory of Hydrogen Diffusion and Reactions in Crystalline Silicon", *Physical Review Letters*, vol. 64, No. 6, 1980, pp. 669-672.
Van de Walle, C. "Theory of Hydrogen Diffusion and Reactions in Crystalline Silicon", *Physical Review B*, vol. 39, No. 15, 1989, pp. 10 791-10 808, plus diagrams.
Van Swijgenhoven et al. "Helium Bubble and Blister Formation for Nickel and An AMorphous Fe-Ni-Mo-B Alloy During 5 key He-+-Irradiation at Temperatures Between 200 K and 600", *Nuclear Instruments and Methods*, 209/210, 1983, pp. 461-468.
Veldkamp, W.B. et al., "Binary Optics," *Scientific American*, 1992, pp. 50-55.
Weldon et al., "Mechanism of Silicon Exfoliation Induced by Hydrogen/Hekium Co-implantation", *Applied Physics Letters*, vol, 73, No. 25, pp. 3721-3723.
Wemple, S.H., "Optical and channeling studies of ion-bombarded GaP", *J. Appl. Phys.*, vol. 45, No. 4, Apr. 1974, pp. 1578-1588.
Whitton, J. L. et al., "The Collection of Ions Implanted In Semiconductors: 1 Saturations Effects", *Radiation Effects*, Scotland, vol. 16, 1972, pp. 101-105.
Wiegand, M. et al., "Wafer Bonding of Silicon Wafers Covered With Various Surface Layers", *Sensors and Actuators*, Elsevier Science B.V., vol. 86, 2000, pp. 91-95.
Williams J. et al., "Annealing behaviour of high-dose rare-gas implantations into silicon", from Application of Ion Beans to Materials, 1975, Chap. 1, *Inst. Phys. Conf. Ser.* No. 28, 1976, pp. 30-36.
Wittmaack et al., "High Fluence Retention of Noble Gases Implanted in Silicon" *Radiation Effects*, vol. 39, 1978, pp. 81-95.
Wolf, Stanley Ph.D., Silicon Processing for the VLSI Era (vol. 2), Lattice Press, 1990, pp. 66-79.
Wong et al., "Integration of GaN Thin Films With Dissimilar Substrate Materials by Pd-In Metal Bonding and Laser Lift-Off", Journal of Electronic Materials, vol. 28, No. 12, 1999, pp. 1409-1413.
Yamaguchi H. et al., "Intelligent Power IC With Partial Soi Structure", *Jpn. J. Appl. Phys.*, vol. 34, 1995, pp. 864-868.
Yee et al., "Polysilicon Surface-Modification Technique to Reduce Sticking of Microstructures", *Sensors and Actuators* A 52, 1996, pp. 145-150.

Yun et al., "Fractional Implantation Area Effects on Patterned Ion-Cut Silicon Layer Transfer", Dept. of Electrical Eng, and Computer Sciences, University of California, Berkley, CA, 94720, USA, 1999 IEEE International SOI Conference, Oct, 1999, pp. 129-30.

Yun et al., "Thermal and Mechanical Separations of Silicon Layers From Hydrogen Pattern-Implanted Wafers", *Journal of Electronic Materials*, vol. 38, No. 8, 2001, pp. 960-964.

Yun, H. et al., "Transfer of Patterned Ion-Cut Silicon Layers", *Applied Physics Letters*, vol. 73, No. 19, 1998, pp. 2772-2774.

U.S. District Court District of Delaware (Wilmington) Civil Docket For Case #: 1:08-cv-00292-SLR—(54 pgs).

Complaint filed with Jury Demand against MEMC Electronic Materials Inc.—Magistrate Consent Notice to Pltf. ( Filing fee $ 350, receipt No. 152004.)—filed by SOITEC Silicon on Insulator Technologies SA, Commissariat a LEnergie Atomique. (Attachments: # 1 Exhibit 1, # 2 Exhibit 2, # 3 Exhibit 3, # 4 Civil Cover Sheet, # 5 Acknowledgment of Consent Form) (sns, ) (Entered: May 20, 2008) (47 pgs).

Notice of Availability of a U.S. Magistrate Judge to Exercise Jurisdiction (sns, ) (Entered: May 20, 2008) (1 pg).

Report to the Commissioner of Patents and Trademarks for Patent/Trademark Number(s) RE39,484 E; 6,809,009; 7,067,396 B2; (sns, ) (Entered: May 20, 2008) (1 pg).

Summons Returned Executed by SOITEC Silicon On Insulator Technologies SA, Commissariat a LEnergie Atomique. MEMC Electronic Materials Inc. served on May 19, 2008, answer due Jun. 9, 2008. (Kraft, Denise) (Entered: May 20, 2008) (2 pgs).

Motion for Pro Hac Vice Appearance of Attorney George W. Neuner, Alan M. Spiro, Brian M. Gaff and Carolyn D'Agincourt—filed by SOITEC Silicon On Insulator Technologies SA, Commissariat a LEnergie Atomique. (Attachments: # 1 Certificate of Compliance Certification by Counsel To Be Admitted Pro Hac Vice, # 2 Certificate of Compliance Certification by Counsel To Be Admitted Pro Hac Vice, # 3 Certificate of Compliance Certification by Counsel To Be Admitted Pro Hac Vice, # 4 Certificate of Compliance Certification by Counsel To Be Admitted Pro Hac Vice, # 5 Certificate of Service)(Kraft, Denise) (Entered: May 23, 2008) (6 pgs).

Stipulation to Extend Time Answer to Complaint to Jul. 9 , 2008—filed by MEMC Electronic Materials Inc.. (Rogowski, Patricia) (Entered: Jun. 5, 2008) (1 pg).

Motion for Pro Hac Vice Appearance of Attorney Robert M. Evans, Jr., David W. Harlan, Richard L. Brophy, Marc W. Vander Tuig—filed by MEMC Electronic Materials Inc.. (Attachments: # 1 Certification of Robert M. Evans, Jr., # 2 Certification of David W. Harlan, # 3 Certification of Richard L. Brophy, # 4 Certification of Marc W. Vander Tuig)(Rogowski, Patricia) (Entered: Jun. 9, 2008) (6 pgs).

Motion for Pro Hac Vice Appearance of Attorney Michael L. Brody, Richard P. Gilly, Gail J. Standish, Marcus T. Hall and Jason S. Charkow—filed by SOITEC Silicon On Insulator Technologies SA. (Attachments: # 1 Certification By Counsel to be Admitted Pro Hac Vice, # 2 Certification By Counsel to be Admitted Pro Hac Vice, # 3 Certification By Counsel to be Admitted Pro Hac Vice, # 4 Certification By Counsel to be Admitted Pro Hac Vice, # 5 Certification By Counsel to be Admitted Pro Hac Vice)(Kraft, Denise) (Entered: Jun. 10, 2008) (8 pgs).

Disclosure Statement pursuant to Rule 7.1 filed by SOITEC Silicon On Insulator Technologies SA, Commissariat a LEnergie Atomique. (Attachments: # 1 Certificate of Service)(Kraft, Denise) (Entered: Jun. 16, 2008) (3 pgs).

Motion to Dismiss Based upon or, in the Alternative, Motion for a More Definite Statement—filed by MEMC Electronic Materials Inc. (Rogowski, Patricia) (Entered: Jul. 9, 2008) (4 pgs).

Opening Brief in Support re 10 Motion to Dismiss Based upon or, in the Alternative, Motion for a More Definite Statement filed by MEMC Electronic Materials Inc..Answering Brief/Response due date per Local Rules is Jul. 28, 2008. (Rogowski, Patricia) (Entered: Jul. 9, 2008) (15 pgs).

Disclosure Statement pursuant to Rule 7.1 filed by MEMC Electronic Materials Inc. (Rogowski, Patricia) (Entered: Jul. 9, 2008) (3 pgs).

Answering Brief in Opposition re 10 Motion to Dismiss Based upon or, in the Alternative, Motion for a More Definite Statement filed by Commissariat a L'Energie Atomique. Reply Brief due date per Local Rules is Aug. 7, 2008. (Attachments: # 6 Exhibit A, # 7 Exhibit B, # Certificate of Service) (Kraft, Denise) (Modified on Jul. 29, 2008 (lid). (Entered: Jul. 28, 2008) (29 pgs).

Sealed Reply Brief re 10 Motion to Dismiss Based upon or, in the Alternative, Motion for a More Definite Statement filed by MEMC Electronic Materials Inc. (Rogowski, Patricia) (Entered: Aug. 7, 2008) Redacted Reply Brief re 14—re 10 Motion to Dismiss Based upon or, in the Alternative, Motion for a More Definite Statement filed by MEMC Electronic Materials Inc. (Attachments: # 1 Exhibit 2, # 2 Exhibit 3, # 3 Exhibit 4, # 4 Exhibit 5, # 5 Unreported Cases, # 6 Certificate of Service) (Rogowski, Patricia) Modified on Aug. 8, 2008 (lid). (Entered: Aug. 7, 2008) (98 pgs).

Redacted Reply Brief re 14—re 10 Motion to Dismiss Based upon or, in the Alternative, Motion for a More Definite Statement filed by MEMC Electronic Materials Inc. (Attachments: # 1 Exhibit 2, # 2 Exhibit 3, # 3 Exhibit 4, # 4 Exhibit 5, # 5 Unreported Cases, # 6 Certificate of Service) (Rogowski, Patricia) Modified on Aug. 8, 2008 (lid). (Entered: Aug. 7, 2008) (98 pgs).

Memorandum Order denying 10 Motion to Dismiss Based upon or, in the Alternative, Motion for a More Definite Statement filed by MEMC Electronic Materials Inc., Order, Setting Hearings Telephonic Scheduling Conference set for Mar. 12, 2009 at 9:00 A.M. Signed by Judge Sue L. Robinson on Feb. 20, 2009. (nmf) (Entered: Feb. 20, 2009) (6 pgs).

Motion for Pro Hac Vice Appearance of Attorney B. Scott Eidson—filed by MEMC Electronic Materials Inc. (Attachments: # 1 Exhibit Certification by Counsel to be Admitted Pro Hac Vice)(Rogowski, Patricia) (Entered: Feb. 23, 2009) (4 pgs).

Notice of Service of Plaintiffs' Initial Disclosures Pursuant to Fed. R. Civ. P. 26(a)(1) by SOITEC Silicon on Insulator Technologies SA, Commissariat a L'Energie Atomique. (Attachments: # 1 Certificate of Service) (Kraft, Denise) (Entered: Feb. 27, 2009) (4 pgs).

Answer to 1 Complaint, with Jury Trial Demanded, Counterclaim against all plaintiffs by MEMC Electronic Materials Inc.. (Attachments: # 1 Exhibit A)(Rogowski, Patricia) (Entered: Mar. 6, 2009) (55 pgs).

Notice of Service of MEMC Electronic Materials, Inc.'s Initial Disclosures by MEMC Electronic Materials Inc. (Rogowski, Patricia) (Entered: Mar. 6, 2009) (3 pgs).

Proposed Order Proposed Scheduling Order re 16 Memorandum and Order, Set Hearings, by SOITEC Silicon On Insulator Technologies SA, Commissariat a 'LEnergie Atomique. (Kraft, Denise) (Entered: Mar. 10, 2009) (7 pgs).

Letter to The Honorable Sue L. Robinson from Denise Seastone Kraft, Esq. regarding [Proposed] Scheduling Order—re 21 Proposed Order, 16 Memorandum and Order, Set Hearings,. (Kraft, Denise) (Entered: Mar. 10, 2009) (1 pg).

Stipulation to Extend Time to Respond or Otherwise Plead to Defendant's Counterclaim to Apr. 7, 2009—filed by SOITEC Silicon On Insulator Technologies SA, Commissariat a L'Energie Atomique. (Attachments: # 1 Certificate of Service)(Kraft, Denise) (Entered: Mar. 11, 2009) (2 pgs).

Proposed Order Revised Scheduling Order re 21 Proposed Order, 16 Memorandum and Order Set Hearings, by SOITEC Silicon on Insulator Technologies SA, Commissariat a L'Energie Atomique. (Kraft, Denise) (Entered: Mar. 12, 2009) (7 pgs).

Letter to The Honorable Sue L. Robinson from Denise Seastone Kraft regarding Revised Scheduling Order Pursuant to Mar. 12, 2009 Telephonic Scheduling Conference—re 24 Proposed Order. (Kraft, Denise) (Entered: Mar. 12, 2009) (1 pg).

Scheduling Order: Case referred to the Magistrate Judge for the purpose of exploring ADR. Joiner of Parties due by Aug. 14, 2009. Amended Pleadings due by Aug. 14, 2009. Discovery due by Apr. 23, 2010. Discovery Conference set for Jun. 25, 2009 04:30 PM in Courtroom 6B before Judge Sue L. Robinson. Dispositive Motions due by Jun. 25, 2010. Answering Brief due Jul. 16, 2010. Reply Brief due Jul. 30, 2010. Oral Argument set for Aug. 27, 2010 09:30 AM in Courtroom 6B before Judge Sue L. Robinson. Claim Construction Opening Briefs due by Jun. 18, 2010. Response Briefs due Jul. 9, 2010. Final Pretrial Conference set for Oct. 14, 2010 04:30 PM in Courtroom 6B before Judge Sue L. Robinson. Jury Trial set for Oct. 25, 2010 09:30 AM in Courtroom 6B before Judge Sue L. Robinson. Signed by Judge Sue L. Robinson on Mar. 16, 2009. (nmf) (Entered: Mar. 16, 2009) (7 pgs).

Order Setting Teleconference: Telephone Conference set for Mar. 23, 2009 at 11:00 AM before Judge Mary Pat Thynge to discuss ADR. Signed by Judge Mary Pat Thynge on Mar. 16, 2009. (cak) (Entered: Mar. 16, 2009) (4 pgs).

Order Setting Teleconference: a teleconference has been scheduled for Monday, Jun. 1, 2009 at 10:00 a.m. with Magistrate Judge Thynge to discuss the status of the case and the parties negotiations. Counsel for MEMC shall initiate the teleconference call to 302-573-6173. It Is Further Ordered that the Court is holding Sep. 10, Sep. 14 and Sep. 15, 2009 as possible mediation dates. Counsel are to advise Judge Thynge by Mar. 30, 2009 if any of these dates works for everyone to schedule the mediation. Signed by Judge Mary Pat Thynge on Mar. 23, 2009. (cak) (Entered: Mar. 23, 2009) (2 pgs).

Order Setting Mediation Conferences: Mediation Conference Tentatively set for Sep. 15, 2009 at 10:00 Am in Courtroom 2B before Judge Mary Pat Thynge. See order for details. Signed by Judge Mary Pat Thynge on Mar. 24, 2009. (cak) (Entered: Mar. 24, 2009) (6 pgs).

Motion to Dismiss Based upon Fed. R. Civ. P. 12(b)(1) and (6) and Article III of the United States Constitution—filed by SOITEC Silicon On Insulator Technologies SA, Commissariat a LEnergie Atomique. (Attachments: # 1 Text of Proposed Order, # 2 Certificate of Service)(Kraft, Denise) (Entered: Apr. 7, 2009) (5 pgs).

Opening Brief in Support re 30 Motion to Dismiss Based upon Fed. R. Civ. P. 12(b)(1) and (6) and Article III of the United States Constitution Motion to Dismiss Based upon Fed. R. Civ. P. 12(b)(1) and (6) and Article III of the United States Constitution filed by SOITEC Silicon on Insulator Technologies SA, Commissariat a L'Energie Atomique Answering Brief/Response due date per Local Rules is Apr. 27, 2009. (Attachments: # 1 Certificate of Service)(Kraft, Denise) (Entered: Apr. 7, 2009) (13 pgs).

Answer to 19 Answer to Complaint, Counterclaim Partial Answer to Defendant's Counterclaims, Affirmative Defenses and Soitec Counterclaims, Counterclaim against MEMC Electronic Materials Inc. by SOITEC Silicon On Insulator Technologies SA, Commissariat a LEnergie Atomique. (Attachments: # 1 Certificate of Service)(Kraft, Denise) (Entered: Apr. 7, 2009) (18 pgs).

Notice of Service of First Request for Production of Documents and Things Directed to Commissariat a L'Energie Atomique; First Request for Production of Documents and Things Directed to SOITEC Silicon on Insulator Technologies, S.A. and SOITEC USA, Inc.; and First Set of Interrogatories Directed to SOITEC Silicon on Insulator Technologies, S.A., SOITEC USA, Inc. And Commissariat a L'Energie Atomique by MEMC Electronic Materials Inc. (Rogowski, Patricia) (Entered: Apr. 14, 2009) (3 pgs).

Stipulation to Extend Time Defendant to File Answering Brief in Opposition to Plaintiffs' Partial Motion to Dismiss Counterclaim Counts II, III, IV, V, and VIII to May 6, 2009—filed by MEMC Electronic Materials Inc. (Rogowski, Patricia) (Entered: Apr. 21, 2009) (3 pgs).

Answer to 32 Answer to Counterclaim,,, of S.O.I. TEC Silicon on Insulator Technologies, S.A. and SOITEC U.S.A., Inc. by MEMC Electronic Materials Inc. (Rogowski, Patricia) (Entered: Apr. 23, 2009) (4 pgs).

Stipulation to Extend Time Answering Brief in Opposition to Plaintiffs' Partial Motion to Dismiss Counterclaim Counts II, III, IV, V and VIII to May 15, 2009—filed by MEMC Electronic Materials Inc.. (Rogowski, Patricia) (Entered: May 6, 2009) (3 pgs).

Notice of Service of Soitec's First Set of Interrogatories (Nos. 1-17) and Soitec's First Set of Requests for Production of Documents and Things (Nos. 1-132) by SOITEC Silicon On Insulator Technologies SA, Commissariat a 'LEnergie Atomique. (Attachments: # 1 Certificate of Service)(Kraft, Denise) (Entered: May 6, 2009) (2 pgs).

Stipulation to Extend Time for Defendant to File an Answering Brief in Opposition to Plaintiffs' Partial Motion to Dismiss Counterclaim Counts II, III, IV, V, and VIII; and Stipulation to Extend Time for Plaintiffs to File Responses to MEMC's First Requests for Production of Documents and to MEMC's First Set of Interrogatories to May 29, 2009—filed by SOITEC Silicon On Insulator Technologies SA, Commissariat a L'Energie Atomique. (Attachments: # 1 Certificate of Service)(Kraft, Denise) (Entered: May 13, 2009).

Notice of Service of (1) Subpoena to Hayes Soloway, P.C., (2) Subpoena to Pearne & Gordon, LLP, (3) Subpoena to Brinks Hofer Gilson & Lione, and (4) Subpoena to Winston & Strawn by MEMC Electronic Materials Inc. (Rogowski, Patricia) (Entered: May 14, 2009) So Ordered- re 38 Stipulation to Extend Time. Set Briefing Schedule: re 30 Motion to Dismiss. (Answering Brief due May 29, 2009.) (Refer to Stipulation for Further Details.). Signed by Judge Sue L. Robinson on May 15, 2009. (lid) (Entered: May 15, 2009).

Stipulation to Extend Time for Defendant to File Its Answering Brief until Jun. 5, 2009 by MEMC Electronic Materials Inc.. (Rogowski, Patricia) (Entered: May 28, 2009) So Ordered, re 40 Stipulation, Set Briefing Schedule: re 30 Motion to Dismiss Based upon Fed. R. Civ. P. 12(b)(1) and (6) and Article III of the United States Constitution. (Answering Brief due Jun. 5, 2009.). Signed by Judge Sue L. Robinson on May 29, 2009. (nmf) (Entered: May 29, 2009).

Notice of Service of (1) Soitec's Objections and Responses to MEMC's First Set of Interrogatories; (2) Soitecs Objections and Responses to MEMC's First Request for Production of Documents and Things; (3) CEAs Objections and Responses to MEMC's First Set of Interrogatories; and (4) CEAs Objections and Responses to MEMC's First Request for Production of Documents and Things by SOITEC Silicon on Insulator Technologies SA, Commissariat a L'Energie Atomique. (Attachments: # 1 Certificate of Service) (Kraft, Denise) (Entered: May 29, 2009).

Stipulation to extend date to Jun. 19, 2009 by which defendant may file an answering brief in opposition to plaintiffs' Partial Motion to Dismiss Counterclaim Counts II, III, IV, V, and VIII by MEMC Electronic Materials Inc.. (Rogowski, Patricia) (Entered: Jun. 5, 2009).

Notice of Service of MEMC's Answers to SOITEC's First Set of Interrogatories (Nos. 1-17) and MEMC's Responses to SOITEC's First Set of Requests for Production of Documents and Things (Nos. 1-132) by MEMC Electronic Materials Inc..(Rogowski, Patricia) (Entered: Jun. 5, 2009) So Ordered- re 42 Stipulation to Extend Time. Set Briefing Schedule: re 30 Motion to Dismiss. (Answering Brief due Jun. 19, 2009.). Signed by Judge Sue L. Robinson on Jun. 8, 2009. (lid) (Entered: Jun. 8, 2009).

Notice of Service of SOITEC's Second Set of Requests for Production of Documents and Things (Nos. 133-135) re 41 Notice of Service by SOITEC Silicon on Insulator Technologies SA, Commissariat a LEnergie Atomique. Related document: 41 Notice of Service filed by SOITEC Silicon on Insulator Technologies SA, Commissariat a L'Energie Atomique. (Attachments: # 1 Certificate of Service)(Kraft, Denise) (Entered: Jun. 11, 2009).

Letter to Honorable Sue L. Robinson from Patricia Smink Rogowski regarding Transmitting Form of Protective Order. (Attachments: # 1 Form of Protective Order, # 2 Exhibit Exhibit A to Form of Protective Order)(Rogowski, Patricia) (Entered: Jun. 16, 2009).

Notice of Service of MEMC's Second Request for Production of Documents and Things Directed to S.O.I.TEC Silicon on Insulator Technologies, S.A. and SOITEC USA, Inc. by MEMC Electronic Materials Inc. (Rogowski, Patricia) (Entered: Jun. 16, 2009) Set/Reset Hearings: Discovery Conference re-set per joint request of counsel for Sep. 16, 2009 08:30 AM in Courtroom 6B before Judge Sue L. Robinson. (nmf) (Entered: Jun. 18, 2009).

Stipulation to Extend Time Defendant's Answering Brief in Opposition to Plaintiffs' Partial Motion to Dismiss Counterclaim Counts II, III, IV, V, and VIII to Jul. 2, 2009—filed by MEMC Electronic Materials Inc.. (Rogowski, Patricia) (Entered: Jun. 19, 2009) So Ordered- re 47 Stipulation to Extend Time. Set Briefing Schedule: re 30 Motion to Dismiss (Answering Brief due Jul. 2, 2009.). Signed by Judge Sue L. Robinson on Jun. 23, 2009. (lid) (Entered: Jun. 23, 2009) So Ordered, re 45 Protective Order. Signed by Judge Sue L. Robinson on Jun. 30, 2009. (nmf) (Entered: Jun. 30, 2009).

Notice of by SOITEC Silicon on Insulator Technologies SA, Commissariat a L'Energie Atomique re 30 Motion to Dismiss Based upon Fed. R. Civ. P. 12(b)(1) and (6) and Article III of the United States Constitution Motion to Dismiss Based upon Fed. R. Civ. P. 12(b)(1) and (6) and Article III of the United States Constitution *Notice of Withdrawal of Plaintiffs' Partial Motion to Dismiss Counterclaim Counts II, III, IV, V, and VIII* (Attachments: # 1 Certificate of Service)(Kraft, Denise) (Entered: Jul. 2, 2009).

Notice of Service of MEMC's Responses to SOITEC's Second Set of Requests for Production of Documents and Things Directed to MEMC by MEMC Electronic Materials Inc..(Rogowski, Patricia) (Entered: Jul. 14, 2009).

Stipulation and [Proposed] Order to File an Amended Complaint by SOITEC Silicon on Insulator Technologies SA, Commissariat a LEnergie Atomique. (Attachments: # 1 Exhibit A, # 2 Certificate of Service)(Kraft, Denise) (Entered: Jul. 16, 2009).

Notice of Service of Soitec's Objections and Responses to MEMC's Second Request for Production of Documents and Things Directed to Soitec re 46 Notice of Service by SOITEC Silicon on Insulator Technologies SA, Commissariat a LEnergie Atomique. Related document: 46 Notice of Service filed by MEMC Electronic Materials Inc. (Attachments: # 1 Certificate of Service)(Kraft, Denise) (Entered: Jul. 16, 2009).

Notice of Withdrawal of Docket Entry 51 by Soitec Silicon on Insulator Technologies SA, Commissariat a L'Energie Atomique re 51 Notice of Service, (Attachments: # 1 Certificate of Service)(Kraft, Denise) (Entered: Jul. 17, 2009).

Notice of Service of SOITEC's Objections and Responses to MEMC's Second Request for Production of Documents and Things Directed to SOITEC re 46 Notice of Service by SOITEC Silicon on Insulator Technologies SA, Commissariat a L'Energie Atomique. Related document: 46 Notice of Service filed by MEMC Electronic Materials Inc.. (Attachments: # 1 Certificate of Service)(Kraft, Denise) (Entered: Jul. 17, 2009).

Notice of Service of MEMC Electronic Materials, Inc.'s Second Set of Interrogatories Directed to S.O.I.TEC Silicon on Insulator Technologies, S.A., SOITEC USA, Inc. And Commissariat a L'Energie Atomique by MEMC Electronic Materials Inc..(Rogowski, Patricia) (Entered: Jul. 17, 2009).

Notice of Service of Soitec's Production of Documents Bates Numbered SCEA 00000001 to SCEA 00002442 by SOITEC Silicon on Insulator Technologies SA, Commissariat a L'Energie Atomique. (Attachments: # 1 Certificate of Service)(Kraft, Denise) (Entered: Jul. 17, 2009) So Ordered, re 50 Stipulation. Signed by Judge Sue L. Robinson on Jul. 20, 2009. (nmf) (Entered: Jul. 20, 2009).

Notice of Service of MEMC's Production of Documents Bates Numbered MEMC0300000 to MEMC0306530 by MEMC Electronic Materials Inc. (Rogowski, Patricia) (Entered: Jul. 20, 2009).

First Amended Complaint for Patent Infringement against MEMC Electronic Materials Inc.—filed by SOITEC Silicon on Insulator Technologies SA, Commissariat a L'Energie Atomique. (Attachments: # 1 Exhibit Exhibit 1, # 2 Exhibit Exhibit 2, # 3 Exhibit Exhibit 3, # 4 Exhibit Exhibit 4, # 5 Certificate of Service)(Kraft, Denise) (Entered: Jul. 21, 2009).

Notice of Service of Soitec S.A.'s Second Set of Interrogatories (Nos. 18-22) and CEA's First Set of Interrogatories (Nos. 1-11) by SOITEC Silicon on Insulator Technologies SA, Commissariat a L'Energie Atomique. (Attachments: # 1 Certificate of Service)(Kraft, Denise) (Entered: Jul. 23, 2009).

Notice of Service of S.O.I.TEC Silicon on Insulator Technologies, S.A. and Commissariat a Lenergie Atomique Supplemental Production of Documents Bates Numbered SLIT 00000001 to SLIT 00049728 re 43 Notice of Service, by SOITEC Silicon on Insulator Technologies SA, Commissariat a LEnergie Atomique. Related document: 43 Notice of Service, filed by MEMC Electronic Materials Inc.. (Attachments: # 1 Certificate of Service)(Kraft, Denise) (Entered: Jul. 27, 2009).

Answer to Amended Complaint Answer to 57 Amended Complaint, with Under Federal Rule of Civil Procedure 38, MEMC demands a trial by jury on all issues so triable., Counterclaim against all plaintiffs by MEMC Electronic Materials Inc.. (Attachments: # 1 Exhibit A, # 2 Certificate of Service)(Rogowski, Patricia) (Entered: Aug. 3, 2009).

Notice of Service of MEMC's Production of Documents Bates Numbered MEMC0300000-MEMC0337055 by MEMC Electronic Materials Inc. (Rogowski, Patricia) (Entered: Aug. 5, 2009).

Notice of Service of S.O.I.TEC Silicon on Insulator Technologies, S.A. and Commissariat a L Energie Atomique's Revised Supplemental Production of Documents Bates Numbered SLIT00000001-SLIT0004886; SLIT00004931 SLIT0004985; SLIT00005169 SLIT00005174; SLIT00005241 SLIT00006368; and SLIT00006886—SLIT00049728 re 59 Notice of Service, by SOITEC U.S.A., Inc., SOITEC Silicon on Insulator Technologies SA, Commissariat a LEnergie Atomique. Related document: 59 Notice of Service, filed by SOITEC Silicon on Insulator Technologies SA, Commissariat a LEnergie Atomique. (Attachments: # 1 Certificate of Service)(Kraft, Denise) (Entered: Aug. 6, 2009).

Stipulation to Extend Time to Answer or Otherwise Respond to MEMC's Amended Counterclaims to Aug. 31, 2009—filed by SOITEC Silicon on Insulator Technologies SA, SOITEC U.S.A., Inc., Commissariat a L'Energie Atomique. (Attachments: # 1 Certificate of Service)(Kraft, Denise) (Entered: Aug. 25, 2009).

Notice of Service of S.O.I.TEC Silicon on Insulator Technologies, S.A. and Commissariat a L'Energie Atomique's Supplemental Production of Documents Bates Numbered SOIT 00000001 to SOIT 00003528 and SLIT 00049729 to SLIT 00060612 by SOITEC Silicon on Insulator Technologies SA, SOITEC U.S.A., Inc., Commissariat a L'Energie Atomique. (Attachments: # 1 Certificate of Service)(Kraft, Denise) (Entered: Aug. 25, 2009).

Notice of Service of MEMC's Production of Documents Bates Numbered MEMC0337056 to MEMC0337503 and MEMC0337504-MEMC0338047 by MEMC Electronic Materials Inc..(Rogowski, Patricia) (Entered: Aug. 26, 2009).

Notice of Service of (1) SOITECs Supplemental Responses to MEMC Electronic Materials, Inc's First Set of Interrogatories; and (2) CEAs Supplemental Responses to MEMC Electronic Materials, Inc.s First Set of Interrogatories re 41 Notice of Service by SOITEC Silicon on Insulator Technologies SA, SOITEC U.S.A., Inc., Commissariat a L'Energie Atomique. Related document: 41 Notice of Service filed by Soitec Silicon on Insulator Technologies SA, Commissariat a L'Energie Atomique. (Attachments: # 1 Certificate of Service)(Kraft, Denise) (Entered: Aug. 26, 2009).

Notice of Service of MEMC's Supplemental Answers to SOITEC's First Set of Interrogatories by MEMC Electronic Materials Inc.. (Rogowski, Patricia) (Entered: Aug. 27, 2009) So Ordered- re 63 Stipulation to Extend Time. Set/Reset Answer Deadlines: SOITEC Silicon on Insulator Technologies SA answer due Aug. 31, 2009; Commissariat a L'Energie Atomique answer due Aug. 31, 2009; SOITEC U.S.A., Inc. answer due Aug. 31, 2009. Signed by Judge Sue L. Robinson on Aug. 27, 2009. (lid) (Entered: Aug. 27, 2009).

Answer to 60 Answer to Amended Complaint, Counterclaim,,, Counterclaim Reply to *Defendant's Amended Counterclaims, Counterclaims and Affirmative Defenses* against MEMC Electronic Materials Inc. By SOITEC Silicon on Insulator Technologies SA, Commissariat a L'Energie Atomique, SOITEC U.S.A., Inc.. (Attachments: # 1 Certificate of Service)(Kraft, Denise) (Entered: Aug. 31, 2009).

Notice of Service of MEMC's Third Set of Interrogatories Directed to S.O.I.TEC Silicon on Insulator Technologies, S.A., SOITEC USA, Inc., and Commissariat a L'Energie Atomique by MEMC Electronic Materials Inc. (Rogowski, Patricia) (Entered: Sep. 1, 2009).

Answer to 68 Answer to Counterclaim,,, by MEMC Electronic Materials Inc..(Rogowski, Patricia) (Entered: Sep. 14, 2009). Minute Entry for proceedings held before Judge Sue L. Robinson—Discovery Conference held on Sep. 16, 2009. (Court Reporter V. Gunning.) (nmf) (Entered: Sep. 16, 2009).

Notice of Service of SOITEC S.A.'s Third Set of Interrogatories (Nos. 23-27) re 58 Notice of Service, by SOITEC Silicon on Insulator Technologies SA, SOITEC U.S.A., Inc., Commissariat a LEnergie Atomique. Related document: 58 Notice of Service, filed by SOITEC Silicon on Insulator Technologies SA, Commissariat a LEnergie Atomique. (Attachments: # 1 Certificate of Service)(Kraft, Denise) (Entered: Sep. 22, 2009).

Notice of Service of MEMC Electronic Materials Inc.'S Answers to SOITEC S.A.'S Second Set of Interrogatories (Nos. 8-22) and MEMC Electronic Materials, Inc.'S Answers to CEA'S First Set of Interrogatories (Nos. 1-11) by MEMC Electronic Materials Inc.. (Rogowski, Patricia) (Entered: Oct. 16, 2009).

Notice of Service of S.O.I.TEC Silicon on Insulator Technologies, S.A. and Commissariat a L'Energie Atomique's Supplemental Production of Documents Bates Numbered SOIT 00003529 to SOIT 00004244 by SOITEC Silicon on Insulator Technologies SA, SOITEC U.S.A., Inc., Commissariat a LEnergie Atomique. (Attachments: # 1 Certificate of Service)(Kraft, Denise) (Entered: Oct. 16, 2009).

Notice of Service of S.O.I.TEC Silicon on Insulator Technologies, S.A. and Commissariat a L'Energie Atomique's Supplemental Production of Documents Bates Numbered SOIT 00003258.001-.057; SOIT 00003342.001-.007; SOIT 00003343.001.009; (Con't)—

SOIT 00003409.001-.015; and SOIT 00003469.001-.015 by SOITEC Silicon on Insulator Technologies SA, Soitec U.S.A., Inc., Commissariat a LEnergie Atomique. (Attachments: # 1 Certificate of Service)(Kraft, Denise) (Entered: Oct. 16, 2009).
Notice of Service of SOITEC/CEA Parties' Objections and Responses to MEMC Electronic Materials, Inc.'s Second Set of Interrogatories by SOITEC Silicon on Insulator Technologies SA, Soitec U.S.A., Inc., Commissariat a LEnergie Atomique. (Attachments: # 1 Certificate of Service)(Kraft, Denise) (Entered: Oct. 16, 2009).
Notice of Service of S.O.I.TEC Silicon on Insulator Technologies, S.A. and Commissariat LEnergie Atomique Supplemental Production of Documents Bates Numbered SOIT 00004245 to SOIT 00205027 by SOITEC Silicon on Insulator Technologies SA, Soitec U.S.A., Inc., Commissariat a LEnergie Atomique. (Attachments: # 1 Certificate of Service)(Kraft, Denise) (Additional attachment(s) added on Oct. 23, 2009: # 2 revised) (lid). Modified on Oct. 23, 2009 (lid). (Entered: Oct. 16, 2009).
Motion to Bifurcate *the Issues of Willfulness and Damages for Purposes of Discovery and Trial and proposed Form of Order*—filed by MEMC Electronic Materials Inc.. (Rogowski, Patricia) (Entered: Oct. 20, 2009). Correcting Entry: Docket clerk deleted D.I. 78 (opening brief) due to document being filed improperly. Counsel is advised to re-file document using the Opening Brief event code rather than the combined opening and answering brief event code. (lid) (Entered: Oct. 21, 2009).
Opening Brief in Support re 77 Motion to Bifurcate *the Issues of Willfulness and Damages for Purposes of Discovery and Trial and proposed Form of Order* filed by MEMC Electronic Materials Inc.. Answering Brief/Response due date per Local Rules is Nov. 9, 2009. (Attachments: # 1 Exhibit A, # 2 Exhibit B, # 3 Exhibit C)(Rogowski, Patricia) (Entered: Oct. 21, 2009).
Notice of Service of MEMC's Production of Documents Bates Numbered MEMC0338048-MEMC0345027 by MEMC Electronic Materials Inc.. (Rogowski, Patricia) (Entered: Oct. 23, 2009).
Notice of Service of S.O.I.TEC Silicon on Insulator Technologies, S.A. and Commissariat a L'Energie Atomique Supplemental Production of Replacement Documents Bates Numbered SCEA 00001337 to SCEA 00001339; SCEA 00002434 to SCEA 00002439; SOIT 00007961; SOIT 00006718 to SOIT 00006727; and SOIT 00007595 to SOIT 00007598 by SOITEC Silicon on Insulator Technologies SA, SOITEC U.S.A., Inc., Commissariat a LEnergie Atomique. (Attachments: # 1 Certificate of Service)(Kraft, Denise) (Entered: Oct. 23, 2009) Correcting Entry: Pursuant to request of counsel, correct pdf of D.I. 76 has been attached and text of entry has been modified to correct bates No. (lid) (Entered: Oct. 23, 2009).
Notice of Service of of S.O.I.TEC Silicon on Insulator Technologies, S.A. and Commissariat a L'Energie Atomique's Supplemental Production of Documents Bates Numbered SOIT 00205028 to SOIT 00206175; SCEA 00002443 to SCEA 00003974; and SLIT 00060613 to SLIT 00063784 by SOITEC Silicon on Insulator Technologies SA, SOITEC U.S.A., Inc., Commissariat a LEnergie Atomique. (Attachments: # 1 Certificate of Service)(Kraft, Denise) (Entered: Oct. 28, 2009).
Notice of Service of MEMC'S Answers ToSOITEC S.A.'S Third Set of Interrogatories (Nos. 23-27) by MEMC Electronic Materials Inc.. (Rogowski, Patricia) (Entered: Oct. 28, 2009).
Notice of Service of S.O.I.TEC Silicon on Insulator Technologies, S.A. and Commissariat a L'Energie Atomique's Supplemental Production of Documents Bates Numbered SOIT 00206176 to SOIT 00206183 by SOITEC Silicon on Insulator Technologies Sa, SOITEC U.S.A., Inc., Commissariat a LEnergie Atomique. (Attachments: # 1 Certificate of Service)(Kraft, Denise) (Entered: Oct. 28, 2009).
Notice of Service of SOITEC/CEA Parties' Objections and Responses to MEMC Electronic Materials, Inc.'s Third Set of Interrogatories by SOITEC Silicon on Insulator Technologies SA, SOITEC U.S.A., Inc., Commissariat a LEnergie Atomique. (Attachments: # 1 Certificate of Service)(Kraft, Denise) (Entered: Oct. 29, 2009).
Cross Motion to Bifurcate *all Collateral Issues*—filed by SOITEC Silicon on Insulator Technologies SA, SOITEC U.S.A., Inc., Commissariat a LEnergie Atomique. (Attachments: # 1 Text of Proposed Order, # 2 Certificate of Service)(Kraft, Denise) (Entered: Nov. 9, 2009).
Answering Brief in Opposition re 85 Cross Motion to Bifurcate all Collateral Issues, 77 Motion to Bifurcate *the Issues of Willfulness and Damages for Purposes of Discovery and Trial and proposed Form of Order* filed by SOITEC Silicon on Insulator Technologies SA, Commissariat a LEnergie Atomique.Reply Brief due date per Local Rules is Nov. 20, 2009. (Attachments: # 1 Exhibit, # 2 Exhibit, # 3 Exhibit, # 4 Exhibit, # 5 Exhibit, # 6 Exhibit, # 7 Exhibit, # 8 Exhibit, # 9 Exhibit, # 10 Exhibit, # 11 Exhibit, # 12 Declaration, # 13 Certificate of Service)(Kraft, Denise) (Entered: Nov. 9, 2009).
Notice of Service of CEA's Second Set of Interrogatories (Nos. 12-16) by SOITEC Silicon on Insulator Technologies SA, SOITEC U.S.A., Inc., Commissariat a LEnergie Atomique. (Attachments: # 1 Certificate of Service)(Kraft, Denise) (Entered: Nov. 11, 2009) Correcting Entry: Pursuant to request of counsel, Exhibit A to D.I. 86 has been deleted and will be re-filed under seal by counsel at a later time (lid) (Entered: Nov. 12, 2009).
Sealed Exhibit re 86 Answering Brief in Opposition by SOITEC Silicon on Insulator Technologies SA, SOITEC U.S.A., Inc., Commissariat a LEnergie Atomique. (Attachments: # 1 Certificate of Service)(Kraft, Denise) (Entered: Nov. 12, 2009).
Reply Brief re 77 Motion to Bifurcate *the Issues of Willfulness and Damages for Purposes of Discovery and Trial and proposed Form of Order* filed by MEMC Electronic Materials Inc.. (Attachments: # 1 Exhibit 1, # 2 Exhibit 2, # 3 Exhibit 3)(Rogowski, Patricia) (Entered: Nov. 17, 2009).
Answering Brief in Opposition re 85 Cross Motion to Bifurcate *all Collateral Issues* filed by MEMC Electronic Materials Inc.. Reply Brief due date per Local Rules is Dec. 3, 2009. (Rogowski, Patricia) (Entered: Nov. 19, 2009).
Notice of Service of S.O.I.TEC Silicon on Insulator Technologies, S.A. and Commissariat a L'Energie Atomique's Supplemental Production of Documents Bates Numbered SOIT 00206184 to SOIT 00206997 by Commissariat a LEnergie Atomique, SOITEC Silicon on Insulator Technologies SA, SOITEC U.S.A., Inc.. (Attachments: # 1 Certificate of Service)(Kraft, Denise) (Entered: Nov. 23, 2009).
Notice of Service of (1) Subpoena in a Civil Case to J. William Dockrey; (2) Subpoena in a Civil Case to Allan Fanucci, Esq.; (3) Amended Notice of Videotaped Deposition of Saeed Pirooz; (4) Notice of Videotaped Deposition of Commissariat a L'Energie Atomique; and (5) Notice of Videotaped Deposition of S.O.I.TEC Silicon on Insulator Technologies, S.A. and SOITEC U.S.A., Inc. by MEMC Electronic Materials Inc..(Rogowski, Patricia) (Entered: Nov. 30, 2009).
Notice of Service of S.O.I.TEC Silicon on Insulator Technologies, S.A. and Commissariat a L'Energie Atomique's Supplemental Production of Documents Bates Numbered BHR000000001 to BHR000036157 by Commissariat a LEnergie Atomique, SOITEC Silicon on Insulator Technologies SA, SOTIEC U.S.A., Inc.. (Attachments: # 1 Certificate of Service)(Kraft, Denise) (Entered: Dec. 2, 2009).
Reply Brief re 85 Cross Motion to Bifurcate all Collateral Issues filed by Commissariat a LEnergie Atomique, SOITEC Silicon on Insulator Technologies SA, SOITEC U.S.A., Inc.. (Attachments: # 1 Exhibit Declaration of Marcus T. Hall in Support of Plaintiffs' Reply Re: Cross-Motion to Bifurcate all Collateral Issues)(Kraft, Denise) (Entered: Dec. 3, 2009).
Notice of Service of S.O.I.TEC Silicon on Insulator Technologies, S.A. and Commissariat a L'Energie Atomique's Production of Three Boxes of Wafer Samples by Commissariat a LEnergie Atomique, SOITEC Silicon on Insulator Technologies SA, SOITEC U.S.A., Inc.. (Attachments: # 1 Certificate of Service)(Kraft, Denise) (Entered: Dec. 8, 2009). Set Hearings: Discovery Conference set for Dec. 21, 2009 04:00 PM in Courtroom 6B before Judge Sue L. Robinson. (nmf) (Entered: Dec. 9, 2009).
Notice of Service of (1) Six Cartons of 300 MM Wafer Samples and 1 Carton of 200 MM Wafer Samples; (2) Documents Marked MEMC0345028-MEMC0345084; (3) Documents Marked MEMC0345085-MEMC0345133; (4) MEMC'S Answers to CEA'S Second Set of Interrogatories (Nos. 12-16); and (5) MEMC'S First Set of Requests for Admission to S.O.I.TEC Silicon on Insulator Technologies, S.A. and SOITEC USA, Inc. By MEMC Electronic Materials Inc..(Rogowski, Patricia) (Entered: Dec. 14, 2009).
Motion for Leave to File *Stipulated Motion for Leave to File a Sur-Reply Brief in Support of MEMC's Motion to Bifurcate*—filed by MEMC Electronic Materials Inc.. (Attachments: # 1 Exhibit 1)(Rogowski, Patricia) (Entered: Dec. 14, 2009).
Redacted Version of 88 Exhibit to a Document *Cross Motion to Bifurcate all Collateral Issues* by Commissariat a LEnergie Atomique, SOITEC Silicon on Insulator Technologies SA, SOITEC U.S.A., Inc.. (Kraft, Denise) (Entered: Dec. 14, 2009). So Ordered- re 97 Motion for Leave to File. Signed by Judge Sue L. Robinson on Dec. 16, 2009. (lid) (Entered: Dec. 16, 2009).
Sur-Reply Brief re 77 Motion to Bifurcate the *Issues of Willfulness and Damages for Purposes of Discovery and Trial and proposed Form of Order MEMC's Sur-Reply Brief in Support of Its Motion to Bifurcate the Issues of Willfulness and Damages for Purposes of Discovery and Trial* filed by MEMC Electronic Materials Inc.. (Rogowski, Patricia) (Entered: Dec. 16, 2009).
Notice of Service of S.O.I.TEC Silicon on Insulator Technologies, S.A. and Commissariat a L'Energie Atomique's Supplemental Production of Documents Bates Numbered SOIT 00207008 to SOIT 00207591 by SOITEC Silicon on Insulator Technologies SA, SOTIEC U.S.A., Inc.. (Attachments: # 1 Certificate of Service)(Kraft, Denise) (Entered: Dec. 17, 2009). Minute Entry for proceedings held before Judge Sue L. Robinson—Conference held on Dec. 21, 2009. (Court Reporter V. Gunning.) (nmf) (Entered: Dec. 22, 2009). Oral Order by Judge Sue L. Robinson in open court on Dec. 21, 2009 granting 77 Motion to Bifurcate the Issues of Willfulness and Damages for Purposes of Discovery and Trial and proposed Form of Order, denying 85 Cross Motion to Bifurcate all Collateral Issues. (nmf) (Entered: Dec. 22, 2009).
Notice of Service of S.O.I.TEC Silicon on Insulator Technologies, S.A. and Commissariat L'Energie Atomique's Production 12 of CD-ROM Documents Bates Numbered SOIT 00207008 to SOIT 00207591 by Commissariat a LEnergie Atomique, SOITEC Silicon on Insulator Technologies SA, SOITEC U.S.A., Inc..(Kraft, Denise) (Entered: Dec. 22, 2009).
Notice of Service of S.O.I.TEC Silicon on Insulator Technologies, S.A. and Commissariat L'Energie Atomique's Supplemental Production of Documents Bates Numbered BHR000036158 to BHR000036584, served on December 11, 2009; and S.O.I.TEC Silicon on Insulator Technologies, S.A. and Commissariat L'Energie Atomique's Supplemental Production of Documents Bates Numbered BHR000036585 to BHR000036731, served on Dec. 18, 2009 by SOITEC Silicon on Insulator Technologies SA, SOITEC U.S.A., Inc.. (Attachments: # 1 Certificate of Service)(Kraft, Denise) (Entered: Dec. 22, 2009). Correcting Entry: Pursuant to conversation docket clerk deleted Notice of filing due to document being filed improperly. Counsel will re-file document at a later time. (lid) (Entered: Jan. 4, 2010).
Notice of Service of S.O.I.TEC Silicon on Insulator Technologies, S.A. and SOITEC USA, Inc.'s Objections and Responses to MEMC's Nov. 25, 2009 Notice of 30(b)(6) Deposition of SOITEC, and Commissariat a l'Energie Atomique's Objections and Responses to MEMC's Nov. 25, 2009 Notice of 30(b)(6) Deposition of CEA by Commissariat a LEnergie Atomique, SOITEC Silicon on Insulator Technologies SA, SOITEC U.S.A., Inc.. (Attachments: # 1 Certificate of Service)(Kraft, Denise) (Entered: Jan. 4, 2010).
Stipulation to Amend Scheduling Order re 26 Scheduling Order,,, by MEMC Electronic Materials Inc.. (Rogowski, Patricia) (Entered: Jan. 6, 2010).
Notice of Service of S.O.I.TEC Silicon on Insulator Technologies, S.A. and Commissariat L'Energie Atomique's Production of Documents Bates Numbered HS0000001 to HS0000792 by Commissariat a LEnergie Atomique, SOITEC Silicon on Insulator Technologies SA, SOITEC U.S.A., Inc.. (Attachments: # 1 Certificate of Service)(Kraft, Denise) (Entered: Jan. 6, 2010).
Notice of Service of Documents Marked (1) MEMC0345134-MEMC0391283 and (2) MEMC0391284-MEMC0413109 by MEMC Electronic Materials Inc..(Rogowski, Claims Construction Opening Brief due by Jun. 18, 2010., Discovery due by Jun. 18, 2010.)(Refer to Stipulation for Further Details). Signed by Judge Sue L. Robinson on Jan. 7, 2010. (lid) (Entered: Jan. 7, 2010).

Notice of Service of S.O.I.TEC Silicon on Insulator Technologies, S.A. and SOITEC USA, Inc.'s Responses to MEMC Electronic Materials, Inc.'s First Set of Requests for Admission by Commissariat a LEnergie Atomique, SOITEC Silicon on Insulator Technologies SA, SOITEC U.S.A., Inc.. (Attachments: # 1 Certificate of Service)(Kraft, Denise) (Entered: Jan. 11, 2010).
Notice of Service of Documents Marked MEMC0413110-MEMC0459972 by MEMC Electronic Materials Inc..(Rogowski, Patricia) (Entered: Jan. 13, 2010).
Notice of Service of Notice of Videotaped Depositions of Emmanuel Huyghe, Clotilde Turleque, Christophe Maleville and Hubert Moriceau by MEMC Electronic Materials Inc..(Rogowski, Patricia) (Entered: Jan. 14, 2010).
Notice of Service of Notice of Videotaped Deposition of Norman Soloway by MEMC Electronic Materials Inc..(Rogowski, Patricia) (Entered: Jan. 14, 2010).
Notice of Service of Notice of Videotaped Depositions of (1) Emmanuel Arene, (2) Bruno Ghyselen, (3) Thierry Barge, (4) Chrystelle Legahe, (5) Konstantine Bourdelle, (6) Andre-Jacques Auberton-Herve, (7) Bernard Aspar, (8) Thierry Poumeyrol, and (9) Michel Bruel by MEMC Electronic Materials Inc..(Rogowski, Patricia) (Entered: Jan. 20, 2010).
Notice of Service of S.O.I.TEC Silicon on Insulator Technologies, S.A. and Commissariat L'Energie Atomique's Production 16 of CD-ROM Documents Bates Numbered SOIT 00207592 to SOIT 00218102 by Commissariat a LEnergie Atomique, SOITEC Silicon on Insulator Technologies SA, SOITEC U.S.A., Inc.. (Attachments: # 1 Certificate of Service)(Kraft, Denise) (Entered: Jan. 20, 2010).
Motion for Pro Hac Vice Appearance of Attorney Laura K. Carter—filed by Commissariat a LEnergie Atomique, SOITEC Silicon on Insulator Technologies SA, SOITEC U.S.A., Inc.. (Attachments: # 1 Text of Proposed Order, # 2 Certification, # 3 Certificate of Service)(Kraft, Denise) (Entered: Jan. 21, 2010). So Ordered- re 113 Motion for Pro Hac Vice Appearance of Attorney Laura K. Carter. Signed by Judge Sue L. Robinson on Jan. 26, 2010. (lid) (Entered: Jan. 26, 2010).
Notice of Service of S.O.I.TEC Silicon on Insulator Technologies, S.A. and Commissariat L'Energie Atomique's Production 17 of CD-ROM Documents Bates Numbered SOIT 00218103 to SOIT 00219113 by Commissariat a LEnergie Atomique, SOITEC Silicon on Insulator Technologies SA, SOITEC U.S.A., Inc.. (Attachments: # 1 Certificate of Service)(Kraft, Denise) (Entered: Jan. 27, 2010).
Notice of Service of S.O.I.TEC Silicon on Insulator Technologies, S.A. and Commissariat L'Energie Atomique's Production of Documents Bates Numbered SOIT 00219114 to SOIT 00219229 by Commissariat a LEnergie Atomique, SOITEC Silicon on Insulator Technologies SA, SOITEC U.S.A., Inc.. (Attachments: # 1 Certificate of Service)(Kraft, Denise) (Entered: Jan. 27, 2010).
Notice of Service of Documents Marked (1) MEMC0459973-MEMC-0526213; (2) MEMC0526214-MEMC-0526273; and (3) MEMC0484547-MEMC0526213 by MEMC Electronic Materials Inc..(Rogowski, Patricia) (Entered: Jan. 29, 2010).
Notice of Service of Six DVDs Containing Documents Marked MEMC0526274-MEMC0582949 by MEMC Electronic Materials Inc..(Rogowski, Patricia) (Entered: Feb. 2, 2010).
Notice of Service of Documents Marked MEMC0582950-MEMC0618792 by MEMC Electronic Materials Inc..(Rogowski, Patricia) (Entered: Feb. 8, 2010).
Notice of Service of Documents Marked (1) MEMC0618793-MEMC0697890 and (2) MEMC0697891-MEMC0715676 by Memc Electronic Materials Inc..(Rogowski, Patricia) (Entered: Feb. 12, 2010).
Notice of Service of Documents Marked MEMC0715677-MEMC0772697 by MEMC Electronic Materials Inc..(Rogowski, Patricia) (Entered: Feb. 18, 2010).
Notice of Service of Notice of Videotaped Deposition by MEMC Electronic Materials Inc..(Rogowski, Patricia) (Entered: Feb. 19, 2010).
Notice of Service of S.O.I.TEC Silicon on Insulator Technologies, S.A. and Commissariat Lnergie Atomiques Production 19 of CD-ROM Documents Bates Numbered SOIT 00219230-SOIT 00242462, SOIT 00242514-SOIT 00271070, SOIT 00271093-SOIT 00277765, SOIT 00277802-SOIT 00280854 by Commissariat a LEnergie Atomique, SOITEC Silicon on Insulator Technologies SA, SOITEC U.S.A., Inc.. (Attachments: # 1 Certificate of Service)(Kraft, Denise) (Entered: Mar. 2, 2010).
Notice of Service of S.O.I.TEC Silicon on Insulator Technologies, S.A. and Commissariat Lnergie Atomiques Production 20 of CD-ROM Documents Bates Numbered SOIT 00280855-SOIT 00310785 by Commissariat a LEnergie Atomique, SOITEC Silicon on Insulator Technologies SA, SOITEC U.S.A., Inc.. (Attachments: # 1 Certificate of Service)(Kraft, Denise) (Entered: Mar. 2, 2010).
Notice of Service of S.O.I.TEC Silicon on Insulator Technologies, S.A. and Commissariat Lnergie Atomiques Production 21 of CD-ROM Documents Bates Numbered SCEA 00003975-SCEA 00004146 and SOIT 00310786-SOIT 00336534 by Commissariat a LEnergie Atomique, SOITEC Silicon on Insulator Technologies SA, SOITEC U.S.A., Inc.. (Attachments: # 1 Certificate of Service)(Kraft, Denise) (Entered: Mar. 2, 2010).
Notice of Service of S.O.I.TEC Silicon on Insulator Technologies, S.A. and Commissariat Lnergie Atomiques Production 22 of CD-ROM Documents Bates Numbered SCEA 00004147-SCEA 00031465 and SOIT 00336535-SOIT 00355547 and SOIT 00355554-SOIT 00359693 by Commissariat a LEnergie Atomique, SOITEC Silicon on Insulator Technologies SA, SOITEC U.S.A., Inc.. (Attachments: # 1 Certificate of Service)(Kraft, Denise) (Entered: Mar. 2, 2010).
Notice of Service of S.O.I.TEC Silicon on Insulator Technologies, S.A.'s Fourth Set of Interrogatories (Nos. 28-29) Directed to MEMC Electronic Materials, Inc. by Commissariat a LEnergie Atomique, SOITEC Silicon on Insulator Technologies SA, SOITEC U.S.A., Inc.. (Attachments: # 1 Certificate of Service)(Kraft, Denise) (Additional attachment(s) added on Mar. 24, 2010: # 1 Certificate of Service) (fms). (Entered: Mar. 3, 2010).
Stipulation to Amend Scheduling Order re 26 Scheduling Order,,, by MEMC (Rogowski, Patricia) (Entered: Mar. 12, 2010). So Ordered-Stiplation to Amend Scheduling Order. Order- re 127 Setting Scheduling Order Deadlines ( Claims Construction Opening Brief due by Jun. 18, 2010., Discovery due Sue L. Robinson on Mar. 15, 2010. (lid) (Entered: Mar. 15, 2010).
Notice of Service of (1) MEMC Electronic Materials, Inc.'s Second Set of Requests for Admission Directed to Plaintiffs and (2) MEMC Electronic Materials, Inc.'s Fourth Set of Interrogatories Directed to S.O.I.TEC Silicon on Insulator Technologies, S.A., SOITEC USA, Inc. and Commissariat a L'Energie Atomique by MEMC Electronic Materials Inc..(Rogowski, Patricia) (Entered: Mar. 23, 2010). Correcting Entry: Per request of counsel, the pdf attached to D.I. 126 (Notice of Service of S.O.I.TEC Silicon on Insulator Technologies, S.A.'s Fourth Set of Interrogatories (Nos. 28-29) Directed to MEMC Electronic Materials, Inc. by Commissariat a LEnergie Atomique, SOITEC Silicon on Insulator Technologies SA, SOITEC U.S.A., Inc.) has been deleted and replaced with the proper attachment with the correct date. (fms) (Entered: Mar. 24, 2010). Correcting Entry: Per request of counsel, D.I. 129 has been deleted and will be re-filed at a later time. (lid) (Entered: Mar. 29, 2010).
Notice of Service of S.O.I.TEC Silicon on Insulator Technologies, S.A.'s Production 23 Bates Numbered SOIT 00359694 and SOIT 00359695, including Wafer Samples by Soitec Silicon on Insulator Technologies SA. (Attachments: # 1 Certificate of Service)(Kraft, Denise) (Entered: Mar. 29, 2010).
Notice of Service of S.O.I.TEC Silicon on Insulator Technologies, S.A.'s Production 24 of CD-ROM Documents Bates Numbered SOIT 00359696-SOIT 00419315 by SOITEC Silicon on Insulator Technologies SA. (Attachments: # 1 Certificate of Service)(Kraft, Denise) (Entered: Apr. 1, 2010).
Notice of Service of Electronic Production of OCR Text Files related to: (1) S.O.I.TEC Silicon on Insulator Technologies, S.A.'s Production 19 Bates Numbered SOIT 0021923-SOIT 00242462; SOIT 00242514-SOIT 00271070; SOIT 00271093-SOIT 00277765; SOIT 00277802-SOIT 00280854; (2) S.O.I.TEC Silicon on Insulator Technologies, S.A.'s Production 20 Bates Numbered SOIT 00280855-SOIT 00310785; and (3) S.O.I.TEC Silicon on Insulator Technologies, S.A. and Commissariat a L'Energie Atomique's Production 22 Bates Numbered SCEA 00004147-SCEA 00031465; SOIT 00336535-SOIT 00355547; and SOIT 00355554-SOIT 00359693 by Commissariat a LEnergie Atomique, SOITEC Silicon on Insulator Technologies SA. (Attachments: # 1 Certificate of Service)(Kraft, Denise) (Entered: Apr. 7, 2010).
Notice of Service of (1) Documents marked MEMC0772698-MEMC0775891; (2) Documents marked CRAV00000001-CRAV00000098; and (3) Document marked MEMC0775892 by MEMC Electronic Materials Inc..(Rogowski, Patricia) (Entered: Apr. 7, 2010).
Notice of Service of MEMC Electronic Materials, Inc.'S Supplemental Answer to CEA'S First Set of Interrogatories, MEMC'S Answers to SOITEC S.A.'S Fourth Set of Interrogatories (Nos. 28-29), and MEMC'S Supplemental Answers to Soitec S.A.'S Third Set of Interrogatories (No. 23) by MEMC Electronic Materials Inc.. (Rogowski, Patricia) (Entered: Apr. 7, 2010). Set Hearings: Discovery Conference set for Apr. 23, 2010 09:30 AM in Courtroom 6B before Judge Sue L. Robinson. (nmf) (Entered: Apr. 21, 2010).
Notice of Service of S.O.I.TEC Silicon on Insulator Technologies, S.A.'s Production of Documents Bates Numbered SOIT 00419316 (updated from previously produced documents Bates numbered SOIT 00000159-SOIT 00000161) by SOITEC Silicon on Insulator Technologies SA. (Attachments: # 1 Certificate of Service)(Kraft, Denise) (Entered: Apr. 22, 2010). Minute Entry for proceedings held before Judge Sue L. Robinson—Discovery Conference held on Apr. 23, 2010. (Court Reporter V. Gunning.) (nmf) (Entered: Apr. 23, 2010).
Notice of Service of S.O.I.TEC Silicon on Insulator Technologies, S.A. and Commissariat a L'Energie Atomique's electronic production of: (1) Production #25 Bates Numbered SCEA00031466-SCEA00032999; SOIT00419316-SOIT00422470; and SOIT00422478-SOIT00461551; (2) Production #26 Bates Numbered SCEA00033000-SCEA00165680; SCEA00165686-SCEA00167229; SCEA00167232-SCEA00167288; and SOIT00461552-SOIT00474611; and (3) Production #27 Bates Numbered SCEA00167289-SCEA00167291; and SOIT00474611-SOIT00476375 by Commissariat a LEnergie Atomique, Soitec Silicon on Insulator Technologies Sa. (Attachments: # 1 Certificate of Service)(Kraft, Denise) (Entered: Apr. 29, 2010).
Notice of Service of Commissariat a L'Energie Atomique's Production #28 of CD-ROM Documents Bates Numbered SCEA00167292-SCEA00167308 by Commissariat a LEnergie Atomique. (Attachments: # 1 Certificate of Service)(Kraft, Denise) (Entered: Apr. 29, 2010).
Notice of Service of (1) Notice of Videotaped Deposition (Michael Bruel) and (2) Notice of Videotaped Deposition (S.O.I.TEC Silicon on Insulator Technologies, S.A. and SOITEC USA, Inc.) by MEMC Electronic Materials Inc..(Rogowski, Patricia) (Entered: May 3, 2010).
Notice of Service of (1) DVD Containing Video Marked CRAV00000099; (2) CD Containing Documents Marked MEMC0775893-MEMC0775948; (3) CD Containing Documents Marked MEMC0775949-MEMC0775954; and (4) DVD Containing Documents Marked MEMC0775955-MEMC0781961 by MEMC Electronic Materials Inc.. (Rogowski, Patricia) (Entered: May 3, 2010).
Notice of Service of Commissariat a L'Energie Atomique's Production #29 of Cd-Rom Documents Bates Numbered SCEA 00167309-SCEA 00167315 by Commissariat a LEnergie Atomique. (Attachments: # 1 Certificate of Service)(Kraft, Denise) (Entered: May 3, 2010).
Notice of Service SOITEC USA, Inc., and Fourth Set of Interrogatories; S.A., and Commissariat of Requests for Admissions Atomique, SOITEC Silicon Related document: 128 of (1) S.O.I.TEC Commissariat and (2) a L'Energie re 128 Silicon on Insulator Technologies, S.A., a L'Energie Atomique's Responses to MEMC's S.O.I.TEC Silicon on Insulator Technologies, Atomique's Responses to MEMC's Second Set Notice of Service, by Commissariat a LEnergie Technologies SA, SOITEC U.S.A., Inc.. filed by MEMC Electronic Materials Inc.. Denise) (Entered: May 4, 2010). Reset joint request of counsel for Sep. 3, 2010 09:30 AM in Robinson. (nmf) (Entered: May 5, 2010) of Service).
Motion for Discovery Motion for the Admission of the Expert Testimony of John T. Goolkasian Relating to the Certificate of Correction for U.S. Patent No. 7,067,396—filed by MEMC Electronic Materials Inc.. (Rogowski, Patricia) (Entered: May 7, 2010).
Opening Brief in Support re 141 Motion for Discovery Motion for the Relating Admission of the Expert Testimony of John T. Goolkasian Relating to the Certificate of Correction for U.S. Patent No. 7,067,396 filed by MEMC Electronic Materials Inc..Answering Brief/Response due date per Local Rules to the Certificate is May 24, 2010. (Attachments: # 1 Exhibit 1, # 2 Exhibit 2, # 3 Exhibit # 3, # 4 Exhibit 4, # 5 Exhibit 5, # 6 Exhibit 6, 7 # Exhibit 7, # 8 Exhibit 8, # 9 Exhibit 9, # 12, # 13 Exhibit 13, # 14 Exhibit 14, # 15) (Rogowski, Patricia) (Entered: May 7, 2010).
Notice of Service of CD-ROM including re-submittal of documents Bates numbered SOIT 00310798-00336526 as Document Bates numbered SOIT 00310798 in native format by SOITEC Silicon on Insulator Technologies SA. (Attachments: # 1 Certificate of Service)(Kraft, Denise) (Entered: May 20, 2010).
Notice of Service of Amended Notices of Videotaped Deposition of (1) Dr. Bernard Aspar and (2) Dr. Michel Bruel by MEMC Electronic Materials Inc..(Rogowski, Patricia) (Entered: May 21, 2010).
Answering Brief in Opposition re 141 Motion for Discovery Motion for the Admission of Expert Testimony of John T. Goolkasian Relating to the Certificate of Correction for U.S. Patent No. 7,067,396 Plaintiff's Answering Brief in Opposition to Defendant's Motion for the Admission of Expert Testimony of John T. Goolkasian filed by SOITEC Silicon on Insulator Technologies SA.Reply Brief due date per Local Rules is Jun. 4, 2010. (Attachments: # 1 Certificate of Service)(Kraft, Denise) (Entered: May 24, 2010).
Declaration re 145 Answering Brief in Opposition,,, Declaration of Marcus T. Hall.Brief in Opposition to Defendant's Motion for the Admission of Expert Testimony of John T. Goolkasian by SOITEC Silicon on Insulator Technologies SA. (Attachments: # 1 Exhibit A, # 2 Exhibit B, # 3 Exhibit C, # 4 Exhibit D, # 5 Exhibit E, # 6 Exhibit F, # 7 Exhibit G, # 8 Exhibit H, # 9 Exhibit I, # 10 Exhibit J, # 11 Exhibit K, # 12 Exhibit L, # 13 Exhibit M, # 14 Exhibit N, # 15 Certificate of Service)(Kraft, Denise) (Entered: May 24, 2010).
Letter to the Honorable Sue L. Robinson from Denise Seastone Kraft, Esq. regarding [Proposed] Third Stipulation to Amend Scheduling Order—re 26 Scheduling Order,,,. (Attachments: # 1 Text of Proposed Order)(Kraft, Denise) (Entered: May 25, 2010). Correcting Entry: Stipulation attached to D.I. 147 has been deleted due to document being filed improperly. Counsel is advised to re-file document using the Stipulation event code (lid) (Entered: May 25, 2010).
Letter to the Honorable Sue L. Robinson from Denise Seastone Kraft, Esq. regarding [Proposed] Third Stipulation to Amend Scheduling Order—re 26 Scheduling Order,,,. (Attachments: # 1 Text of Proposed Order)(Kraft, Denise) (Entered: May 25, 2010). Correcting Entry: Stipulation attached to D.I. 147 has been deleted due to document being filed improperly. Counsel is advised to re-file document using the Stipulation event code (lid) (Entered: May 25, 2010). So Ordered re 148 to Amend Schemduling Order. Order- Setting Scheduling Order Deadlines ( Claims Constructive Opening Brief due by Jun. 25, 2010., Discovery due by Jul. 30, 2010., Dispositive Motions due by Jul. 2, 2010., Answering Brief due Jul. 16, 2010., Reply Brief due Jul. 30, 2010.). Signed by Judge Sue L. Robinson on May 26, 2010. (lid) (Entered: May 26, 2010).
Notice of Service of Expert Reports of (1) Peter Moran, (2) John T. Goolkasian, (3) Robert Averback, and (4) Pascal Belton by MEMC Electronic Materials Inc.. (Rogowski, Patricia) (Entered: Jun. 2, 2010).
Notice of Service of S.O.I.TEC Silicon on Insulator Technologies, S.A.'s Production 31 of CD-ROM Documents Bates Numbered SOIT 00476382 to SOIT 00476394 by SOITEC Silicon on Insulator Technologies SA. (Attachments: # 1 Certificate of Service)(Kraft, Denise) (Entered: Jun. 2, 2010).
Notice of Service of (1) Expert Report of Andrew Hirt; (2) Expert Report of John Bravman regarding Invalidity of United States Patent No. 5,834,812; and (3) Expert Report of John Bravman regarding Infringement by Defendant Memc by Commissariat a LEnergie Atomique, SOITEC Silicon on Insulator Technologies SA, SOITEC U.S.A., Inc.. (Attachments: # 1 Certificate of Service)(Kraft, Denise) (Entered: Jun. 2, 2010).
Reply Brief in Support of 141 Motion for Discovery Motion for the Admission of the Expert Testimony of John T. Goolkasian Relating to the Certificate of Correction for U.S. Patent No. 7,067,396 filed by MEMC Electronic Materials Inc.. Attachments: # 1 Exhibit 1, # 2 Exhibit 2, # 3 Exhibit 3, # 4 Exhibit 4, # 5 Exhibit 5, # 6 Exhibit 6)(Rogowski, Patricia) Modified on Jun. 4, 2010 (lid). (Entered: Jun. 4, 2010).
Notice of Service of S.O.I.TEC Silicon on Insulator Technologies, S.A.'s Production 32 of CD-ROM Documents Bates Numbered SOIT 00476395 to SOIT 00476441 by SOIT Silicon on Insulator Technologies SA. (Attachments: # 1 Certificate of Service)(Kraft, Denise) (Entered: Jun. 7, 2010).
Statement re 148 Stipulation *Joint Claim Construction Statement* by Commissariat A LEnergie Atomique, SOITEC Silicon on Insulator Technologies SA, SOITEC U.S.A., Certificate of Service)(Kraft, Denise) (Entered: Jun. 14, 2010).
Claim Construction Chart by Commissariat a LEnergie Atomique, SOITEC Silicon on Insulator Technologies SA, SOTIEC U.S.A., Inc.. (Attachments: # 1 Certificate of Service)(Kraft, Denise) (Entered: Jun. 14, 2010).
Notice of Service of (1) S.O.I.TEC Silicon on Insulator Technologies, S.A.'s Production 33 of CD-ROM Documents Bates Numbered SOIT 00476442 to SOIT 00476456; and (2) S.O.I.TEC Silicon on Insulator Technologies, S.A.'s Production 33 Supplement including CD-ROM Documents bates Number SOIT 00476442 to SOIT 00476456 (duplicates of Production 33) and SOIT 00476457 (Burg Translations, Inc. Certification) by SOTIEC Silicon on Insulator Technologies SA. (Attachments: # 1 Certificate of Service)(Kraft, Denise) (Entered: Jun. 15, 2010).
Sur-Reply Brief re of 141 Motion for Discovery Motion for the Admission John T. Goolkasian Relating to the Certificate of Correction for U.S. Patent No. 7,067,396 *Surreply by Plaintiffs to Motion by Defendant for The Admission of Testimony of John T. Goolkasian* filed by SOITEC Silicon on Insulator Technologies SA. (Attachments: # 1 Certificate of Service)(Kraft, Denise) (Entered: Jun. 15, 2010).
Declaration re 157 Sur-Reply Brief, *Declaration of Marcus T. Hall in Support of Surreply by Plaintiffs Motion by Defendant for the Admission of Expert Testimony of John T. Goolkasian* by SOITEC Silicon on Insulator Technologies SA. (Attachments: # 1 Exhibit A, # 2 Exhibit B, # 3 Exhibit C, # 4 Exhibit D, # 5 Certificate of Service)(Kraft, Denise) (Entered: Jun. 15, 2010).
Notice of Service of Videotaped Depositions for Dr. John C. Bravman and Andrew M. Hirt by MEMC Electronic Materials Inc. (Rogowski, Patricia) (Entered: Jun. 18, 2010).
Stipulation Stipulated Motion for Leave Under Delaware L.R. 7.1.3 by MEMC Electronic Materials Inc.. (Rogowski, Patricia) (Entered: Jun. 21, 2010); So Ordered- 160 Stipulated Motion for Leave Under Delaware to Exceed Page Limit. Signed by Judge Sue L. Robinson on Jun. 22, 2010. (lid) (Entered: Jun. 22, 2010).
Notice of Service of (1) Rebuttal Expert Report of Robert Averback; (2) Report on Characterization of SI Wafers by Transmission Electron Microscopy (Pascal Bellon); and (3) Rebuttal Expert Report of Peter Moran by MEMC Electronic Materials Inc.. (Rogowski, Patricia) (Entered: Jun. 22, 2010).
Notice of Service of Supplemental Expert Report of Peter Moran by MEMC Electronic Materials Inc..(Rogowski, Patricia) (Entered: Jun. 22, 2010).
Notice of Service of Documents Marked MEMC0781986-MEMC0782012 by MEMC Electronic Materials Inc..(Rogowski, Patricia) (Entered: Jun. 23, 2010).
Notice of Service of S.O.I.TEC Silicon on Insulator Technologies, S.A. and Commissariat a L'Energie Atomique's: (1) Notice of Deposition of Dr. Peter Moran; (2) Notice of Deposition of Dr. Robert Averback; and (3) Notice of Deposition of Dr. Pascal Belton by Commissariat a LEnergie Atomique, SOITEC Silicon on Insulator Technologies SA. (Attachments: # 1 Certificate of Service)(Kraft, Denise) (Entered: Jun. 24, 2010).
Notice of Service of S.O.I.TEC Silicon on Insulator Technologies, S.A. and Commissariat a L'Energie Atomique's List of Fact Witnesses by Commissariat a LEnergie Atomique, SOITEC Silicon on Insulator Technologies SA. (Attachments: # 1 Certificate of Service)(Kraft, Denise) (Entered: Jun. 24, 2010).
Notice of Service of S.O.I.TEC Silicon on Insulator Technologies, S.A. and Commissariat a L'Energie Atomique's: (1) Supplemental Expert Report of Andrew M. Hirt; and (2) Expert Report of John C. Bravman Regarding Non-infringement of U.S. Patent No. 5,834,812 by Commissariat a LEnergie Atomique, SOITEC Silicon on Insulator Technologies SA. (Attachments: # 1 Certificate of Service)(Kraft, Denise) (Entered: Jun. 24, 2010).

Claim Construction Opening Brief filed by MEMC Electronic Materials Inc.. (Attachments: # 1 Appendix DA0001-DA0006, # 2 Appendix DA0007-DA0032, # 3 Appendix DA0033-DA0072, # 4 Appendix DA0073-DA0112, # 5 Appendix DA0113- DA0152, # 6 Appendix DA0153-DA0192, # 7 Appendix DA0193-DA0232, # 8 Appendix DA0233-DA0272, # 9 Appendix DA0273-DA0312, # 10 Appendix DA0313- DA0352, # 11 Appendix DA0353-DA0392, # 12 Appendix DA0393-DA0432, # 13 Appendix DA0433-DA0472, # 14 Appendix DA0473-DA0512, # 15 Appendix DA0513- DA0521, # 16 Appendix DA0522-DA0545, # 17 Appendix Sealed—DA0546-DA0551, # 18 Appendix DA0552-DA0563, # 19 Appendix Sealed—DA0564-DA0566, # 20 Appendix DA0567-DA0573, # 21 Appendix Sealed—DA0574-DA0599, # 22 Appendix DA0600-DA0604, # 23 Appendix DA0605-DA0609, # 24 Appendix DA0610-DA0625, # 25 Appendix DA0626-0634, # 26 Appendix DA0635, # 27 Appendix DA0636-DA0652, # 28 Appendix Sealed—DA0653-DA0657, # 29 Appendix DA0658-DA0667, # 30 Appendix DA0668-DA0670, # 31 Appendix DA0671-DA0678, # 32 Appendix DA0679-DA0687, # 33 Appendix DA0688-DA0696, # 34 Appendix Sealed—DA0697-DA0705, # 35 Appendix Sealed—DA0706-DA0711, # 36 Appendix Sealed—DA0712-DA0714, # 37 Appendix DA0715-DA0717, # 38 Appendix DA0718-DA0719, # 39 Appendix DA0720-DA0722, # 40 Appendix DA0723-DA0732, # 41 Appendix DA0733-DA0740, # 42 Appendix DA0741-DA0749, # 43 Appendix DA0750-DA0769, # 44 Appendix DA0770-DA0781)(Rogowski, Patricia) (Entered: Jun. 25, 2010).

Claim Construction Opening Brief *Plaintiffs S.O.I.TEC Silicon on Insulator Technologies, S.A. and Commissariat a L'Energie Atomique's Opening Claim Construction Brief* filed by Commissariat a LEnergie Atomique, SOITEC Silicon on Insulator Technologies SA. (Attachments: # 1 Certificate of Service)(Kraft, Denise) (Entered: Jun. 25, 2010).

Declaration re 168 Claim Construction Opening Brief, *Declaration of Marcus T. Hall In Support of Plaintiffs S.O.I. TEC Silicon on Insulator Technologies, S.A. and Commissariat a L'Energie Atomique's Opening Claim Construction Brief* by Commissariat a LEnergie Atomique, SOITEC Silicon on Insulator Technologies SA. (Attachments: # 1 Certificate of Service)(Kraft, Denise) (Entered: Jun. 25, 2010).

Sealed Exhibit re 169 Declaration, Exhibit A (Filed Under Seal) to Declaration of Marcus T. Hall in Support of Plaintiffs S.O.I.TEC Silicon on Insulator Technologies, S.A. Atomique's Opening Claim Construction Brief by SOITEC Silicon on Insulator Technologies SA. and Commissariat a L'Energie Commissariat a LEnergie Atomique, (Attachments: # 1 Certificate of Service)(Kraft, Denise) (Entered: Jun. 25, 2010)

Sealed Exhibit re 169 Declaration, Exhibit B (Filed Under Seal) to Declaration of Marcus T. Hall in Support of Plaintiffs S.O.I.TEC Silicon on Insulator Technologies, S.A. and Commissariat a L'Energie Atomique's Opening Claim Construction Brief by Commissariat a LEnergie Atomique, SOITEC Silicon on Insulator Technologies SA. (Attachments: # 1 Certificate of Service)(Kraft, Denise) (Entered: Jun. 25, 2010).

Sealed Exhibit re 169 Declaration, Exhibit C (Filed Under Seal) to Declaration of Marcus T. Hall in Support of Plaintiffs S.O.I.TEC Silicon on Insulator Technologies, S.A. and Commissariat a L'Energie Atomique's Opening Claim Construction Brief by Commissariat a LEnergie Atomique, SOITEC Silicon on Insulator Technologies SA. (Attachments: # 1 Certificate of Service)(Kraft, Denise) (Entered: Jun. 25, 2010).

Notice of filing the following document(s) in paper format: Joint Appendix of Exhibits to Opening and Answering Claim Construction Briefs (1) vol. I-JA0001 to JA0533; (2) vol. II-JA0534 to JA0930; (3) vol. III-JA0931 to JA1502; (4) vol. IV-JA1503 to JA1510 (Filed Under Seal); (5) vol. V-JA1511 to JA2089; and (6) vol. VI-JA2090 to JA2557. Original document(s) to be filed with the Clerk's Office. Notice filed by Denise Seastone Kraft on behalf of Commissariat a LEnergie Atomique, SOITEC Silicon on Insulator Technologies SA (Attachments: # 1 Certificate of Service)(Kraft, Denise) (Entered: Jun. 25, 2010); Correcting Entry: Docket clerk deleted appendices to D.I. 167 due to documents being filed improperly. Counsel is advised to re-file appendices separately using the Appendix event code. Counsel is also advised that sealed documents may not be filed with public view documents. (lid) (Entered: Jun. 28, 2010).

(Document too large to file in pdf format, will file at later date by Express Mail). Construction Opening Brief,,,,,, by MEMC Electronic # 1 Appendix DA-0001-DA-0006, # 2 Appendix DA-DA-0033-DA-0072, # 4 Appendix DA-0073-DA-0112, DA-0152, # 6 Appendix DA-0153-DA-0192, # 7 Appendix Appendix DA-0233-DA-0272, # 9 Appendix DA-0273-D—DA-0352, # 11 Appendix DA-0353-DA-0392, # 12 # 13 Appendix DA-0433-DA-0472, # 14 Appendix DA-DA-0513-DA-0521)(Rogowski, Patricia) (Entered: Jun. 28, 2010).

Sealed Appendix re 167 Claim Construction Opening Brief,,,,,, by MEMC Electronics Materials Inc.. (Rogowski, Patricia) (Entered: Jun. 28, 2010).

Notice of Service of S.O.I.TEC Silicon on Insulator Technologies, S.A. and Commissariat a L'Energie Atomique's Production 34 of CD-ROM Documents Bates Numbered SOIT 00476458 to SOIT 00476602 by SOITEC Silicon on Insulator Technologies SA. (Attachments: # 1 Certificate of Service)(Kraft, Denise) (Entered: Jun. 28, 2010).

By Memo Electronic Materials Inc.. # 2 Appendix DA0546-DA0551, # 3 DA0564-DA0566, # 5 Appendix DA0567- # 7 Appendix DA0600-DA0604, # 8 DA0610-DA0625, # 10 Appendix DA0626-12 Appendix DA0636-DA0652, # 13 Appendix # 15 Appendix DA0668-DA0670, # Appendix DA0679-DA0687, # 18 Appendix # 20 Appendix DA0706-Da-0711, 22 Appendix DA0715-DA0717, # 23 Appendix # 25 Appendix DA0723-DA0732, # Appendix DA0741-DA0749, # 28 Appendix # 30 Certificate of Jun. 28, 2010) DA0522-DA0545, # 4 Appendix # 9 Appendix Appendix DA0658-DA0667, Appendix DA0697-DA0705, Appendix DA0720-DA0722, Appendix DA0770-DA0781, DA0574-DA0599, DA0635, # # 17 # # 27 (Entered:.

(Document too large to file in pdf format, will file at later date by Express Mail). Notice of filing the following document(s) in paper format: Joint Appendix of Exhibits to Opening and Answering Claim Construction Briefs (1) vol. I-JA0001 to JA0533. Appendix vol. I. re 173 Notice of Filing Paper Documents(Oversided Document, Item on File in the Clerks Office). (lid) (Entered: Jun. 28, 2010).

(Document too large to file in pdf format, will file at later date by Express Mail). Notice of filing the following document(s) in paper format: Joint Appendix of Exhibits to Opening and Answering Claim Construction Briefs (2) vol. II-JA0534 to JA0930. Appendix vol. II. re 173 Notice of Filing Paper Documents(Oversized Document, Item on File in the Clerks Office). (lid) (Entered: Jun. 28, 2010).

(Document too large to file in pdf format, will file at later date by Express Mail). Notice of filing the following document(s) in paper format: Joint Appendix of Exhibits to Opening and Answering Claim Construction Briefs (3) vol. III-JA0931 to JA1502. Appendix vol. III. re 173 Notice of Filing Paper Documents(Oversided Document, Item on File in the Clerks Office) (lid) (Entered: Jun. 28, 2010).

(Document too large to file in pdf format, will file at later date by Express Mail). Notice of filing the following document(s) in paper format: Joint Appendix of Exhibits to Opening and Answering Claim Construction Briefs (4) vol. IVJA1503 to JA1510. Appendix vol. IV. re 173 Notice of Filing Paper Documents(Oversided Document, Item on File in the Clerks Office). (lid) (Entered: Jun. 28, 2010).

(Document too large to file in pdf format, will file at later date by Express Mail). Notice of filing the following document(s) in paper format: Joint Appendix of Exhibits to Opening and Answering Claim Construction Briefs (5) vol. V-JA1511 to JA2089.

(Document too large to file in pdf format, will file at later date by Express Mail). vol. VI-A2090 to JA2557. Original document(s) to be filed with the Clerk's Office. Notice filed by Denise Seastone Kraft on behalf of Commissariat a LEnergie Atomique, SOITEC Silicon on Insulator Technologies SA (Attachments: # 1 Certificate of Service)(Kraft, Denise) (Entered: Jun. 25, 2010).

Sealed Appendix re 168 Claim Construction Brief, *Joint Appendix of Exhibits to Opening and Answering Claim Construction Briefs* vol. IV of VI—Filed Under Seal by Commissariat a LEnergie Atomique, SOITEC Silicon on Insulator Technologies SA. (Attachments: # 1 Certificate of Service)(Kraft, Denise) (Entered: Jun. 28, 2010).
Notice of Service of S.O.I.TEC Silicon on Insulator Technologies, S.A.'s and Commissariat a L'Energie Atomique's List of Rebuttal Fact Witnesses by Commissariat a LEnergie Atomique, SOITEC Silicon on Insulator Technologies SA. (Attachments: # 1 Certificate of Service)(Kraft, Denise) (Entered: Jun. 30, 2010).
Notice of Service of Amended Notice of Videotaped Deposition of Dr. John C. Bravman by MEMC Electronic Materials Inc.. (Rogowski, Patricia) (Entered: Jun. 30, 2010).
Motion in Limine *SOITEC/CEA Parties' Motion to Exclude the Expert Report of Dr. Pascal Bellon and Any Related Testimony*—filed by Commissariat a LEnergie Atomique, SOITEC Silicon on Insulator Technologies SA. (Attachments: # 1 Text of Proposed Order, # 2 Certificate of Service)(Kraft, Denise) (Entered: Jul. 2, 2010).
Motion for Partial Summary Judgment of *Invalidity of the Asserted Aspar Patent Claims*—filed by MEMC Electronic Materials Inc.. (Attachments: # 1 Text of Proposed Order, # 2 Certificate of Service)(Rogowski, Patricia) (Entered: Jul. 2, 2010).
Opening Brief in Support re 186 Motion in Limine *SOITEC/CEA Parties' Motion to Exclude the Expert Report of Dr. Pascal Bellon and Any Related Testimony* filed by Commissariat a LEnergie Atomique SOITEC Silicon on Insulator Technologies SA. Answering Brief/Response due date per Local Rules is Jul. 19, 2010. (Attachments: # 1 Certificate of Service) Kraft, Denise) (Entered: Jul. 2, 2010).
Opening Brief in Support re 187 Motion for Partial Summary Judgment *of Invalidity of the Asserted Aspar Patent Claims* filed by MEMC Electronic Materials Inc.. Answering Brief/Response due date per Local Rules is Jul. 19, 2010. (Rogowski, Patricia) (Entered Jul. 2, 2010.
Sealed Appendix re Inc.. (Attachments: # 1 Patricia) (Entered: Jul. 02, 2010) 189 Opening Brief in Support, by Memc Electronic Materials.
Appendix re 186 Motion in Limine *SOITEC/CEA Parties' Motion to Exclude the Expert Report of Dr. Pascal Belton and Any Related Testimony Plaintiffs' Omnibus Appendix to Daubert Motion and Motions for Partial Summary Judgment* Filed on Jul 2, 2010 by Commissariat a LEnergie Atomique, SOITEC Silicon on Insulator Technologies SA. (Attachments: # 1 Appendix vol. II of XIX, # 2 Appendix vol. III of XIX, # 3 Appendix vol. IV XIX, # 4 Appendix vol. V of XIX, # 5 Appendix vol. VII of XIX, # 6 Appendix vol. IX of XIX,# 7 Appendix vol. XI of XIX, # 8 Appendix vol. XII of XIX, # 9 Appendix vol. XIII of XIX, # 10 Appendix vol. XIV of XIX, # 11 Appendix vol. XV of XIX, # 12 Appendix vol. XVI of XIX, # 13 Appendix vol. XVIII of XIX, # 14 Certificate of Service)(Kraft, Denise) (Entered Jul. 2, 2010).
Sealed Appendix re 186 Motion in Limine *SOITEC/CEA Parties' Motion to Exclude the Expert Report of Dr. Pascal Belton and Any Related Testimony Plaintiffs' Omnibus Appendix to Daubert Motion and Motions for Partial Summary Judgment* Filed on Jul. 2, 2010—vol. VI of XIX (Filed Under Seal) by Commissariat a LEnergie Atomique, SOITEC Silicon on Insulator Technologies SA. (Attachments: # 1 Certificate of Service) (Kraft, Denise) (Entered Jul. 2, 2010).
Sealed Appendix re 186 Motion in Limine *SOITEC/CEA Parties' Motion to Exclude the Expert Report of Dr. Pascal Belton and Any Related Testimony Plaintiffs' Omnibus Appendix to Daubert Motion and Motions for Partial Summary Judgment* Filed on Jul. 2, 2010—vol. VIII of XIX (Filed Under Seal) by Commissariat a LEnergie Atomique, SOITEC Silicon on Insulator Technologies SA. (Attachments: # 1 Certificate of Service) (Kraft, Denise) (Entered Jul. 2, 2010).
Sealed Appendix re 186 Motion in Limine *SOITEC/CEA Parties' Motion to Exclude the Expert Report of Dr. Pascal Belton and Any Related Testimony Plaintiffs' Omnibus Appendix to Daubert Motion and Motions for Partial Summary Judgment* Filed on Jul. 2, 2010—vol. X of XIX (Filed Under Seal) by Commissariat a LEnergie Atomique, SOITEC Silicon on Insulator Technologies SA. (Attachments: # 1 Certificate of Service) (Kraft, Denise) (Entered Jul. 2, 2010).
Sealed Appendix re 186 Motion in Limine *SOITEC/CEA Parties' Motion to Exclude the Expert Report of Dr. Pascal Belton and Any Related Testimony Plaintiffs' Omnibus Appendix to Daubert Motion and Motions for Partial Summary Judgment* Filed on Jul. 2, 2010—vol. XVII of XIX (Filed Under Seal) by Commissariat a LEnergie Atomique, SOITEC Silicon on Insulator Technologies SA. (Attachments: # 1 Certificate of Service) (Kraft, Denise) (Entered Jul. 2, 2010).
Sealed Appendix re 186 Motion in Limine *SOITEC/CEA Parties' Motion to Exclude the Expert Report of Dr. Pascal Belton and Any Related Testimony Plaintiffs' Omnibus Appendix to Daubert Motion and Motions for Partial Summary Judgment* Filed on Jul. 2, 2010—vol. XIX of XIX (Filed Under Seal) by Commissariat a LEnergie Atomique, SOITEC Silicon on Insulator Technologies SA. (Attachments: # 1 Certificate of Service) (Kraft, Denise) (Entered Jul. 2, 2010).
Sealed Motion for Summary Judgment *SOITEC/CEA Parties' Motion for Summary Judgment: Non-Infringement* (Filed Under Seal)—filed by Commissariat a LEnergie Atomique, SOITEC Silicon on Insulator Technologies SA. (Attachments: # 1 Certificate of Service)(Kraft, Denise) (Entered: Jul. 2, 2010).
Sealed Opening Brief in Support re 197 Sealed Motion for Summary Judgment *SOITEC/CEA Parties' Motion for Summary Judgment: Non-Infringement* (Filed Under Seal)Sealed Motion for Summary Judgment *SOITEC/CEA Parties' Motion for Summary Judgment: Non-Infringement* (Filed Under Seal) filed by Commissariat a LEnergie Atomique, SOITEC Silicon on Insulator Technologies SA.Answering Brief/Response due date per Local Rules is Jul. 19, 2010. (Attachments: # 1 Certificate of Service)(Kraft, Denise) (Entered: Jul. 2, 2010).
Motion for Summary Judgment of *Non-Infringement*—filed by MEMC Electronic Materials Inc.. (Attachments: # 1 Text of Proposed Order, # 2 Certificate of Service)(Rogowski, Patricia) (Entered: Jul. 2, 2010).
Sealed Opening Brief in Support re 199 Motion for Summary Judgment of *Non-Infringement* filed by MEMC Electronic Materials Inc.. Answering Brief/Response due date per Local Rules is Jul. 19, 2010. (Attachments: # 1 Certificate of Service)(Kraft, Denise) (Entered: Jul. 2, 2010).
Sealed Appendix re 200 Opening Brief in Support, by MEMC Electronic Materials Inc.. (Attachments: # 1 Table of Contents, # 2 Certificate of Service)(Rogowski, Patricia) (Entered: Jul. 2, 2010).
Motion for Partial Summary Judgment *SOITEC/CEA Parties Motion for Partial Summary Judgment That the Patents in Suit Satisfy the Written Description Requirement*—filed by Commissariat a LEnergie Atomique, SOITEC Silicon on Insulator Technologies SA. (Attachments: # 1 Certificate of Service)(Kraft, Denise) (Entered: Jul. 2, 2010).
Opening Brief in Support re 202 Motion for Partial Summary Judgment *SOITEC/CEA Parties Motion for Partial Summary Judgment That The Patents in Suit Satisfy the Written Description Requirement* filed by Commissariat a LEnergie Atomique, SOITEC Silicon on Insulator Technologies SA, SOITEC U.S.A., Inc..Answering Brief/Response due date per Local Rules is Jul. 19, 2010. (Attachments: # 1 Certificate of Service)(Kraft, Denise) (Entered: Jul. 2, 2010).
Motion for Partial Summary Judgment *Plaintiffs' Motion for Partial Summary Judgment That the Certificate of Correction for the '396 Patent is Valid*—filed by Commissariat a LEnergie Atomique, SOITEC Silicon on Insulator Technologies SA. (Attachments: # 1 Certificate of Service)(Kraft, Denise) (Entered: Jul. 2, 2010).
Opening Brief in Support re 204 Motion for Partial Summary Judgment Plaintiffs' Motion for Partial Summary Judgment That The Certificate of Correction for the '396 Patent is Valid filed by Commissariat a LEnergie Atomique, SOITEC Silicon on Insulator Technologies SA.Answering Brief/Response due date per Local Rules is Jul. 19, 2010. (Attachments: # 1 Certificate of Service)(Kraft, Denise) (Entered: Jul. 2, 2010).
Motion for Partial Summary Judgment *SOITEC/CEA Parties' Motion for Partial Summary Judgment That the Aspar Patents Are Not Invalid for Inequitable Conduct*—filed by Commissariat a LEnergie Atomique, SOITEC Silicon on Insulator Technologies SA, SOITEC U.S.A., Inc.. (Attachments: # 1 Text of Proposed Order, # 2 Certificate of Service)(Kraft, Denise) (Entered: Jul. 2, 2010).
Opening Brief in Support re 206 Motion for Partial Summary Judgment *SOITEC/CEA Parties' Motion for Partial Summary Judgment That The Aspar Patents Are Not Invalid for Inequitable Conduct* filed by Commissariat a LEnergie Atomique, SOITEC Silicon on Insulator Technologies SA, SOITEC U.S.A., Inc..Answering per Local Rules is Jul. 19, 2010. (Attachments: # 1 Certificate of Service)(Kraft, Denise) (Entered: Jul. 2, 2010).
Motion for Partial Summary Judgment *Plaintiffs' Motion for Partial Summary Judgment That The Bruel Patent Does Not Anticipate the Aspar Patents*—filed by Commissariat a LEnergie Atomique, SOITEC Silicon on Insulator Technologies SA. (Attachments: # 1 Text of Proposed Order, # 2 Certificate of Service)(Kraft, Denise) (Entered: Jul. 2, 2010).
Opening Brief in Support re 208 Motion for Partial Summary Judgment *Plaintiffs' Motion for Partial Summary Judgment That The Bruel Patent Does Not Anticipate the Aspar Patents* filed by Commissariat a LEnergie Atomique, SOITEC Silicon on Insulator Technologies SA.. Answering Brief/Response due date per Local Rules is Jul. 19, 2010. (Attachments: # 1 Certificate of Service)(Kraft, Denise) (Entered: Jul. 2, 2010).
Motion for Partial Summary Judgment *SOITEC's Motion for Partial Summary Judgment of Invalidity of United States Patent No. 5,834,812 for Lack of Enablement*—filed by SOITEC Silicon on Insulator Technologies SA, SOITEC U.S.A., Inc.. (Attachments: # 1 Text of Proposed Order, # 2 Certificate of Service)(Kraft, Denise) (Entered: Jul. 2, 2010).
Opening Brief in Support re 210 Motion for Partial Summary Judgment *SOITEC's Motion for Partial Summary Judgment of Invalidity of United States Patent No. 5,834,812 for Lack of Enablement* filed by SOITEC Silicon on Insulator Technologies SA, SOITEC U.S.A., Inc..Answering Brief/Response due date per Local Rules is Jul. 19, 2010. (Attachments: # 1 Certificate of Service)(Kraft, Denise) (Entered: Jul. 2, 2010).
Motion for Partial Summary Judgment *SOITEC's Motion for Partial Summary Judgment for Invalidity of Asserted Claims of United States Patent No. 5,834,812 in View of Prior Art*—filed by SOITEC Silicon on Insulator Technologies SA, SOITEC U.S.A., Inc.. (Attachments: # 1 Text of Proposed Order, # 2 Certificate of Service)(Kraft, Denise) (Entered: Jul. 2, 2010).
Motion for Partial Summary Judgment *That the Best Mode Requirement is Satisfied for the Claims of the '009 and '396 Patents*—filed by Commissariat a LEnergie Atomique, SOITEC Silicon on Insulator Technologies SA. (Attachments: # 1 Text of Proposed Order, # 2 Certificate of Service)(Reed, John) (Entered: Jul. 2, 2010).
Opening Brief in Support re 212 Motion for Partial Summary Judgment *SOITEC's Motion for Partial Summary Judgment for Invalidity of Asserted Claims of United States Patent No. 5,834,812 in View of Prior Art* filed by SOITEC Silicon on Insulator Technologies SA, SOITEC U.S.A., Inc.. Answering Brief/Response due date per Local Rules is Jul. 19, 2010. (Attachments: # 1 Certificate of Service)(Kraft, Denise) (Entered: Jul. 2, 2010).
Opening Brief in Support re 213 Motion for Partial Summary Judgment *That the Best Mode Requirement is Satisfied for the Claims of the '009 and '396 Patents* filed by SOITEC Silicon on Insulator Technologies SA Answering Brief/Response due date per Local Rules is Jul. 19, 2010. (Attachments: # 1 Certificate of Service)(Reed, John) (Entered: Jul. 2, 2010).
Correcting Entry: Per request of counsel, D.I. number 216 has been deleted and will be re-filed at a later time (lid) (Entered: Jul. 7, 2010).
Correcting Entry: Per request of counsel, D.I. number 217 has been deleted and will be re-filed at a later time (lid) (Entered: Jul. 7, 2010).
Redacted Version of 200 Opening Brief in Support, by MEMC Electronic Materials Inc.. (Attachments: # 1 Certificate of Service)(Rogowski, Patricia) (Entered: Jul. 7, 2010); Correcting Entry: Per request of counsel, D.I. numbers 216 and 217 have been deleted and will be re-filed at a later time (lid) (Entered: Jul. 7, 2010).
Redacted Version of 201 Appendix by MEMC Electronic Materials Inc.. (Attachments: # 1 Appendix MA0001-MA0004, # 2 Appendix MA0005-MA0010, # 3 Appendix MA0011-MA0016, # 4 Appendix MA0017-MA0020, # 5 Appendix MA0021-MA0029, # 6 Appendix MA0030-MA0045, # 7 Appendix MA0046-MA0052, # 8 Appendix MA0053-MA0078, # 9 Appendix MA0079-MA0092, # 10 Appendix MA0093-MA0129, # 11 Appendix MA0130-MA0148, # 12 Appendix MA0149-MA0160, # 13 Appendix MA0161-MA0163, # 14 Appendix MA0164-MA0167, # 15 Appendix MA0168-MA0172, # 16 Appendix MA0173-MA0183, # 17 Appendix MA0184-MA0196, # 18 Appendix MA0197-MA0207, # 19 Appendix MA0208-MA0241, # 20 Appendix MA0242-MA0245, # 21 Appendix MA0246-MA0249, # 22 Appendix MA0250-MA0252, # 23 Appendix MA0253-MA0265, # 24 Appendix MA0266-MA0281, # 25 Appendix MA0282-MA0312, # 26 Appendix MA0313-MA0359, # 27 Appendix MA0360-MA0365, # 28 Appendix MA0366, # 29 Appendix MA0367-MA0400, # 30 Appendix MA0401-MA0474, # 31 Appendix MA0475-MA0483, # 32 Certificate of Service)(Rogowski, Patricia) (Entered: Jul. 7, 2010).
Redacted Version of 190 Appendix by MEMC Electronic Materials Inc.. (Attachments: # 1 Appendix MA0448-MA0489, # 2 Appendix MA0490-MA0515, # 3 Appendix MA0516-MA0534, # 4 Appendix MA0535-MA0541, # 5 Appendix MA0542-MA0550, # 6 Appendix MA0551-MA0561, # 7 Appendix MA0562-MA0564, # 8 Appendix MA0565-MA0569, # 9 Appendix MA0570-MA0574, # 10 Appendix MA0575-MA0576, # 11 Appendix MA0577-MA0601, # 12 Appendix MA0602-MA0603, # 13 Appendix MA0604-MA0605, # 14 Appendix MA0606-MA0609, # 15 Appendix MA0610-MA0612, # 16 Appendix MA0613-MA0625, # 17 Appendix MA0626-MA0628, # 18 Appendix MA0629-MA0630, # 19 Appendix MA0631-MA0653, # 20 Appendix MA0654-MA0685, # 21 Appendix MA0686-MA0701, # 22 Appendix MA0702-MA0732, # 23 Appendix MA0733-MA0742, # 24 Appendix MA0743-MA0750, # 25 Appendix MA0751-MA0766, # 26 Appendix MA0767-MA0772, # 27 Appendix MA0773-MA0780, # 28 Appendix MA0781-MA0807, # 29 Appendix MA0808-MA0824, # 30 Appendix MA0825-MA0831.1, # 31 Appendix MA0832-MA0838, # 32 Appendix MA0839-MA0844, # 33 Appendix MA0845-MA0858, # 34 Appendix MA0859-MA0868, # 35 Appendix MA0869-MA0877, # 36 Appendix MA0878-MA0884, # 37 Appendix MA0885-MA0887, # 38 Appendix MA0888-MA0891, # 39 Appendix MA0892-MA0909, # 40 Appendix MA0910-MA0931, # 41 Certificate of Service)(Rogowski, Patricia) (Entered: Jul. 7, 2010).
Redacted Version of 198 Opening Brief in Support,, *SOITEC/CEA Parties' Opening Brief In Support of Motion for Summary Judgment: Non-Infringement* by SOITEC Silicon on Insulator Technologies SA, SOITEC U.S.A., Inc.. (Kraft, Denise) (Entered: Jul. 8, 2010).
Redacted Version of 197 Sealed Motion for Summary Judgment *SOITEC/CEA Parties' Opening Brief In Support of Motion for Summary Judgment: Non-Infringement* (Filed Under Seal)Sealed Motion for Summary Judgment *SOITEC/CEA Parties' Opening Brief In Support of Motion for Summary Judgment: Non-Infringement* (Filed Under Seal) *SOITEC/CEA Parties' Opening Brief In Support of Motion for Summary Judgment: Non-Infringement* by Commissariat a LEergie Atomique, SOITEC Silicon on Insulator Technologies SA, SOITEC U.S.A., Inc.. (Kraft, Denise) (Entered: Jul. 8, 2010).
Redacted Version of 192 Appendix, *Plaintiffs' Omnibus Appendix to Daubert Motion and Motions for Partial Summary Judgment Filed on July 2, 2010*—vol. VI of XIX by Commissariat a LEnergie Atomique, SOITEC Silicon on Insulator Technologies SA, SOITEC U.S.A., Inc.. (Kraft, Denise) (Entered: Jul. 9, 2010).
Redacted Version of 193 Appendix, *Plaintiffs' Omnibus Appendix to Daubert Motion and Motions for Partial Summary Judgment Filed on Jul. 2, 2010*—vol. VIII of XIX by Commissariat a LEnergie Atomique, SOITEC Silicon on Insulator Technologies SA, SOITEC U.S.A., Inc.. (Kraft, Denise) (Entered: Jul. 9, 2010).
Redacted Version of 194 Appendix, *Plaintiffs' Omnibus Appendix to Daubert Motion and Motions for Partial Summary Judgment Filed on Jul. 2, 2010*—vol. X of XIX by Commissariat a LEnergie Atomique, SOITEC Silicon on Insulator Technologies SA, SOITEC U.S.A., Inc.. (Kraft, Denise) (Entered: Jul. 9, 2010).
Redacted Version of 195 Appendix, *Plaintiffs' Omnibus Appendix to Daubert Motion and Motions for Partial Summary Judgment Filed on Jul. 2, 2010*—vol. XVII of XIX by Commissariat a LEnergie Atomique, SOITEC Silicon on Insulator Technologies SA, SOITEC U.S.A., Inc.. (Kraft, Denise) (Entered: Jul. 9, 2010).
Redacted Version of 196 Appendix, *Plaintiffs' Omnibus Appendix to Daubert Motion and Motions for Partial Summary Judgment Filed on Jul. 2, 2010*—vol. XIX of XIX by Commissariat a LEnergie Atomique, SOITEC Silicon on Insulator Technologies SA, SOITEC U.S.A., Inc.. (Kraft, Denise) (Entered: Jul. 9, 2010).

Claim Construction Answering Brief re 168 Claim Construction Opening Brief, filed by MEMC Electronic Materials Inc.. (Attachments: # 1 Certificate of Service)(Rogowski, Patricia) (Entered: Jul. 9, 2010).
Appendix re 228 Claim Construction Answering Brief by MEMC Electronic Materials Inc.. (Attachments: # 1 Appendix DA0782_DA0783, # 2 Appendix DA0784-DA0785, # 3 Appendix DA0786, # 4 Appendix DA0787-DA0810, # 5 Appendix DA0811-DA0834, # 6 Appendix DA0835-DA0845, # 7 Appendix DA0846-DA0855, # 8 Certificate of Service)(Rogowski, Patricia) (Entered: Jul. 9, 2010).
Claim Construction Answering Brief re 168 Claim Construction Opening Brief, 228 Claim Construction Answering Brief *Plaintiffs S.O.I.TEC on Insulator Technologies, S.A. and Commissariat A ENergie Atomique's Answering Claim Construction Brief* filed by Commissariat a LEnergie Atomique, SOITEC Silicon on Insulator Technologies SA, SOITEC U.S.A., Inc.. (Attachments: # 1 Certificate of Service)(Kraft, Denise) (Entered: Jul. 9, 2010).
Appendix re 230 Claim Construction Answering Brief, *Appendix to Plaintiffs S.O.I.TEC on Insulator Technologies, S.A. and Commissariat A ENergie Atomique's Answering Claim Construction Brief* by Commissariat a LEnergie Atomique, SOITEC Silicon on Insulator Technologies SA, (Attachments: # 1 Appendix PA-0001-PA-0050, # 2 Appendix PA-0051-PA-0083, # 3 Certificate of Service)(Kraft, Denise) (Entered: Jul. 9, 2010).
Redacted Version of 183 Appendix, *Joint Appendix of Exhibits to Opening and Answering Claim Construction Briefs* vol. IV of VI by Commissariat a LEnergie Atomique, SOITEC Silicon on Insulator Technologies SA. (Kraft, Denise) (Entered: Jul. 9, 2010).
Redacted Version of 170 Exhibit to a Document, *Exhibit A to Declaration of Marcus T. Hall in Support of Plaintiffs S.O.I.TEC Silicon on Insulator Technologies, S.A. and Commissariat a L'Energie Atomique's Opening Claim Construction Brief* by Commissariat a LEnergie Atomique, SOITEC Silicon on Insulator Technologies SA. (Kraft, Denise) (Entered: Jul. 12, 2010).
Redacted Version of 171 Exhibit to a Document, *Exhibit B to Declaration of Marcus T. Hall in Support of Plaintiffs S.O.I.TEC Silicon on Insulator Technologies, S.A. and Commissariat a L'Energie Atomique's Opening Claim Construction Brief* by Commissariat a LEnergie Atomique, SOITEC Silicon on Insulator Technologies SA. (Kraft, Denise) (Entered: Jul. 12, 2010).
Redacted Version of 172 Exhibit to a Document, *Exhibit C to Declaration of Marcus T. Hall in Support of Plaintiffs S.O.I.TEC Silicon on Insulator Technologies, S.A. and Commissariat a L'Energie Atomique's Opening Claim Construction Brief* by Commissariat a LEnergie Atomique, SOITEC Silicon on Insulator Technologies SA. (Kraft, Denise) (Entered: Jul. 12, 2010).
Letter to the Honorable Sue L. Robinson from Denise Seastone Kraft, Esq. regarding Courtesy CD-ROM copies of: (1) Plaintiffs' Answering Claim Construction Brief and Appendix; and (2) Plaintiffs' Daubert Motion; Plaintiffs' Motions for Partial Summary Judgment; and Plaintiffs' Omnibus Appendix to Daubert Motion and Motions for Partial Summary Judgment. (Kraft, Denise) (Entered: Jul. 12, 2010).
Notice of Service of Re-Notice of Deposition of Dr. Peter Moran on behalf of S.O.I.TEC Silicon on Insulator Technologies, S.A., Commissariat a L'Energie Atomique, and SOITEC U.S.A., Inc. by Commissariat a LEnergie Atomique, SOITEC Silicon on Insulator Technologies SA, SOITEC U.S.A., Inc.. (Attachments: # 1 Certificate of Service)(Kraft, Denise) (Entered: Jul. 13, 2010).
Fourth Stipulation to Amend Scheduling Order re 26 Scheduling Order,,, by MEMC Electronic Materials Inc.. (Rogowski, Patricia) (Entered: Jul. 15, 2010).
Answering Brief in Opposition re 186 Motion in limine *SOITEC/CEA Parties' Motion to Exclude The Expert Report of Dr. Pascal Bellon and Any Related Testimony* filed by MEMC Electronic Materials Inc..Reply Brief due date per Local Rules is Jul. 29, 2010. (Rogowski, Patricia) (Entered: Jul. 19, 2010).
Sealed Appendix re 239 Answering Brief in Opposition, by MEMC Electronic Materials Inc.. (Attachments: # 1 Table of Contents, # 2 Certificate of Service)(Rogowski, Patricia) (Entered: Jul. 19, 2010).
Sealed Answering Brief in Opposition re 213 Motion for Partial Summary Judgment *That the Best Mode Requirement is Satisfied for the Claims of the '009 and '396 Patents* filed by MEMC Electronic Materials Inc.. Reply Brief due date per Local Rules is Jul. 29, 2010. (Rogowski, Patricia) (Entered: Jul. 19, 2010).
Answering Brief in Opposition re 208 Motion for Partial Summary Judgment *Plaintiffs' Motion for Partial Summary Judgment That The Bruel Patent Does Not Anticipate the Aspar Patents* filed by MEMC Electronic Materials Inc.. Reply Brief due date per Local Rules is Jul. 29, 2010. (Rogowski, Patricia) (Entered: Jul. 19, 2010).
Answering Brief in Opposition re 202 Motion for Partial Summary Judgment *SOITEC/CEA Parties Motion for Partial Summary Judgment That The Patents in Suit Satisfy the Written Description Requirement* filed by MEMC Electronic Materials Inc..Reply Brief due date per Local Rules is Jul. 29, 2010. (Rogowski, Patricia) (Entered: Jul. 19, 2010).
Answering Brief in Opposition re 204 Motion for Partial Summary Judgment *Plaintiffs'Motion for Partial Summary Judgment That The Certificate of Correction for the '396 Patent is Valid* filed by Memo Electronic Materials Inc.. Reply Brief due date per Local Rules is Jul. 29, 2010. (Rogowski, Patricia) (Entered: Jul. 19, 2010).
Answering Brief in Opposition re 204 Motion for Partial Summary Judgment *SOITEC' Motion for Partial Summary Judgment of Invalidity of United States Patent No. 5,834,812 for Lack of Enablement* filed by MEMC Electronic Materials Inc..Reply Brief due date per Local Rules is Jul. 29, 2010. (Rogowski, Patricia) (Entered: Jul. 19, 2010).
Answering Brief in Opposition re 212 Motion for Partial Summary Judgment *SOITEC' Motion for Partial Summary Judgment of Invalidity of United States Patent No. 5,834,812 in View of Prior Art* filed by MEMC Electronic Materials Inc..Reply Brief due date per Local Rules is Jul. 29, 2010. (Rogowski, Patricia) (Entered: Jul. 19, 2010).
Sealed Answering Brief in Opposition re 187 Motion for Partial Summary Judgment *Invalidity of the Asserted Aspar Patent Claims Plaintiffs' Answering Brief in Opposition to Defendant's Motion for Partial Summary Answering Brief of Invalidity of The Asserted Aspar Claims*—Filed Under Seal filed by Commissariat a LEnergie Atomique, SOITEC Silicon on Insulator Technologies SA.Reply Brief due date per Local Rules is Jul. 29, 2010. (Attachments: # 1 Certificate of Service)(Kraft, Denise) (Entered: Jul. 19, 2010).
Appendix re 247 Answering Brief in Opposition,, *Appendix to Plaintiffs' Answering Brief in Opposition to Defendant's Motion for Partial Summary Answering Brief of Invalidity of the Asserted Aspar Claims* (PA-113-PA-1156) by Commissariat a LEnergie Atomique, SOITEC Silicon on Insulator Technologies SA. (Attachments: # 1 Exhibit PA-1103-PA-1109—Filed Under Seal, # 2 Exhibit PA-1110-PA-1118—Filed Under Seal, # 3 Exhibit PA-1119-PA-1130—Filed Under Seal, # 4 Exhibit PA-1131-PA-1143—Filed Under Seal, # 5 Exhibit PA-1144-PA-1156, # 6 Certificate of Service)(Kraft, Denise) (Entered: Jul. 19, 2010).
Sealed Answering Brief in Opposition re 197 Sealed Motion for Summary Judgment *SOITEC/CEA Parties' Motion for Summary Judgment: Non-Infringement* (Filed Under Seal)Seal Motion for Summary Judgment *SOITEC/CEA Parties' for Summary Judgment: Non-Infringement* (Filed Under Seal) filed by MEMC Electronic Materials Inc..Reply Brief due date per Local Rules is Jul. 29, 2010. (Rogowski, Patricia) (Entered: Jul. 19, 2010).
Sealed Answering Brief in Opposition re 199 Motion for Summary Judgment *of Non-Infringement Soitec's Brief in Opposition to Defendant's Motion for Summary Judgment of Non-Infringement* filed by Commissariat a LEnergie Atomique, SOITEC Silicon on Insulator Technologies SA.Reply Brief due date per Local Rules is Jul. 29, 2010. (Attachments: # 1 Certificate of Service)(Kraft, Denise) (Entered: Jul. 19, 2010).
Sealed Appendix re 250 Answering Brief in Opposition, *Appendix to Plaintiffs' Answering Brief in Opposition to Defendant's Motion for Summary Judgment of Non-Infringement* by Commissariat a LEnergie Atomique, SOITEC Silicon on Insulator Technologies SA. (Attachments: # 1 Exhibit PA-1157-PA-1159 Filed Under Seal, # 2 Exhibit PA-1160-PA-1165 Filed Under Seal, # 3 Exhibit PA-1166-PA-1168 Filed Under Seal, # 4 Exhibit PA-1169-PA-1185 Filed Under Seal, # 5 Exhibit PA-1186-PA-1189)(Kraft, Denise) (Entered: Jul. 19, 2010).
Appendix re 250 Answering Brief in Opposition, *Appendix to Plaintiffs' Answering Brief in Opposition to Defendant's Motion for Summary Judgment of Non-Infringement* by Commissariat a LEnergie Atomique, SOITEC Silicon on Insulator Technologies SA. (Attachments: # 1 Exhibit PA-1190-PA-1191, # 2 Certificate of Service)(Kraft, Denise) (Entered: Jul. 19, 2010).
Partial Summary That the Electronic (Rogowski, Patricia) sealed exhibits Counsel is advised re-file documents documents are under for Partial Summary Judgment Conduct filed by Memo per Local Rules is Jul. 29, 2010. Entry: Docket clerk deleted being filed improperly. may not be filed together and to event code indicating that.
Sealed Appendix re 247 Answering Brief in Opposition, *Appendix to Plaintiffs' Answering Brief in Opposition to Defendant's Motion for Summary Judgment of the Asserted Aspar Claims* (PA-1103-PA-1143 Filed Under Seal) by Commissariat a LEnergie Atomique, SOITEC Silicon on Insulator Technologies SA. (Attachments: # 1 Exhibit PA-1103-PA-1109 Filed Under Seal, # 2 Exhibit PA-1110-PA-1118 Filed Under Seal, # 3 Exhibit PA-1119-PA-1130 Filed Under Seal, # 4 Exhibit PA-1131-PA-1143, # 5 Certificate of Service)(Kraft, Denise) (Entered: Jul. 20, 2010).
Notice of Service of Documents Marked MEMC0782013-MEMC0782178 by MEMC Electronic Materials Inc..(Rogowski, Patricia) (Entered: Jul. 21, 2010).
Letter to The Honorable Sue L. Robinson from Denise Seastone Kraft regarding Courtesy CD-ROM copies of: (1) Plaintiffs Answering Brief in Opposition to Defendants Motion for Partial Summary Judgment of Invalidity of The Asserted Aspar Claims and Appendix; and (2) Soitecs Brief in Opposition to Defendants Motion for Summary Judgment of Non-Infringement and Appendix. (Kraft, Denise) (Entered: Jul. 21, 2010); So Ordered—re 238 Stipulation to Amend Scheduling Order. Order—Setting Scheduling Order Deadlines (Reply Brief due Jul. 7, 2010.)(Refer to Stipulation for Details). Signed by Judge Sue L. Robinson on Jul. 22, 2010. (lid) (Entered: Jul. 22, 2010).
Redacted Version of 241 Answering Brief in Opposition, *to Plaintiffs' Motion for Partial Summary Judgment that the Best Mode Requirement is Satisfied for the Claims of the '009 and '396 Patents* by MEMC Electronic Materials Inc.. (Rogowski, Patricia) (Entered: Jul. 26, 2010).
Redacted Version of 249 Answering Brief in Opposition, *to Plaintiffs' Motion for Summary Judgment on the Infringement of U.S. Patent No. 5,834,812* by MEMC Electronic Materials Inc.. (Rogowski, Patricia) (Entered: Jul. 26, 2010).
Redacted Version of 253 Answering Brief in Opposition, *to Plaintiffs' Motion for Partial Summary that the Aspar Patents are not Invalid for Inequitable Conduct* by MEMC Electronic Materials Inc.. (Rogowski, Patricia) (Entered: Jul. 26, 2010).
Redacted Version of 240 Appendix by MEMC Electronic Materials Inc.. (Attachments: # 1 Appendix MA0932-MA0985, # 2 Appendix MA0986-MA1039.22, # 3 Appendix MA1040-MA1144, # 4 Appendix MA1145-MA1200, # 5 Appendix MA1201-MA1265, # 6 Appendix MA1265.1-MA1338, # 7 Appendix MA1339-1547, # 8 Appendix MA1548-MA1627, # 9 Appendix MA 1628-MA1693, # 10 Appendix MA1694-MA1953, # 11 Appendix MA 1954-MA2127, # Appendix MA2128-MA2206, # 13 Appendix MA2207-MA2253, # 14 Appendix MA2254-MA2273, # 15 Appendix MA 2274-MA2333, # 16 Appendix MA2234-MA2337, # 17 Appendix MA2338-MA2342, # 18 Appendix MA2343-MA2346, # 19 Appendix MA2347-MA2351, # 20 Certificate of Service)(Rogowski, Patricia) (Entered: Jul. 26, 2010).
Sealed Answering Brief in Opposition re 213 Motion for Partial Summary Judgment *That the Best Mode Requirement is Satisfied for the Claims of the '009 and 'Patents Corrected Version of D.I. 241* filed by MEMC Electronic Materials Inc..Reply Brief due date per Local Rules is Aug. 5, 2010. (Rogowski, Patricia) (Entered: Jul. 26, 2010).
Redacted Version of 261 Answering Brief in Opposition, *to Plaintiffs' Motion for Partial Summary Judgment that the Best Mode Requirement is Satisfied for the Claims of the '009 and 'Patents* (*Corrected Version of D.I. 241*) filed by MEMC Electronic Materials Inc.. (Rogowski, Patricia) (Entered: Jul. 26, 2010).
Redacted Version of 250 Answering Brief in Opposition, *to Soitec's Brief in Opposition to Defendant's Motion for Summary Judgment of Non-Infringement* by Commissariat a LEnergie Atomique, SOITEC Silicon on Insulator Technologies SA. (Attachments: # 1 Certificate of Service)(Kraft, Denise) (Entered: Jul. 26, 2010).

Redacted Version of 247 Answering Brief in Opposition, *Plaintiffs' Answering Brief in Opposition to Defendant's Motion for Partial Summary Judgment of Invalidity of the Asserted Aspar Claims* by Commissariat a LEnergie Atomique, SOITEC Silicon on Insulator Technologies SA. (Attachments: # 1 Certificate of Service)(Kraft, Denise) (Entered: Jul. 26, 2010).
Redacted Version of 254 Appendix,, *to Appendix to Plaintiffs' Answering Brief in Opposition to Defendant's Motion for Partial Summary Judgment of Invalidity of the Asserted Aspar Claims* (PA-1103-PA-1143 by Commissariat a LEnergie Atomique, SOITEC Silicon on Insulator Technologies SA. (Kraft, Denise) (Entered: Jul. 26, 2010).
Redacted Version of 251 Appendix,, *to Appendix to Plaintiffs' Answering Brief in Opposition to Defendant's Motion for Summary Judgment of Non-Infringement* by Commissariat a LEnergie Atomique, SOITEC Silicon on Insulator Technologies SA. (Kraft, Denise) (Entered: Jul. 26, 2010).
Sealed Reply Brief re 187 Motion for Partial Summary Judgment of *Invalidity of the Asserted Aspar Claims* filed MEMC Electronic Materials Inc.. (Attachments: # 1 Certificate of Service)(Kraft, Denise) (Entered: Jul. 30, 2010).
Reply Brief re 204 Motion for Partial Summary Judgment *Plaintiffs' Motion for Partial Summary Judgment that the Certificate of Correction for the '396 Patent is Valid Reply Brief in Support of Plaintiffs' Motion for Partial Summary Judgment that the Certificate of Correction for the '396 Patent is Valid* filed by Commissariat a LEnergie Atomique, SOITEC Silicon on Insulator Technologies SA. (Attachments: # 1 Certificate of Service)(Kraft, Denise) (Entered: Jul. 30, 2010).
Sealed Appendix re 267 Reply Brief *In Support of MEMC'Motion for Partial Summary Judgment of Invaliditiy of the Asserted Aspar Patent Claims* by MEMC Electronic Materials Inc.. (Attachments: # 1 Table of Contents, # 2 Certificate of Service)(Rogowski, Patricia) (Eneterd: Jul. 30, 2010).
Declaration re 268 Reply Brief, *Declaration of Marcus T. Hall in Support of Reply Brief in Support of Plaintiffs' Motion for Partial Summary Judgment that the Certificate of Correction for the '396 Patent is Valid* by Commissariat a LEnergie Atomique, SOITEC Silicon on Insulator Technologies SA. (Attachments: # 1 Exhibit A, # 2 Certificate of Service)(Kraft, Denise) (Entered: Jul. 30, 2010).
Sealed Reply Brief re 199 Motion for Summary Judgment of *Non-Infringement* filed by MEMC Electronic Materials Inc.. (Attachments: # Certificate of Service)(Rogowski, Patricia) (Entered: Jul. 30, 2010).
Appendix re 268 Reply Brief, *Omnibus Appendix to Plaintiffs' Reply Briefs in Support of Plaintiffs' Daubert Motion and Motions for Partial Summary Judgment* (PA-1192-PA-1261) by Commissariat a LEnergie Atomique, SOITEC Silicon on Insulator Technologies SA. (Attachments: # 1 Exhibit PA-1199-PA-1204, # 2 Exhibit PA-1205-PA-1206, # 3 Exhibit PA-1206.1, # 4 Exhibit PA-1231-PA-1237, # 5 Exhibit PA-1238-PA-1245, # 6 Exhibit PA-1246-PA-1257, # 7 Exhibit PA-1258-PA-1261, # 8 Certificate of Service)(Kraft, Denise) (Entered: Jul. 30, 2010).
Sealed Appendix re 271 Reply Brief *in Support of MEMC's Motion for Summary Judgment of Non-Infringement* by MEMC Electronic Materials Inc.. (Attachments: # 1 Table of Contents, # 2 Certificate of Service)(Rogowski, Patricia) (Entered: Jul. 30, 2010).
Sealed Appendix re 272 Appendix,, *Omnibus Appendix to Plaintiffs' Reply Briefs in Support of Plaintiffs' Daubert Motion and Motions for Partial Summary Judgment* (PA-1192-PA-1198 and PA-1207-PA-1230 Filed Under Seal) by Commissariat a LEnergie Atomique, SOITEC Silicon on Insulator Technologies SA. (Attachments: # 1 Exhibit PA-1192-PA-1198 (Filed Under Seal), # 2 Exhibit PA-1207-PA-1217 (Filed Under Seal), # 3 Exhibit PA-1218- PA-1230 Filed Under Seal), # 4 Exhibit Certificate of Service)(Kraft, Denise) (Entered: Jul. 30, 2010).
Reply Brief re 210 Motion for Partial Summary Judgment *SOITEC's Motion for Partial Summary Judgment of Invalidity of United States Patent No. 5,834,812 For Lack of Enablement Reply Brief in Support of SOITEC's Motion For Partial Summary Judgment of Invalidity of United States Patent No. 5,834,812 For Lack of Enablement* filed by SOITEC Silicon on Insulator Technologies SA, SOITEC U.S.A., Inc.. (Attachments: # 1 Certificate of Service)(Kraft, Denise) (Entered: Jul. 30, 2010).

Reply Brief re 212 Motion for Partial Summary Judgment *SOITEC's Motion for Partial Summary Judgment for Invalidity Asserted Claims of United States Patent No. 5,834,812 in View of Prior Art Reply Brief in Support of SOITEC's Motion for Partial Summary Judgment Invalidity of Asserted Claims of United States Patent No. 5,834,812 in View of Prior Art* filed by SOITEC Silicon on Insulator Technologies SA, SOITEC U.S.A., Inc.. (Attachments: # 1 Exhibit A, # 2 Exhibit B, # 3 Certificate of Service)(Kraft, Denise) (Entered: Jul. 30, 2010).

Reply Brief re 186 Motion in Limine *SOITEC/CEA Parties' Motion to Exclude The Expert Report of Dr. Pascal Bellon and Any Related Testimony Reply Brief in Support of SOITEC/CEA Parties' Motion to Exclude The Expert Report of Dr. Pascal Bellon and Any Related Testimony* filed by Commissariat a LEnergie Atomique, SOITEC Silicon on Insulator Technologies SA, (Attachments: # 1 Certificate of Service)(Kraft, Denise) (Entered: Jul. 30, 2010).

Motion for Summary Judgment Judgment: Non-Infringement (Filed Summary Judgment Soitec/Cea Parties' (Filed Under Seal) Reply Brief Motion for Summary Judgment: Non-Infringement a LEnergie Atomique, Soitec Silicon # 1 Certificate of Service)(Kraft, Denise) for Summary Non-Infringement Sa. (Attachments: Motion for Parties' filed by Commissariat.

Sealed Reply Brief re 213 Motion for Partial Summary Judgment *That the Best Mode Requirement is Satisfied for the Claims of the '009 and '396 Patents Replay Brief in Support of Plaintiffs' Motion for Partial Summary Judgment That the Best Mode Requirement is Satisfied for the Claims of the '009 and '396 Patents* (Filed Under Seal) filed by Commissariat a LEnergie Atomique, SOITEC Silicon On Insulator Technologies SA, (Attachments: # 1 Certificate of Service)(Kraft, Denise) (Entered: Jul. 30, 2010).

Reply Brief re 202 Motion for Summary Judgment *SOITEC/CEA Parties Motion For Partial Summary Judgment That The Patents in Suit Satisfy The Written Description Requirement Reply Brief in Support of SOITEC/CEA Parties' Motion for Partial Summary That The Patents in Suit Satisfy The Written Description Requirement* filed by Commissariat a LEnergie Atomique, SOITEC Silicon On Insulator Technologies SA, (Attachments: # 1 Certificate of Service)(Kraft, Denise) (Entered: Jul. 30, 2010).

Sealed Reply Brief re 208 Motion for Partial Summary Judgment *Plaintiffs' Motion for Partial Summary Judgment that the Bruel Patent does not Anticipate The Aspar Patents Reply Brief in Support of Plaintiffs' Motion for Partial Summary Judgment that the Bruel Patent Does not Anticipate The Aspar Patents* (Filed Under Seal) filed by Commissariat a LEnergie Atomique, SOITECH Silicon on Insulator Technologies SA, (Attachments: # 1 Certificate of Service)(Kraft, Denise) (Entered: Jul. 30, 2010).

Sealed Reply Brief re 206 Motion for Partial Summary Judgment *SOITEC/CEA Parties' Motion for Partial Summary Judgment That The Aspar Patents Are Not Invalid For Inequitable Conduct Reply Brief in Support of SOITEC/CEA Parties' Motion For Partial Summary Judgment That The Aspar Patents Are Not Invalid For Inequitable Conduct* (Filed Under Seal) filed by Commissariat a LEnergie Atomique, SOITEC Silicon On Insulator Technologies SA, (Attachments: # 1 Certificate of Service)(Kraft, Denise) (Entered: Jul. 30, 2010).

Letter to The Honorable Sue L. Robinson from Denise Seastone Kraft, Esq. regarding Courtesy CD-ROM copies of Plaintiffs' Reply to Daubert Motion and Motions for Partial Summary Judgment, and Plaintiffs' Omnibus Appendix to the Replies. (Kraft, Denise) (Entered: Aug. 2, 2010).

Redacted Version of 269 Appendix, To Reply Brief in Support of MEMC's Motion for Partial Summary Judgment of Invalidity of the Asserted Aspar Patent Claims by MEMC Electronic Materials Inc.. (Attachments: # 1 Appendix Table of Contents, # 2 Appendix MA2453_MA2479, # 3 Certificate of Service)(Rogowski, Patricia) (Entered: Aug. 3, 2010).

Redacted Version of 273 Appendix Reply Brief in Support of MEMC's Motion for Summary Judgment of Non-Infringement by MEMC Electronic Materials Inc.. (Attachments: # 1 Appendix Table of Contents, # 2 Appendix MA2352-MA2361, # 3 Appendix MA2362-MA2371, # 4 Appendix MA2372-MA2381, # 5 Appendix MA2382-MA2391, # 6 Appendix MA2392-MA2399, # 7 Appendix MA2400-MA2404, # 8 Appendix MA2405-MA2422, # 9 Appendix MA2423-MA2425, # 10 Appendix MA2426-MA2427, # 11 Appendix MA2428-MA2430, # 12 Appendix MA2431-MA2440, # 13 Appendix MA2441-MA2448, # 14 Appendix MA2449-MA2452, # 15 Appendix MA2452.1-MA2452.9, # 16 Certificate of Service)(Rogowski, Patricia) (Entered: Aug. 3, 2010).

Letter to The Honorable Sue L. Robinson from Patricia Smink Rogowski regarding CD-ROM copies of (1) MEMC's Claim Construction Briefing, (2) MEMC's Briefs in Support of MEMC's Motions for Summary Judgment, and (3) MEMC's Briefs in Opposition to Soitec's Summary Judgment Motions. (Rogowski, Patricia) (Entered: Aug. 3, 2010).

Redacted Version of 267 Reply Brief *In Support of MEMC's Motion for Partial Summary Judgment of Invalidity of the Asserted Aspar Patent Claims* by MEMC Electronic Materials Inc.. (Rogowski, Patricia) (Entered: Aug. 3, 2010).

Redacted Version of 271 Reply Brief *In Support of MEMC's Motion for Summary Judgment of Non-Infringement* by MEMC Electronic Materials Inc.. (Rogowski, Patricia) (Entered: Aug. 3, 2010).

\* cited by examiner

METHOD FOR TRANSFER OF A THIN LAYER

RELATED APPLICATIONS

The present patent document claims the benefit of priority to French Patent Application No. 07 59893, filed Dec. 17, 2007, which is incorporated herein by reference.

TECHNICAL DOMAIN AND PRIOR ART

The invention relates to the domain of thin layers, and particularly the domain of semiconducting materials.

In particular it relates to a technique for transferring a thin layer onto an easily removable host substrate, but with sufficient bonding energy between the thin layer and the substrate.

A fracture method, known under the name of Smart Cut™ is described in the article by A. J. Auberton-Hervé et al. "Why can Smart-Cut change the future of microelectronics?" that was published in International Journal of High Speed Electronics and Systems, Vol. 10, No. 1 (2000), p. 131-146.

This method is used in particular for making SOI (Silicon On Insulator) components or elements.

An SOI structure (FIG. 1C) comprises a stack composed of a support substrate 7 (for example made of silicon), a buried dielectric layer 8, for example silicon oxide or a nitride such as Si3N4 and a silicon layer 5, in which components may be located.

The buried layer 8 forms an insulation from parasite currents and charges originating from ionised particles. It thus enables good insulation of adjacent components made in the same silicon layer and a particularly significant reduction in parasite capacitances between such adjacent components, and insulation of the thin layer 5 made of semiconducting material from the subjacent support 7.

FIGS. 1A to 1C show an example implementation of a layer transfer method using the Smart Cut™ method in order to make an SOI structure. These figures are sectional views.

FIG. 1A shows a silicon substrate 1 provided with a surface oxide layer 8, during an ionic or atomic implantation step 3 of one or several gaseous species through the face 2 of this substrate. A buried layer 4 forming a weakened zone is then formed separating the substrate 1 into two parts: a thin layer 5, located between the implanted face 2 and the weakened zone 4 and the remaining part 6 of the substrate located under the weakened zone 4.

FIG. 1B shows a step in fixing the layer 5 of the substrate 1, through its face 2, onto a support substrate 7 or a stiffener. This fixing may be obtained by direct bonding (also called molecular bonding).

FIG. 1C shows the result of a step induced by a thermal and/or mechanical effect, to separate the thin layer 5 and the remaining part 6 (not shown) of the substrate 1 along the weakened zone 4. The result that can be obtained is a silicon on insulator (SOI) type of structure. As a variant, this structure could be obtained by molecular bonding of a silicon substrate (possibly oxidised on the surface) and a host substrate (also possibly covered with an oxide layer on the surface) and mechanical-chemical thinning of the silicon substrate.

These techniques are not limited to the production of a silicon on insulator substrate, but may be more generally applied to production of a "semiconductor on insulator" structure. In particular, apart from silicon, this concerns germanium, gallium nitride, silicon carbide, gallium arsenide and indium phosphate.

Substrate 7 keeps the previous two thin layers 5, 8 stacked together to create the final structure. It must be sufficiently rigid to facilitate fracture in the case of the Smart Cut process in the implantation zone 4 of the substrate 1, rather than the occurrence of blisters on the surface of the structure. Similarly, bonding between the two substrates (1,7) must be sufficiently strong to prevent any separation at this bonding interface, particularly during application of the fracture heat treatment in the case of the Smart Cut process and to enable mechanical-chemical thinning.

In most cases, the bond of the detached film 5 on its new support 7 is permanent. This is the case particularly for SOI made by previously described techniques.

But in some cases, a double transfer of the layer 5 is required. For example, it might be desirable for the free surface 5' of the thin layer 5 to form a buried surface after the double transfer. In other words, the transfer described above with reference to FIGS. 1A-1C is then temporary, and an additional transfer step is made, the face 5' of the layer 5 being fixed to another substrate and the substrate 7 being eliminated.

This is the case particularly for polar materials for example such as SiC or GaN. When a thin film 5 of this material is to be transferred to a second support, there is a need once again to separate this thin film from the first transfer substrate 7 (or temporary support), after having bonded it onto a new substrate through its free face 5', or before bonding it onto this new substrate.

In order to easily separate the substrate 7, it would be useful to have a low bonding energy between this substrate and the thin layer 5. But as described previously, such energy is not always compatible with the thinning method used to obtain the thin film. Furthermore, a double transfer cannot be made using flexible supports because:

they are too soft and they deform during the thinning method, or they are thermodeformable or thermodegradable and do not resist temperatures imposed by the fracture method without softening or degrading, and therefore they no longer retain the rigidity necessary for the method.

Furthermore, it is impossible to increase the rigidity of such flexible materials using an oxide deposited on it, because the differences in the coefficients of expansion between this material and the deposited oxide are such that the deposited oxide is stressed and ripples appear on the surface of said material, which increases the roughness and prevents bonding.

Therefore, the problem that arises is to find a host substrate that is sufficiently rigid to obtain a thin layer by thinning (mechanical-chemical or Smart Cut) of an initial substrate that can easily be removed.

SUMMARY

The invention relates to a method for bonding a substrate to be thinned onto a temporary easily removable support, but that is capable of producing the thinning method in question.

A transfer onto a host or temporary substrate takes place by bonding an initial substrate onto the host substrate and then thinning the initial substrate to obtain the required thin layer. Thinning may be mechanical-chemical thinning, or it may be the result of a fracture method like that known under the name Smart Cut™.

The invention relates to a method for transferring a thin film from an initial substrate, for example made of semiconducting material, comprising the following steps:

a) assembly by direct bonding of the initial substrate with a face of a silicone type polymer layer, this face having been treated under ultraviolet radiation, b) thinning of the initial substrate to form the thin layer.

The invention can be used to create a thick oxide, for example between 10 µm and 20 µm thick, on the surface of the polymer, after UV treatment of the polymer. After direct bonding, this oxide creates a strong and rigid assembly between the polymer and the initial substrate compatible with the thinning step of this substrate, either using a substrate fracture technique of the Smart Cut™ type (without applying temperatures beyond the temperature at which the polymer is stable) or by mechanical and/or chemical thinning. Simultaneously, this oxide makes the polymer sufficiently rigid so that this thinning can be done.

Thinning may be done by mechanical and/or chemical polishing.

As a variant, it can be done by creating a buried fragile zone in the initial substrate before the assembly step a) by the implantation of ionic and/or atomic species delimiting the thin layer to be transferred in this initial substrate, and application of a heat and/or mechanical fracture treatment of the initial substrate along the buried fragile zone after the assembly step a).

Advantageously, the thin layer is transferred onto another substrate called the transfer substrate.

Therefore, the invention relates particularly to a method for transferring a thin layer from an initial substrate, for example made of a semiconducting material, onto a transfer substrate for example a final substrate, this method comprising the following steps:

a) creation of a buried fragile zone in the initial substrate by the implantation of ionic and/or atomic species, delimiting the thin layer to be transferred in this substrate, b) assembly of this initial substrate with a face of a silicone type polymer layer, this face having been subjected to a treatment under ultraviolet radiation, c) fracture of the initial substrate along the buried fragile zone, to leave the layer to be transferred on the silicone type polymer layer, d) transfer of the layer onto the transfer substrate.

The invention also relates to a method for making a transfer of a thin layer of a first substrate to a second substrate, also called the transfer substrate, comprising:

a first transfer of said layer onto a temporary substrate made of silicone material treated on the surface by a UV radiation, a second transfer of said layer, from the temporary substrate made of a silicone material onto the second substrate, a temporary substrate peeling step.

The first transfer may take place by assembly by direct bonding of the first substrate with the face of the temporary substrate treated under UV. A thinning can then take place by mechanical and/or chemical polishing. As a variant, it may be done by creating a buried fragile zone in the first substrate by the implantation of ionic and/or atomic species, delimiting the thin layer to be transferred in this substrate, and the application of a heat and/or mechanical fracture treatment of the first substrate along the buried fragile zone.

According to the invention, regardless of the embodiment, the polymer used as a temporary or support substrate has been treated under ultraviolet radiation, which has the advantages already described above (particularly the formation of a thick oxide, which then results in a strong rigid assembly).

A temporary bonding is then made on this support or temporary substrate that can subsequently be easily separated.

Regardless of the planned embodiment, the transfer substrate or the second substrate may be made from a rigid material or from an elastic material, for example a silicone material not treated under UV.

After transferring onto the transfer substrate, or onto the second substrate, a step to peel all or some of the silicone type polymer may be done.

The peeling step of the polymer layer can induce a separation at the interface between the silicone and the silicone transformed into oxide, or in the silicone layer. In the latter case, a step could be included to chemically eliminate the residual polymer.

An additional step can be made to eliminate the part of the polymer transformed into oxide.

Advantageously, the treatment of the polymer layer or the silicone layer under ultraviolet radiation is done under an ozone atmosphere.

For example, the silicone may be polymerised PDMS. Heat treatments may be used, particularly at low temperature or at temperatures below the silicone decomposition temperature. In particular, a fracture step may be applied by a thermal effect, along a plane of weakness or in a weakened zone, at a temperature lower than the silicone decomposition temperature.

A mechanical treatment can also be used, for example by insertion of a blade or by bending or imposing a curvature for stressing, to participate firstly in the separation of the thin film bonded to the silicone, and secondly the remaining initial substrate.

Before the assembly step, a preliminary weakening annealing can be performed to limit the thermal and/or mechanical budget necessary to obtain the fracture after the assembly.

Prior to the assembly step, and possibly before the implantation step, a step may be included to deposit an oxide layer or a nitride layer on the initial substrate.

The material from which the layer to be transferred is made may be semiconducting, for example Si or Germanium or SiC or GaN.

DETAILED DESCRIPTION

We will now describe the invention in the case of a substrate or layer made of polydimethylsiloxane (PDMS). But it can be done with any silicone type polymer, these polymers presenting a chain based on Si—O—Si—O that can be transformed into oxide under the effect of UV radiation.

Figure 3:
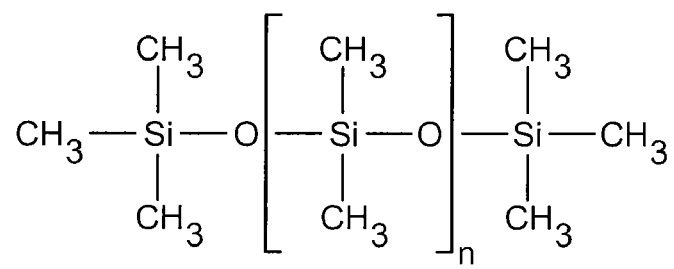
FIG. 3 shows the chemical structure of the PDMS, a silicone type polymer that can be used in the framework of the invention.

FIG. 3 shows the chemical formula of PDMS. PDMS polymerises by polyaddition, in other words by a chain reaction with combination of monomer, the reaction taking place by means of a cross-linking agent. The reaction between the polymer and the cross-linking agent occurs under the action of a catalyst (contained in the cross-linking agent) and heat or the drying time, in accordance with the following scheme:

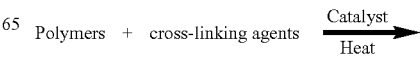

-continued

Cross-linked elastomer

This polymerisation method does not generate any derivatives (water, releases of gases, etc.), which makes the polymer compatible with the microelectronics. The catalyst is disinhibited under the action of heat. Thus, the PDMS can be polymerised at different temperatures from ambient temperature up to 150° C. The polymerisation time is longer when the temperature is lower. For example, the polymerisation time at 150° C. is 15 minutes, whereas at ambient temperature it is 7 days. PDMS can be deposited on the surface of the material in a layer several millimeters thick and is therefore easily manipulated.

The presence of covalent bonds between silicon and oxygen results in silicones having a higher decomposition temperature than other polymers. Thus, PDMS remains stable at between −50° C. and 250° C.

PDMS is naturally hydrophobic after polymerisation (a contact angle θ greater than 90° can be measured) due to its $CH_3$ terminations In order to make hydrophilic bonding, which is required in the case of the required transfer layer, an attempt will be made to bond the two surfaces with (OH) terminations.

PDMS has the special feature that it becomes hydrophilic on the surface under the influence of the different treatments, such as a plasma treatment or a UV/Ozone treatment.

Figure 2A:
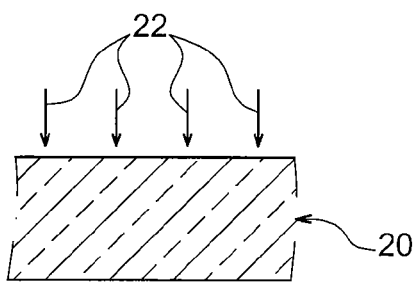
FIGS. 2A to 2F show an example of a method according to the invention.

FIG. 2A shows a substrate 20 made from this PDMS polymer material. A UV treatment 22 is applied to this substrate (for example under an ozone atmosphere), which in particular changes the hydrophobic properties of PDMS into hydrophilic properties. Silicone reacts to form free radicals under the effect of UV radiation and form $SiO_x$ bonds as illustrated below:

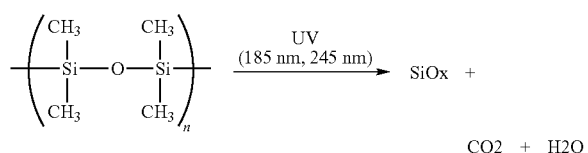

Figure 2B:
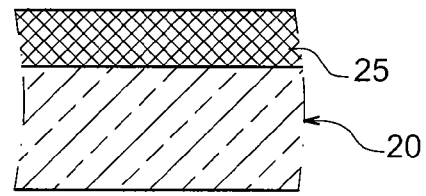

Therefore, an oxide film 25 is formed on the surface of the substrate 20 (FIG. 2B). The thickness of this SiOX film 25 can reach 10 μm or even 20 μm depending on the exposure time. This layer or this film 25 is rigid, while the material subjacent to this layer keeps the flexible properties of the initial polymer.

It will be noted that this layer or this film 25 is the result of a transformation of the polymer, and not the production of a deposit on the polymer. This thus avoids all problems related to the difference between coefficients of thermal expansion of the polymer and an oxide layer, when the oxide layer is simply deposited on the polymer.

As indicated above, other treatments of the polymer can be applied to obtain a hydrophilic layer 25. This is the case of a treatment by an oxygen plasma. Such a plasma treatment can cause the appearance of Si—OH groups that are substituted for Si—CH3 groups on the surface of the PDMS. This modification of the PDMS structure takes place over a thickness that can be as much as 130 to 160 nm and which makes it particularly hydrophilic (angle of contact less than 3°). Furthermore, for a treatment applied with oxygen plasma, the reaction is faster than under UV (20 s to reach an angle of 3° under a plasma compared with 60 min in the case of a treatment under UV). But this plasma treatment is not permanent and the hydrophilic nature of the surface changes after 45 min. Therefore, treatment under UV has the advantage that it makes the surface hydrophilic more permanently than treatment under oxygen plasma. Finally, an AFM analysis of the polymer surface after plasma treatment shows the presence of ripples, such that this surface is rough and prevents hydrophilic bonding.

Unlike plasma treatment, exposure to UV enables a more durable transformation than a plasma treatment, does not create these ripples on the surface, and therefore does not create any roughness.

A measurement made on the surface of a PDMS substrate 25 shows that its roughness is:
1) 17.8 nm after plasma treatment,
2) while it is 0.57 nm after treatment under UV, therefore equivalent to the roughness after polymerisation.

Bonding can then be done on the polymer substrate 25 to which the UV treatment mentioned above had been applied.

As mentioned above, the superficial portion 25 of the substrate 20 is rigid. Therefore, a stiffener (the oxide layer) is obtained on the surface of the polymer after the treatment has been applied, which is favourable for a subsequent thinning method, for example to produce a Smart Cut™ type method.

Nevertheless, it is important to emphasize that the PDMS substrate 20 maintains some elasticity due to its non-oxidized part.

Furthermore, a substrate 1 can be implanted or have been implanted as explained above with reference to FIG. 1A. For example, it may be a semiconducting substrate of Silicon or Germanium or GaN, or SiC or even LTO (LiTaO3). Such a substrate may for example be implanted with a hydrogen beam at doses of between $5 \times 10^{16}$ at/cm³ and a few $10^{17}$ at/cm³ for example $5 \times 10^{17}$ at/cm³ or $10^{18}$ at/cm³, and with an energy of the order of 50 keV to 200 keV, for example between 70 keV to 180 keV.

Advantageously, a thin layer 8 of oxide (or nitride, for example SiON), that is a few nm thick for example 5 nm to about 1 μm, will have been deposited before implantation. This oxide will make polishing possible if the roughness of the semiconducting surface 1 is high, or prepare the surface for bonding with preparations such as the plasma treatment or mechanical-chemical polishing or a wet treatment, these treatments having the purpose of leaving the surface hydrophilic.

A weakening heat treatment is possible at this stage, the thermal budget of this step not introducing any blister on the surface of the substrate, which would prevent any subsequent bonding.

Figure 1A:
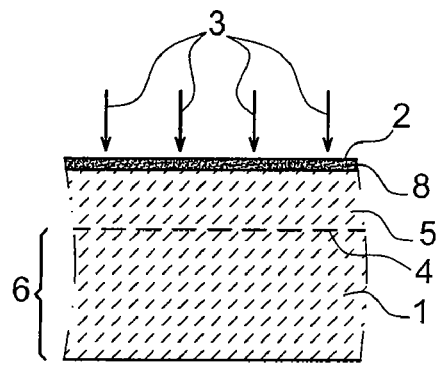
FIGS. 1A to 1C show a layer transfer method.
Figure 1B:
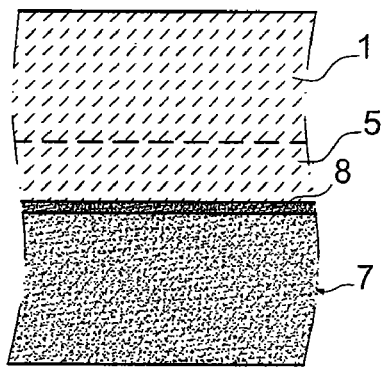
Figure 1C:
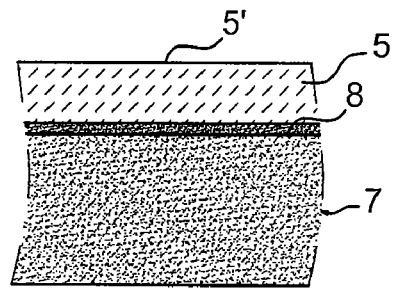
Figure 2C:
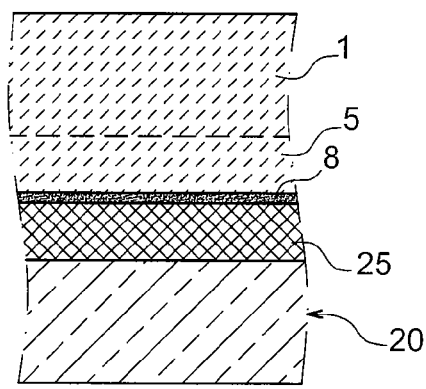

The surface of the PDMS substrate 20, treated as explained above, and the surface 2 of an implanted semiconducting substrate 1 of the type shown in FIG. 1A (possibly provided with a layer 8 as explained above) can then be brought into contact (FIG. 2C). Bonding is of the direct bonding or molecular bonding type, a bonding technique that is described particularly by Q. Y. Tong in "Silicon Wafer Bonding Technology for VLSI and MEMS applications", edited by S. S. Iyer and A. J. Auberton—Hervé, 2002, INSPEC, London, Chapter 1, pages 1-20.

A solidarisation annealing of the bonding can then be applied, for example at between 100° C. and 200° C. The duration of this annealing is between a few minutes and a few hours. This annealing is done with a thermal budget, and therefore at a temperature and for a duration such that it does not cause any blistering or cleavage conditions in the semiconductor 1.

Figure 2D:
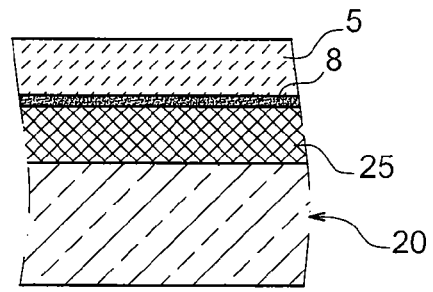

The next step can be annealing of the fracture, for example between 200° C. and 250° C., assisted or not assisted by mechanical treatment (insertion of the blade, and/or bending or imposing a curvature of semiconductor 1 for stressing, etc.). The PDMS remains stable within this temperature range. The result is then a thin semiconducting layer 5 on the surface of the PDMS substrate 20 (FIG. 2D).

As a variant, the thin layer 5 may be obtained by a mechanical-chemical thinning step of the non-implanted substrate 1 after assembly with the surface hardened polymer layer, instead of by implantation/fracture as described above.

Figure 2E:
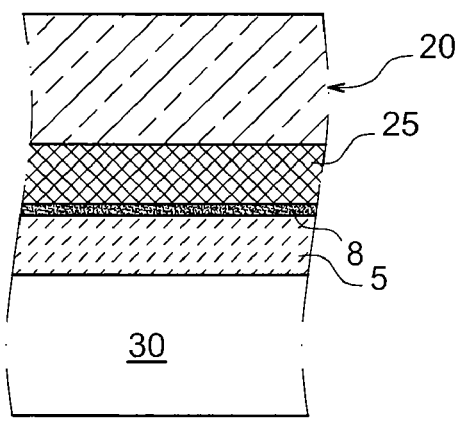

Regardless of the method used, the layer 5 can then be transferred and bonded onto a support 30 (FIG. 2E), by a hydrophilic or hydrophobic type of molecular bonding. This support 30 may be a final support.

Figure 2F:
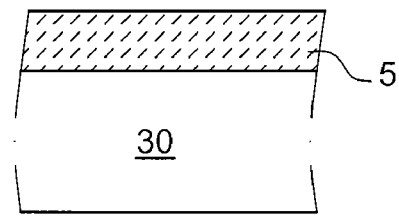

The next step can then be peeling of the polymer substrate 20 (FIG. 2F). The high elasticity of the PDMS substrate 20 (that it retained in its part not transformed into oxide) will enable this retraction operation by peeling. This peeling is easier if the substrate 20 is thick. For example, a thickness of a few mm, for example between 1 mm and 3mm or 3 mm, enables manual retraction.

During this retraction by peeling operation, the rupture can take place at the interface between the non-transformed polymer and the polymer transformed into oxide, in which case it is an adhesive rupture.

Or the rupture may take place within the polymer 20, in its non-transformed part, and it is then a cohesive rupture. In this case, the remainder of the layer 20 of non-transformed polymer can then be removed chemically, for example by means of a Tetra-n-butylammonium fluoride solution, 1M solution in Tetrahydrofuran (TBAF). This solution dissolves the PDMS. The etching rate of this solution is estimated at 3 μm/min.

The polymer layer 25 transformed into an oxide can also be eliminated in turn, for example by an HF treatment or selective etching.

The substrate 30 may itself have some stiffness. In this case, this substrate may be a final substrate.

As a variant, this substrate 30 can also have some flexibility, for example to enable stress relaxation in the transferred layer or film 5; in this case, it is not a final substrate. In particular, it may be a silicone substrate, for example also made of PDMS but not treated under UV.

In one example embodiment, the PDMS used is Sylgard 184 made by Dow Corning. It is composed of a monomer and a thermal primer.

The primer is mixed in the proportion 1:10. The mix generates air bubbles that are removed by placing the mix under a vacuum ($10^{-1}$ bars). The polymer can then be conditioned for 2 h before the beginning of polymerisation. The mix is then poured into moulds and polymerised at ambient temperature to prevent stresses that could develop during cooling after polymerisation at high temperature, due to its high coefficient of thermal expansion.

The result obtained is then a PDMS support 20 with a thickness between a few μm and a few mm, for example between firstly 1 μm or 5 μm or 10 μm, and secondly 1 mm or 5 mm or 10 mm. This support can be left bonded on the plate that was used as a mould or it can be separated from this plate.

The PDMS support is then treated under UV (advantageously under an ambient atmosphere, the UV radiation then transforming oxygen in the air into ozone: this treatment is referred to as UV/Ozone). The next step is to transform the surface of the PDMS substrate 20 into an oxide over a thickness of between 1 μm and 15 μm, for a treatment duration of between 20 or 30 minutes and 120 minutes. The result is then a PDMS support with a surface stiffened by a transformation, which results in a high oxide thickness.

The semiconducting substrate 1 for which a thin layer 5 is to be transferred (FIG. 1A) is implanted with gaseous species 3 such as hydrogen and/or helium that enable production of the "Smart Cut™" method.

Example implantations, energies and doses have already been given above.

Advantageously, implantation conditions are chosen that enable cleavage at a temperature below 250° C., the PDMS decomposition temperature, for example as can be done by co-implantations of hydrogen and helium ions at the doses mentioned above.

Preferably, a fairly deep implantation will be made in the material to add the stiffness of the layer to the stiffness of the oxide created to facilitate the cleavage.

Advantageously, the material 1 can be implanted as described above and pre-weakened by applying preliminary annealing to it, to obtain cleavage at a temperature of below 250° C. This annealing leads to the creation of a fragile zone, but cleavage is not initiated.

Bonding can then be done between the PDMS treated surface 20 and the semiconducting surface 1 or the layer 8 deposited on this surface, and then the substrate 1 can then be thinned, in this case by fracture by means of a heat treatment (that may or may not be assisted by a mechanical treatment). The thin layer obtained can then be transferred onto a final substrate, the PDMS layer being eliminated by peeling.

The invention claimed is:

1. A preparation method for the transfer of a thin layer from an initial substrate, the method comprising the following steps:
    a) treating one face of a silicone type polymer layer by ultraviolet radiation, to transform the surface of the polymer into an oxide layer,
    b) directly bonding the initial substrate with the surface of the polymer layer, and
    c) processing the initial substrate to form the thin layer on the silicone type polymer layer.

2. The method according to claim 1, wherein processing the initial substrate comprises mechanical or chemical polishing, or both.

3. The method according to claim 1, further comprising creating a buried fragile zone in the initial substrate before step a), by implanting ionic or atomic species, or both, thereby delimiting the thin layer in the initial substrate, and wherein processing the initial substrate comprises applying a heat or mechanical fracture treatment, or both, to the initial substrate along the buried fragile zone.

4. The method according to claim 3, wherein applying the fracture treatment comprises applying a thermal treatment at a temperature below the silicone decomposition temperature.

5. The method according to claim 3 further comprising applying a weakening preliminary annealing before step b).

6. A method for transferring a thin layer comprising a preparation method according to claim 1, and further comprising a transferring the thin layer onto a transfer substrate.

7. The method according to claim 6, wherein the transfer substrate comprises a silicone material.

8. The method according to claim 6, further comprising a step of peeling the silicone type polymer layer after transferring the thin layer onto the transfer substrate.

9. The method according to claim 8, wherein the peeling induces a separation at interface between the silicone type polymer layer and the oxide layer.

10. The method according to claim 9, wherein the peeling induces a separation in the silicone type polymer layer.

11. The method according to claim 10, further comprising a step of chemically eliminating residual silicone.

12. The method according to claim 9, further comprising eliminating remaining portions of the oxide layer.

13. The method according to claim 1, wherein the silicone type polymer layer comprises polydimethylsiloxane (PDMS).

14. The method according to claim 1, wherein treating by ultraviolet radiation comprises treating under an ozone atmosphere.

15. The method according to claim 1 further comprising applying a mechanical treatment to participate firstly in the separation of the thin layer bonded to the silicone type polymer layer, and secondly the remaining initial substrate.

16. The method according to claim 15, wherein applying the mechanical treatment comprises inserting a blade or a curve for stressing.

17. The method according to claim 1 further comprising a step of depositing an oxide layer or a nitride layer on the initial substrate before step a).

18. The method according to claim 1, wherein the thin layer comprises a semiconducting material.

19. The method according to the claim 18, wherein the thin layer comprises Si, Germanium, SiC, or GaN.

* * * * *

UNITED STATES PATENT AND TRADEMARK OFFICE
CERTIFICATE OF CORRECTION

PATENT NO. : 7,960,248 B2  Page 1 of 1
APPLICATION NO. : 12/336229
DATED : June 14, 2011
INVENTOR(S) : Léa Di Cioccio It is certified that error appears in the above-identified patent and that said Letters Patent is hereby corrected as shown below:

In the Claims

Column 8, claim 9, line 64, after "a separation at" insert --an--.

Signed and Sealed this
Eighteenth Day of October, 2011

David J. Kappos
*Director of the United States Patent and Trademark Office*